(12) United States Patent
Shin

(10) Patent No.: US 11,894,301 B2
(45) Date of Patent: *Feb. 6, 2024

(54) VERTICAL MEMORY DEVICES

(71) Applicant: SAMSUNG ELECTRONICS CO., LTD., Suwon-si (KR)

(72) Inventor: Seungjun Shin, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/895,205

(22) Filed: Aug. 25, 2022

(65) Prior Publication Data

US 2022/0406714 A1  Dec. 22, 2022

Related U.S. Application Data

(63) Continuation of application No. 17/027,989, filed on Sep. 22, 2020, now Pat. No. 11,430,732.

(30) Foreign Application Priority Data

Feb. 28, 2020 (KR) .......................... 10-2020-0024856

(51) Int. Cl.
| | |
|---|---|
| *H01L 23/528* | (2006.01) |
| *H01L 21/768* | (2006.01) |
| *H01L 23/535* | (2006.01) |
| *H01L 23/522* | (2006.01) |
| *H10B 41/10* | (2023.01) |
| *H10B 41/27* | (2023.01) |

(Continued)

(52) U.S. Cl.
CPC .... *H01L 23/5283* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/535* (2013.01); *H10B 41/10* (2023.02); *H10B 41/27* (2023.02); *H10B 43/10* (2023.02); *H10B 43/27* (2023.02)

(58) Field of Classification Search
None
See application file for complete search history.

(56) References Cited

U.S. PATENT DOCUMENTS

| | | |
|---|---|---|
| 8,822,285 B2 | 9/2014 | Hwang et al. |
| 8,906,805 B2 | 12/2014 | Park et al. |

(Continued)

*Primary Examiner* — Hsien Ming Lee
(74) *Attorney, Agent, or Firm* — Fish & Richardson P.C.

(57) ABSTRACT

A vertical memory device includes a cell stacked structure, a wiring connection structure, and a first insulating interlayer. The cell stacked structure may include insulation layers and gate patterns repeatedly and alternately stacked on a first region of a substrate. The wiring connection structure may contact side walls of the cell stacked structure. The wiring connection structure may include a first staircase structure having one side of a stepped shape, a second staircase structure having one side of a stepped shape and disposed below the first staircase structure, and a first dummy staircase structure between the first and second staircase structures. The first and second staircase structures may be spaced apart from each other in the first direction, and both sides in the first direction of the first dummy staircase structure may have stepped shapes. The first insulating interlayer may be on the substrate to cover the wiring connection structure.

18 Claims, 40 Drawing Sheets

(51) Int. Cl.
*H10B 43/10* (2023.01)
*H10B 43/27* (2023.01)

(56) References Cited

U.S. PATENT DOCUMENTS

| | | |
|---|---|---|
| 9,419,008 B2 | 8/2016 | Oh et al. |
| 9,773,804 B2 | 9/2017 | Lee |
| 9,853,051 B1 | 12/2017 | Lee |
| 11,430,732 B2 * | 8/2022 | Shin ................ H10B 43/10 |
| 2019/0043872 A1 | 2/2019 | Oh et al. |
| 2019/0081061 A1 * | 3/2019 | Tessariol ............ H01L 23/5226 |
| 2019/0371828 A1 * | 12/2019 | Ebihara ............... H01L 27/1255 |
| 2020/0273875 A1 | 8/2020 | Zhang et al. |
| 2021/0098472 A1 * | 4/2021 | Kim .................... H10B 41/35 |

* cited by examiner

SECOND DIRECTION
FIRST DIRECTION

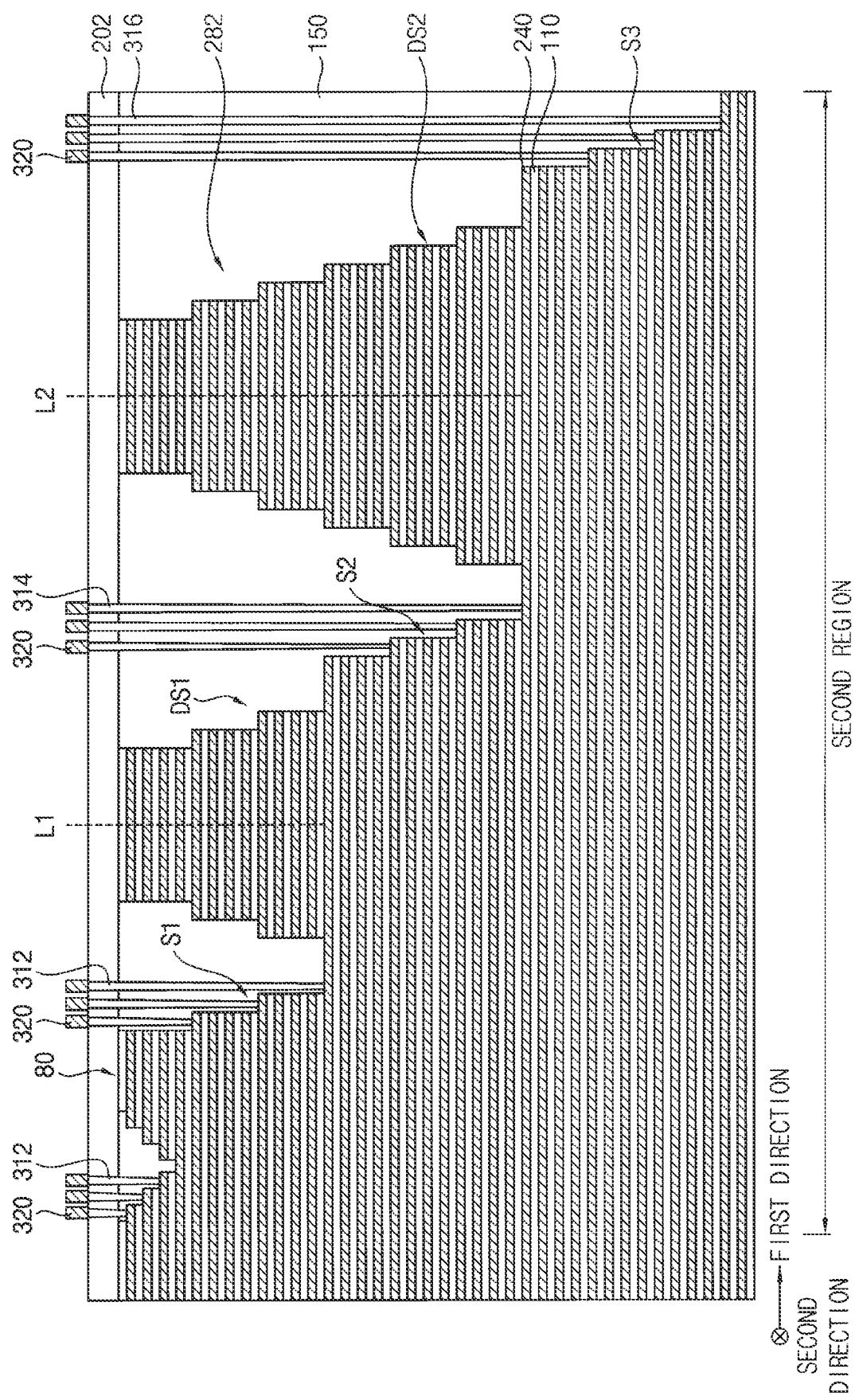

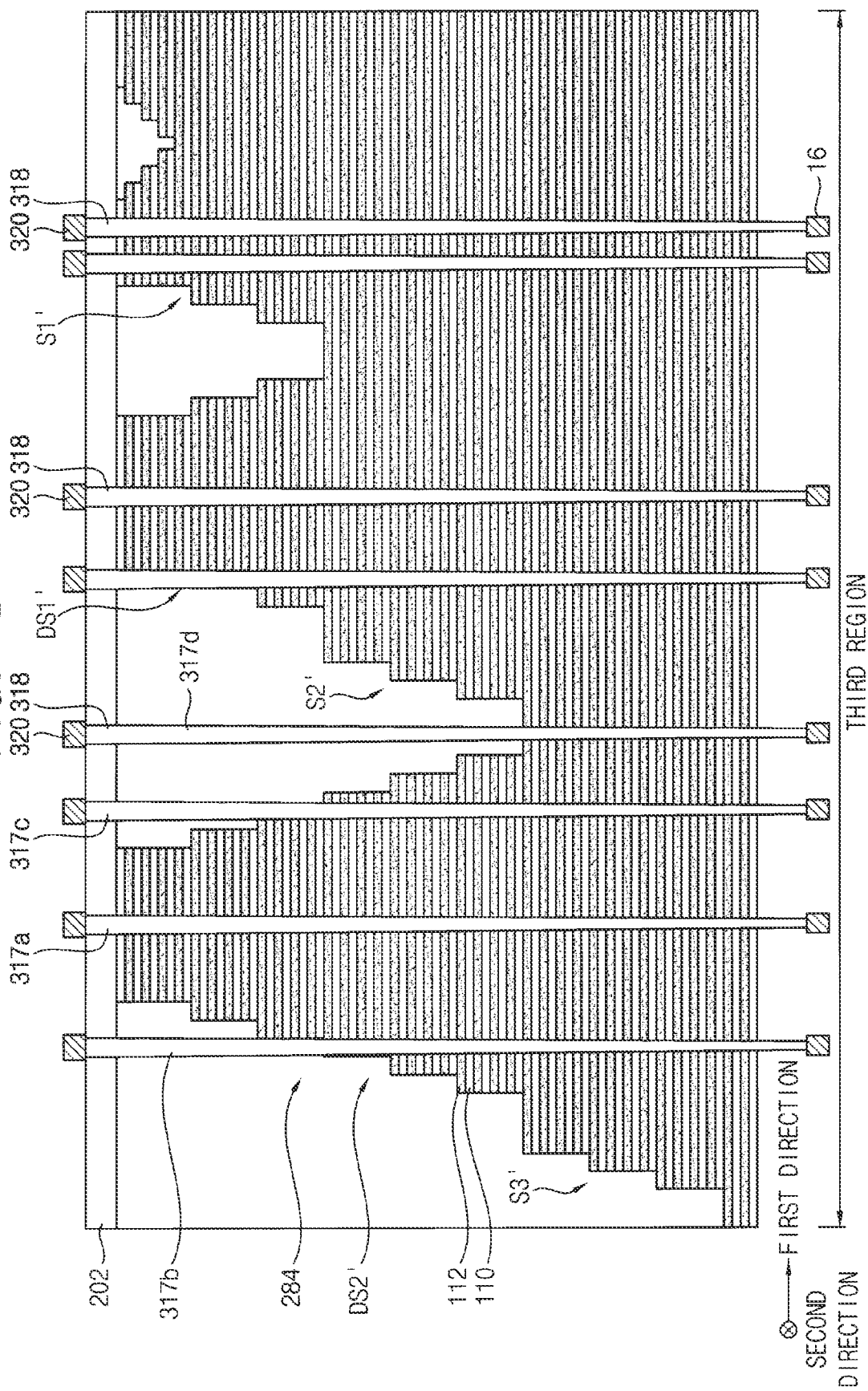

US 11,894,301 B2

VERTICAL MEMORY DEVICES

CROSS-REFERENCE TO RELATED APPLICATION

This is a Continuation of U.S. application Ser. No. 17/027,989, filed Sep. 22, 2020, and a claim of priority under 35 USC § 119 is made to Korean Patent Application No. 10-2020-0024856, filed on Feb. 28, 2020, in the Korean Intellectual Property Office (KIPO), the contents of which are incorporated by reference herein in their entirety.

BACKGROUND

1. Field

Example embodiments relate to vertical memory devices. More particularly, example embodiments relate to vertical nand (VNAND) flash memory devices.

2. Description of the Related Art

A VNAND flash memory device may include a cell stacked structure included in gate patterns of memory cells and a pad structure contacting sidewalls of the cell stacked structure and having a stepped shape. As a stacking height of the memory cells increases, a height of the cell stacked structure may increase and a step difference between the cell stacked structure and the pad structure may increase. Therefore, when an insulating interlayer covering the pad structure and the cell stacked structure is planarized, a dishing defect of an upper surface of the insulating interlayer may occur. Therefore, it is not easy to form the insulating interlayer having a flat upper surface and no dishing defect.

SUMMARY

Example embodiments provide a vertical memory device with reduced process defects.

According to example embodiments, there is provided a vertical memory device that may include a substrate, a cell stacked structure, a wiring connection structure, and a first insulating interlayer. The substrate may include a first region, a second region, and a third region. The second and third regions may be on both sides of the first region. The cell stacked structure may be on the first region. The cell stacked structure may include insulation layers and gate patterns repeatedly and alternately stacked. The gate patterns may extend in a first direction. The wiring connection structure on the second and third regions may contact side walls of the cell stacked structure. The wiring connection structure may include a first staircase structure having one side of a stepped shape, a second staircase structure having one side of a stepped shape and disposed below the first staircase structure, and a first dummy staircase structure between the first and second staircase structures. The first and second staircase structures may be spaced apart from each other in the first direction, and both sides in the first direction of the first dummy staircase structure may have stepped shapes. The first insulating interlayer may be on the substrate to cover the wiring connection structure. The first staircase structure and the second staircase structure included in the wiring connection structure on the second region and the third region may include pad patterns having a stepped shape electrically connected to gate patterns in the cell stacked structure.

According to example embodiments, there is provided a vertical memory device that may include a substrate, a cell stacked structure, a channel structure, a wiring connection structure, and a first insulating interlayer. The substrate may include a first region, a second region, and a third region. The second and third regions may be on both sides of the first region. The cell stacked structure may be on the first region. The cell stacked structure may include insulation layers and gate patterns repeatedly and alternately stacked. The gate patterns may extend in a first direction. The channel structure may pass through the cell stacked structure. The wiring connection structure on the second and third regions may contact side walls of the cell stacked structure. The wiring connection structure may include a first staircase structure having one side of a stepped shape, a second staircase structure having one side of a stepped shape and disposed below the first staircase structure, and a first dummy staircase structure between the first and second staircase structures. The first and second staircase structures may be spaced apart from each other in the first direction, and the first dummy staircase structure may have both sides in the first direction having stepped shapes. The wiring connection structure on the second and third regions may be electrically insulated from gate patterns of the cell stacked structure. The first insulating interlayer may be on the substrate to cover the wiring connection structure. Steps of both sides of the first dummy staircase structure may be symmetrical to each other with respect to a straight line passing a center portion in the first direction of the first dummy staircase structure. The first staircase structure and the second staircase structure included in the wiring connection structure on the second region and the third region may include pad patterns having stepped shapes electrically connected to gate patterns in the cell stacked structure. The wiring connection structure on the second and third regions may be electrically insulated from gate patterns of the cell stacked structure.

According to example embodiments, there is provided a vertical memory device that may include a substrate, a cell stacked structure, a wiring connection structure, and a through via contact. The substrate may include a first region, a second region, and a third region. The second and third regions may be on both sides of the first region. The cell stacked structure may be on the first region. The cell stacked structure may include insulation layers and gate patterns repeatedly and alternately stacked. The gate patterns may extend in a first direction. The wiring connection structure on the second and third regions may contact side walls of the cell stacked structure. The wiring connection structure may include a first staircase structure having one side of a stepped shape, a second staircase structure having one side of a stepped shape and disposed below the first staircase structure, and a first dummy staircase structure between the first and second staircase structures. The first and second staircase structures may be spaced apart from each other in the first direction, and the first dummy staircase structure may have both sides in the first direction having stepped shapes. A through via contact may pass through a portion of the wiring connection structure being electrically insulated from gate patterns of the cell stacked structure. The through via contact may contact a lower pad pattern.

In example embodiments, a dishing defect in which the upper surface of the first insulating interlayer covering an upper portion of the wiring connection structure is recessed may be decreased. Thus, defects of the vertical memory device due to the dishing defect may be decreased. Further, the steps of the wiring connection structure in the second region and the third region may be accurately formed.

BRIEF DESCRIPTION OF THE DRAWINGS

Example embodiments will be more clearly understood from the following detailed description taken in conjunction with the accompanying drawings. FIGS. 1A to 38 represent non-limiting, example embodiments as described herein.

FIGS. 1A, 1B, 2A, 2B, 3, and 4 are plan views, cross-sectional views, and perspective views illustrating vertical memory devices in accordance with example embodiments;

FIGS. 5 to 29 are plan views, cross-sectional views, and a perspective view illustrating a method of manufacturing a semiconductor device in accordance with example embodiments;

FIGS. 30 to 32 are a plan view and cross-sectional views illustrating a vertical memory device in accordance with example embodiments; and FIGS. 33 to 38 are cross-sectional views and plan views illustrating a method of manufacturing a vertical memory device in accordance with example embodiments.

DESCRIPTION OF EMBODIMENTS

Hereinafter, a direction substantially perpendicular to the upper surface of the substrate is defined as a vertical direction. Two directions substantially parallel to the upper surface of the substrate and crossing to each other are defined as first and second directions, respectively. In example embodiments, the first and second directions may be substantially perpendicular to each other.

FIGS. 1A, 1B, 2A, 2B, 3, and 4 are plan views, cross-sectional views, and perspective views illustrating vertical memory devices in accordance with example embodiments. FIG. 5 is a cross-sectional view illustrating a portion of a substrate in the vertical memory devices.

Figure 1A:
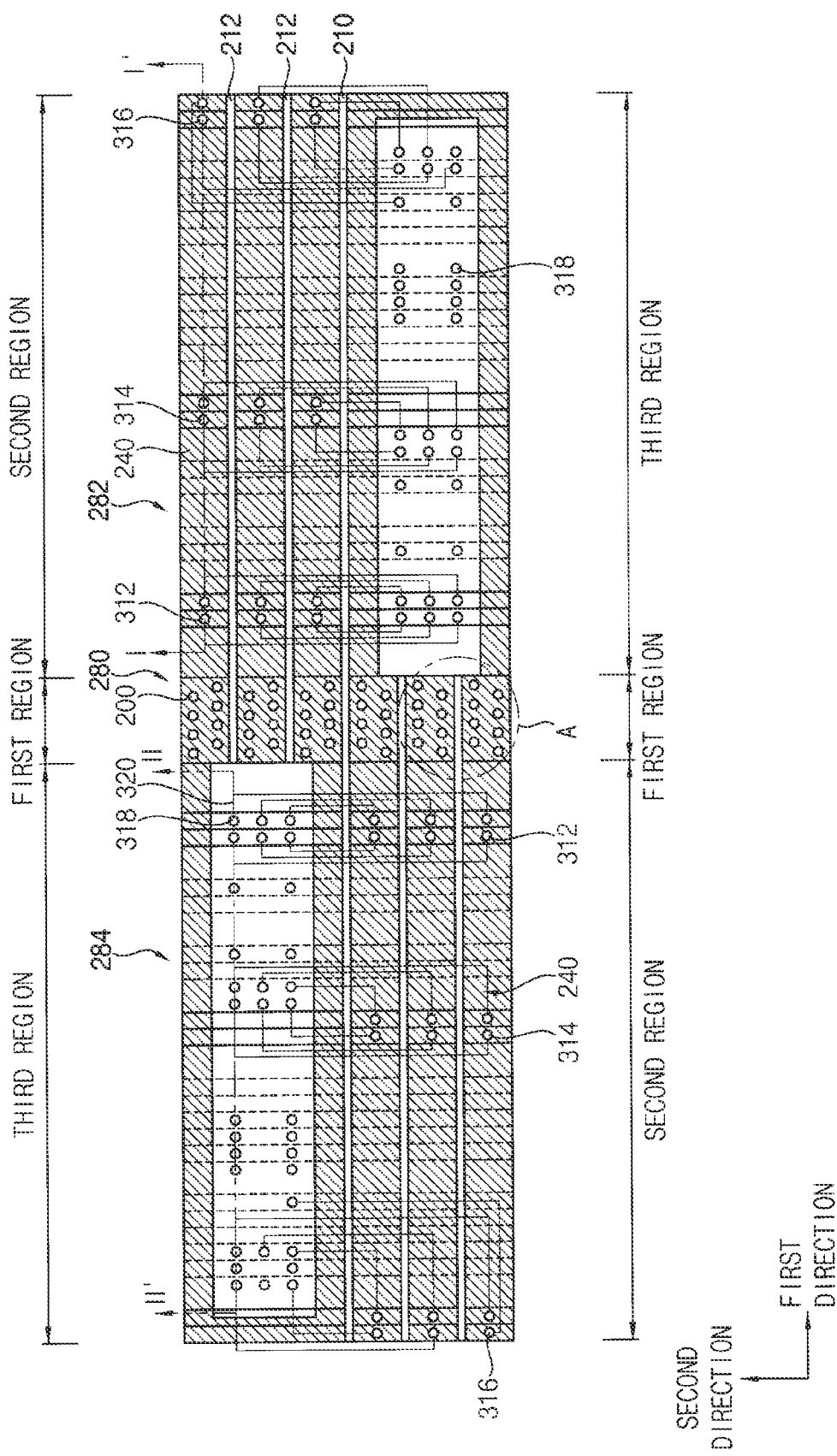
Figure 1B:
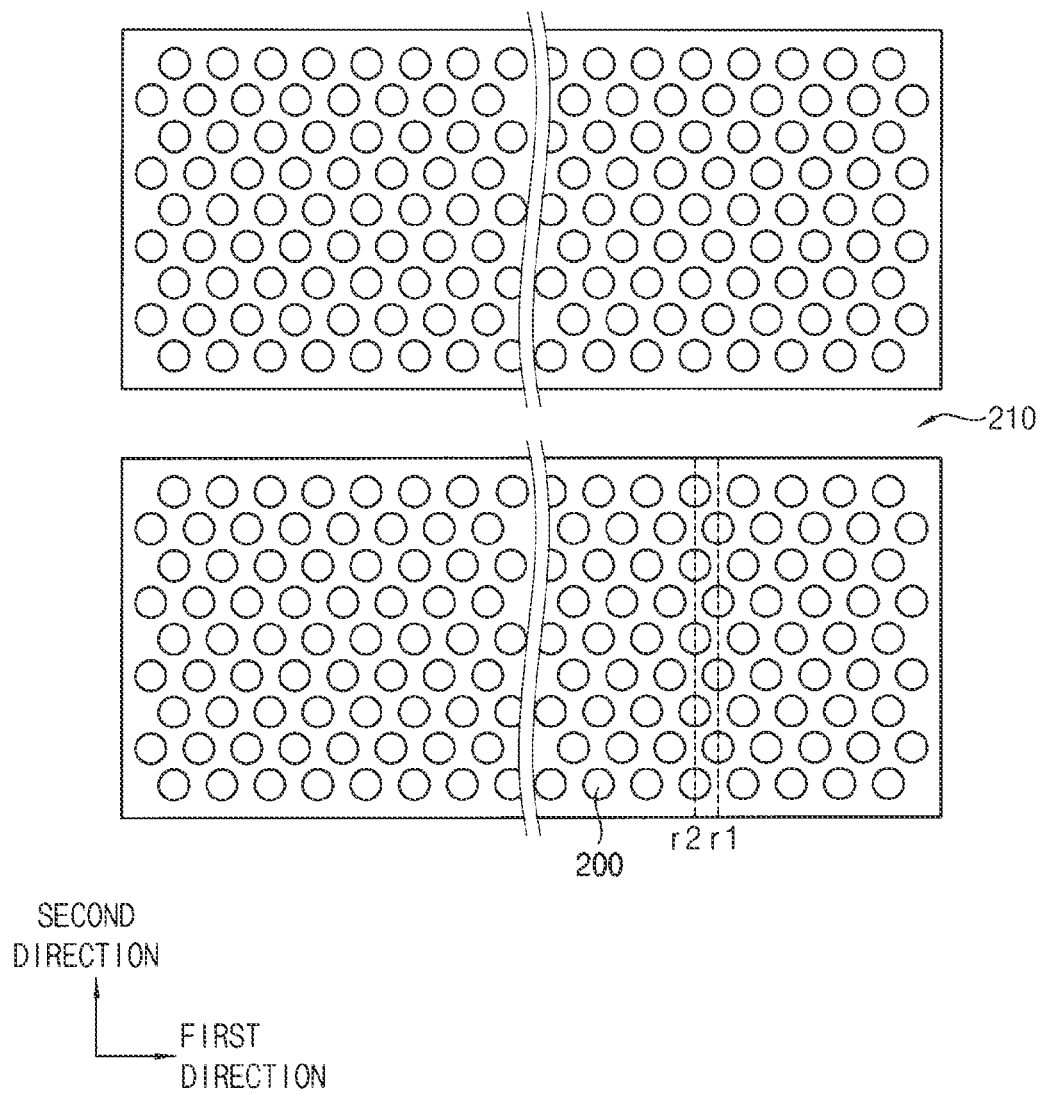
Figure 3:
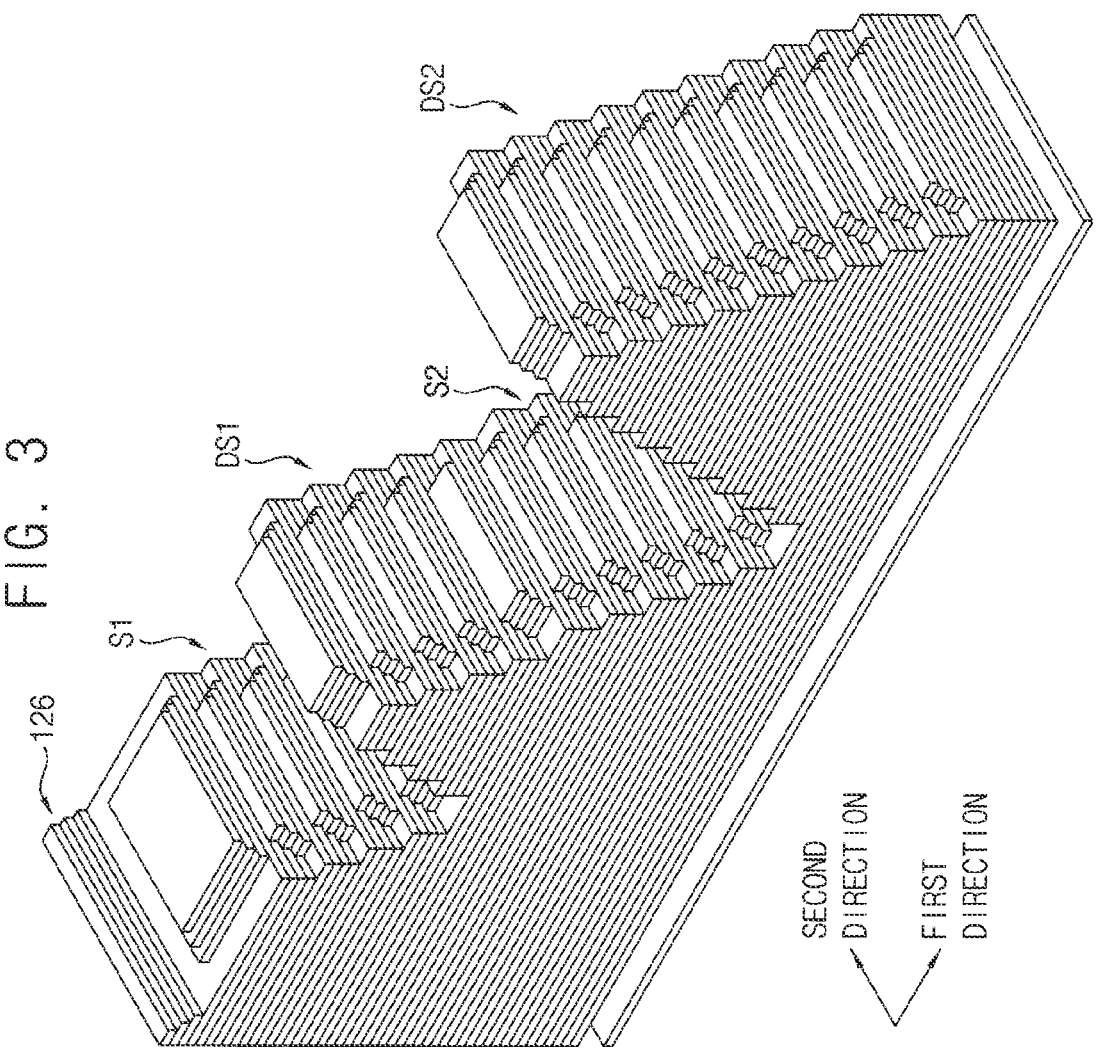
Figure 4:
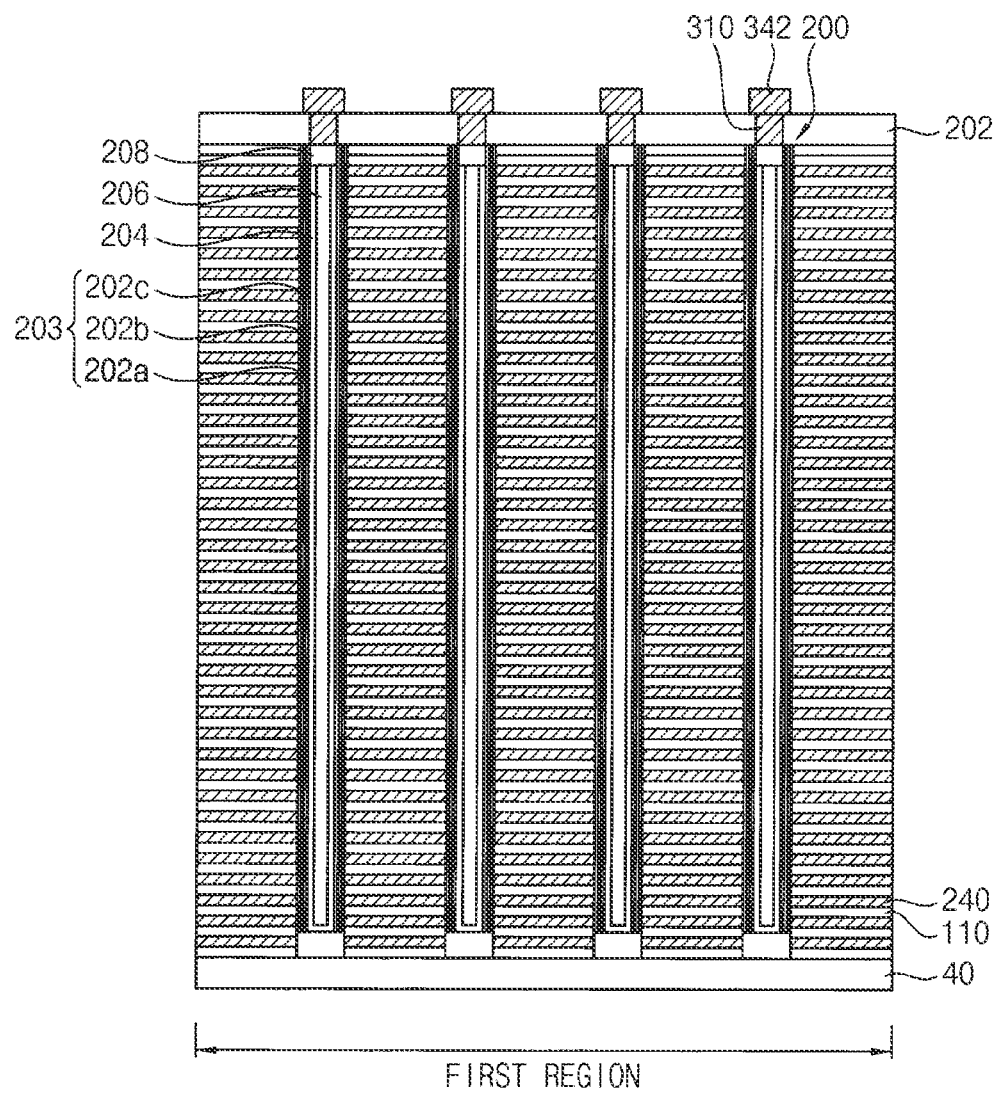
Figure 5:
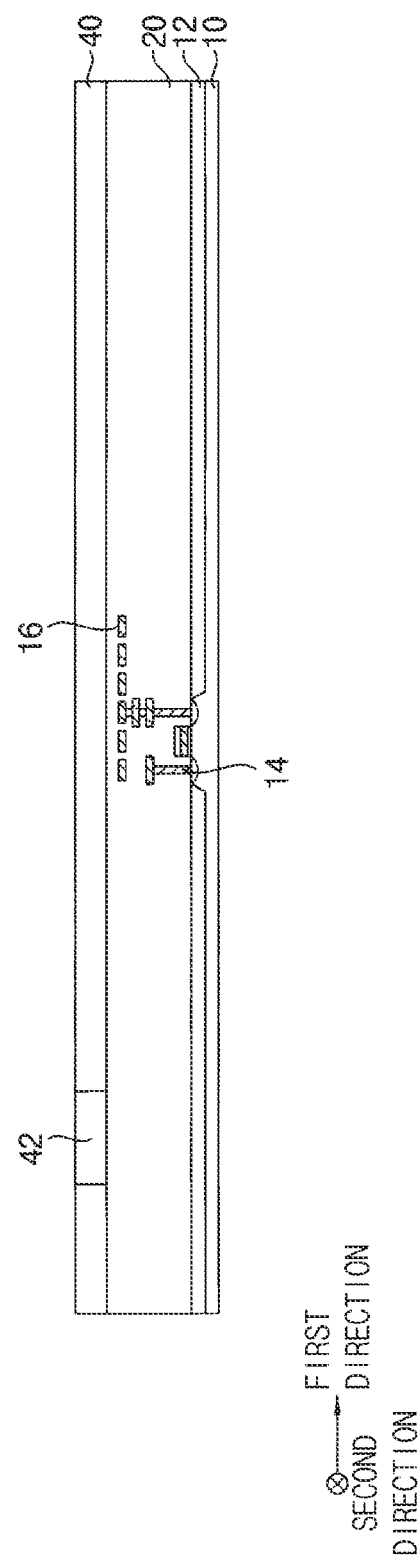

Particularly, FIGS. 1A and 1B are plan views, FIGS. 2A, 2B and 4 are cross-sectional views, and FIG. 3 is a perspective view.

FIG. 1B is an enlarged view of a portion A in FIG. 1A. FIG. 2A is the cross-sectional view of a wiring connection structure on a second region cut in the first direction. FIG. 2B is the cross-sectional view of a wiring connection structure on a third region cut in the first direction. That is, FIG. 2A is the cross-sectional view of I-I' in FIG. 1 and FIG. 2B is the cross-sectional view of II-II' in FIG. 1. FIG. 3 is the perspective view of a portion of a wiring connection structure. FIG. 4 is the cross-sectional view of the cell stacked structure cut in the first direction.

Referring to FIGS. 1A to 5, a substrate 10 may include a first region, a second region and a third region. The second and the third region may be on both sides in the first direction of the first region, respectively.

The substrate 10 may include a semiconductor material such as silicon, germanium, or silicon-germanium, or a group III-V compound such as GaP, GaAs, GaSb, and the like. In some example embodiments, the substrate 10 may be a silicon-on-insulator (SOI) substrate or a germanium-on-insulator (GOI) substrate.

In example embodiments, the first region of the substrate 10 may be a cell array region on which memory cells are formed, and the second and third regions of the substrate may be a pad region on which wirings electrically connected to the memory cells are formed. For example, the second region may be a region for forming contact plugs electrically connected to gate patterns of memory cells. The third region may be a region for forming a through via contact connected to circuit patterns formed on the substrate 10. In order to simplify the drawing, a width in the first direction of the first region is shown to be small, but in reality, the width in the first direction of the first region may be larger than a width in the first direction of the second region.

In example embodiments, the vertical memory device may have a Cell Over Peri (COP) structure. That is, a peripheral circuit for driving memory cells may be formed under the memory cell. The peripheral circuit may be referred to as a circuit pattern.

A lower structure including the peripheral circuit may be formed on the substrate 10. The lower structure is described with reference to FIG. 5.

Referring to FIG. 5, the substrate 10 may include a field region and an active region. An isolation pattern 12 is formed in the field region. The isolation pattern 12 may include, e.g., oxide.

The circuit pattern may include a transistor, a lower contact plug, lower wiring, lower vias, or the like.

A lower insulating interlayer 20 may be formed on the substrate 10 to cover the circuit patterns. The lower contact plug 14 may pass through the lower insulating interlayer 20 and may be electrically connected to the circuit patterns. A lower pad pattern 16 electrically connected to the lower contact plug 14 may be formed in the lower insulating interlayer 20. The lower pad pattern 16 may be electrically connected to the circuit pattern. An upper surface of the lower pad pattern 16 may contact the through via contact.

Base patterns 40 and a lower insulation pattern may be formed on the lower insulating interlayer 20. The lower insulation pattern 42 may be between the base patterns 40. In example embodiments, the lower insulation pattern 42 may be disposed to face the through via contact.

The base pattern 40 may include, e.g., a semiconductor material such as silicon. The lower insulation pattern 42 may include, e.g., an oxide such as silicon oxide.

A stacked structure may be formed on the base patterns 40 and the lower insulation pattern 42.

In order to simplify the drawing, in the each of cross-sectional views and perspective views, the base patterns 40, the lower insulation pattern 42, and structures positioned under the base patterns 40 and the lower insulation pattern 42 are omitted. Only the structures positioned above the base patterns 40 and the lower insulation pattern 42 are shown. However, in FIG. 2B, only the lower pad pattern is simply shown. In FIG. 3, only a first staircase structure, a first dummy staircase structure, and a second staircase structure are shown.

Referring to FIGS. 2A, 2B, 3 and 4, the stacked structure may include a cell stacked structure and wiring connection structures. The wiring connection structures may contact both sides of the cell stacked structure, respectively, in the first direction. Therefore, the cell stacked structure and the wiring connection structures may be connected to each other and the cell stacked structure and the wiring connection structures may be one stacked structure.

As shown in FIG. 4, the cell stacked structure 280 (see FIG. 1A) may be formed on the first region. The cell stacked structure 280 may include insulation layers 110 and gate patterns 240 repeatedly and alternately stacked in the vertical direction. The gate patterns 240 may include a metal.

Channel structures 200 may pass through the cell stacked structure 280. The channel structures may be electrically connected to the base pattern 40. In example embodiments, the channel structure 200 may include a dielectric layer structure 203, a channel 204, a filling insulation pattern 206 and an upper conductive pattern 208.

In FIG. 1A, the channel structures 200 are simply shown. However, in reality, the channel structures 200 may be arranged differently from those shown in FIG. 1A. FIG. 1B is an enlarged view of a channel structure region (i.e., 'A' portion of FIG. 1A) in the first region. In example embodiments, the channel structures formed in the first region may have an arrangement as shown in FIG. 1B.

Referring to FIG. 1B, in a first column r1, four channel structures 200 are arranged in the second direction. In a second column r2 adjacent to the first column r1, five channel structures 200 may be arranged in the second direction. In this case, a distance between neighboring channel structures 200 in the first direction may be less than a distance between neighboring channel structures 200 in the second direction.

Referring again to FIG. 4, the dielectric layer structure 203 may include a tunnel insulation layer 202a, a charge storage layer 202b, and a blocking layer 202c sequentially stacked on an outer wall of the channel 204. The upper conductive pattern 208 may include polysilicon.

As shown in FIG. 2A, a wiring connection structure on the second region may serve as a pad structure 282. The pad structure 282 may include insulation layers 110 and the gate patterns 240 repeatedly and alternately stacked in the vertical direction. That is, the cell stacked structure 280 and the pad structure 282 may include an insulating material and a conductive material alternately and repeated stacked in the vertical direction.

The pad structure 282 may have a stepped shape so that an upper surface of an edge of each of the gate patterns 240 stacked in the vertical direction may be exposed. That is, each of the gate patterns 240 includes a step portion that is a portion not overlapped by gate patterns 240 positioned thereover. An exposed upper surface of each of the gate patterns 240 may serve as a pad.

The pad structure 282 may include an n-th staircase structure, an n+1 staircase structure, and an n-th dummy staircase structure disposed between the n-th staircase structure and the n+1 staircase structure. Hereinafter, the pad structure 282 includes a first to third staircase structure S1, S2, S3, a first dummy staircase structure DS1 between the first and second staircase structure S1 and S2, and a second dummy staircase structure DS2 between the second and third staircase structures S2 and S3. However, the number of staircase structures and dummy staircase structures is not limited thereof. In the pad structure 282, the first staircase structure S1 may be a staircase structure located at a top portion and the first dummy staircase structure DS1 may be a dummy staircase structure located at a top portion.

The pad structure 282 may further include a first sacrificial pattern 126 (see FIG. 3) adjacent to the first region, and the first sacrificial pattern 126 may have a stepped shape. The first sacrificial pattern 126 may include steps in the first direction. For example, the first sacrificial pattern 126 may include steps of three levels in the first direction. The first sacrificial pattern 126 may include insulation layers and gate patterns repeatedly stacked. An uppermost surface of the first sacrificial pattern 126 may be coplanar with an uppermost surface of the cell stacked structure.

Referring to FIG. 3, one sidewall of the first staircase structure S1 has a stepped shape and steps of the first staircase structure S1 may serve as the pads. In the first staircase structure S1, upper steps may be disposed at a first sidewall of first staircase structure S1 facing the steps of the first sacrificial pattern 126. The upper steps may be symmetrical with the steps of the first sacrificial pattern 126. For example, the upper steps may include steps of three levels in the first direction. Each of steps may include a conductive pattern the same as the gate pattern.

An uppermost surface of the first staircase structure S1 may be coplanar with the uppermost surface of the cell stacked structure 280. The uppermost surface of the first staircase structure S1 may be substantially flat. An uppermost portion of the first staircase structure S1 may serve as an upper dummy region 80 (see FIG. 2A).

One sidewall of the first staircase structure S1 serving as the pad may include steps in the first direction and the second direction, respectively. For example, as shown in FIG. 2A, the one sidewall of the first staircase structure S1 may include steps of three levels in the first direction and steps of four levels in the second direction. In this case, the step of one level in the first direction may include four gate patterns stacked. For example, as shown in FIG. 3, the one sidewall of the first staircase structure S1 may include steps of four levels in the first direction and steps of four levels in the second direction.

The second staircase structure S2 may be disposed below the first staircase structure S1. The second staircase structure S2 may be spaced apart from the first staircase structure S1 in the first direction. In example embodiments, one side of the second staircase structure S2 may include steps having the same shape as steps included in the first staircase structure S1.

The third staircase structure S3 may be disposed below the second staircase structure S2. The third staircase structure S3 may be spaced apart from the second staircase structure S2 in the first direction. In example embodiments, the third staircase structure S3 may include steps having the same shape as steps included in the first and second staircase structures S1 and S2.

A first dummy region may be between the first and second staircase structures S1 and S2 in a first direction. The first dummy region may be an upper surface portion extending in the first direction from an edge of a lowermost surface of the first staircase structure S1. The first dummy staircase structure DS1 may be formed on the first dummy region.

Steps of a plurality of levels may be formed at both sides in the first direction of the first dummy staircase structure DS1. An uppermost surface of the first dummy staircase structure DS1 may be substantially flat.

When a width of the uppermost surface of the first dummy staircase structure DS1 is small, an effect of preventing a dishing defect may be decreased. When the width of the uppermost surface of the first dummy staircase structure DS1 is large, a total width of the wiring connection structure may be increased. In example embodiments, the width in the first direction of the uppermost surface of the first dummy staircase structure DS1 may be about 2 μm to about 20 μm.

The uppermost surface of the first dummy staircase structure DS1 may be coplanar with the uppermost surface of the cell stacked structure 280. That is, the uppermost surface of the first dummy staircase structure DS1 may be coplanar with the uppermost surface of the first staircase structure S1. Steps of a plurality of levels at both sides in the first direction of the first dummy staircase structure DS1 may be symmetric with respect to a straight line L1 (see FIG. 2A) passing a center portion in the first direction of the first dummy staircase structure DS1 and extending in the second direction.

In example embodiments, in the first staircase structure S1 and the first dummy staircase structure DS1, the steps facing in the first direction may be symmetric to each other.

For example, both sidewalls of the first dummy staircase structure DS1 may include steps of three levels in the first direction and steps of four levels in the second direction. In the first dummy staircase structure DS1, the step of one level in the first direction may include four gate patterns stacked.

A second dummy region may be between the second and third staircase structures S2 and S3. The second dummy region may be an upper surface portion extending in the first direction from an edge of a lowermost surface of the second staircase structure S2. The second dummy staircase structure DS2 may be formed on the second dummy region.

Steps of a plurality of levels may be formed at both sides in the first direction of the second dummy staircase structure DS2. An uppermost surface of the second dummy staircase structure DS2 may be substantially flat.

When a width of the uppermost surface of the second dummy staircase structure DS2 is small, the effect of preventing a dishing defect may be decreased. When the width of the uppermost surface of the second dummy staircase structure DS2 is large, the total width of the wiring connection structure may be increased. In example embodiments, the width in the first direction of the uppermost surface of the second dummy staircase structure DS2 may be about 2 μm to about 20 μm.

The uppermost surface of the second dummy staircase structure DS2 may be coplanar with the uppermost surface of the cell stacked structure 280. That is, the uppermost surface of the second dummy staircase structure DS2 may be coplanar with the uppermost surface of the first staircase structure S1. Therefore, a vertical height of the second dummy staircase structure DS2 may be higher than a vertical height of the first dummy staircase structure DS1.

Steps at both sides in the first direction of the second dummy staircase structure DS2 may be symmetric with respect to a straight line L2 (see FIG. 2A) passing a center portion in the first direction of the second dummy staircase structure DS2 and extending in the second direction.

In example embodiments, in the second staircase structure S2 and the second dummy staircase structure DS2, the steps facing in the first direction may be symmetric to each other. In example embodiments, in the second dummy staircase structure DS2 and the first dummy staircase structure DS1, the steps facing in the first direction may be symmetric to each other. For example, both sidewalls of the second dummy staircase structure DS2 may include steps of six levels in the first direction and steps of four levels in the second direction.

Referring to FIG. 1A, second trenches 212 extending in the first direction may be formed in the first region and the second region. That is, the second trenches 212 may be formed between structures extending from the cell stacked structure 280 to the pad structure 282. The second trenches 212 may serve as a word line cutting region. An insulation pattern may be filled in the second trench 212.

As shown in FIG. 2B, a wiring connection structure on the third region may be serve as a through via insulation structure 284.

The insulation layers 110 and sacrificial layers 112 may be repeatedly stacked in a first portion of the through via insulation structure 284. That is, the first portion of the through via insulation structure 284 may not include a gate pattern including the conductive material. Thus, the first portion of the through via insulation structure 284 may be electrically insulated from the gate patterns of the memory cells.

In example embodiments, a central portion of the through via insulation structure 284 may include the insulation layers 110 and the sacrificial layers 112 repeatedly stacked in the vertical direction. An edge portion of the through via insulation structure 284 may include the insulation layers 110 and the gate pattern repeatedly stacked in the vertical direction. The central portion of the through via insulation structure 284 may serve as a structure for forming a through via contact. Hereinafter, the central portion of the through via insulation structure 284 is mainly described.

In the through via insulation structure 284, the upper surface of the edge in the first direction of each of the sacrificial layers 112 may be exposed, so that the sacrificial layers 112 may have a stepped shape.

The steps of the through via insulation structure 284 and the steps of the pad structure 282 may be symmetric with respect to the cell stacked structure 280.

That is, the through via insulation structure 284 may include steps having the same shape as steps included in the n-th staircase structure, the n+1 staircase structure, and the n-th dummy staircase structure disposed between the n-th staircase structure and the n+1 staircase structure of the pad structure 282. Staircase structures included in the through via insulation structure 284 may be referred to as an n-th insulation staircase structure, an n+1 insulation staircase structure, and an n-th dummy insulation staircase structure disposed between the n-th insulation staircase structure and the n+1 insulation staircase structure.

The steps of the through via insulation structure 284 and the steps of the pad structure 282 may be substantially the same shape. However, the through via insulation structure 284 may include the insulation layers 110 and the sacrificial layers 112 repeatedly stacked. The pad structure 282 may include the insulation layers 110 and gate patterns repeatedly stacked. That is, the pad structure 282 may have a shape such that a portion where the sacrificial layers 112 are formed in the through via insulation structure 284 may be replaced with the gate pattern 240.

The second trenches extending in the first direction may not be formed in the through via insulation structure 284. That is, the word line cutting region may not be formed in the through via insulation structure 284.

A plurality of stacked structures may be arranged in the second direction. A first trench 210 (see FIG. 1A) extending in the first direction may be formed between the stacked structures. The first trench 210 may serve as a cell block cutting region. An insulation pattern may be filled in the first trench 210.

In this case, in neighboring stacked structures in the second direction, the positions of the pad structure 282 and the through via insulation structure 284 (see FIG. 2B) may be different from each other. That is, in neighboring stacked structures in the second direction, the pad structure 282 and the through via insulation structure 284 may be disposed to face each other. Thus, in neighboring stacked structures in the second direction, the pad structure 282, and the through via insulation structure 284 may be adjacent to each other.

A first insulating interlayer 150 (see FIG. 2A) may be formed on the base pattern 40 (see FIG. 5) and the lower insulation pattern 42 to cover upper portions of the stacked structures on the second and third regions. Thus, the first insulating interlayer 150 may cover step portions of the stacked structure. The first insulating interlayer 150 may include, e.g., an oxide such as silicon oxide.

In example embodiments, an upper surface of the first insulating interlayer 150 may be coplanar with upper surfaces of the first and second dummy staircase structures DS1 (see FIG. 2A) and DS2 and the first and second dummy insulation staircase structures DS1' and DS2' (see FIG. 2B).

Further, the upper surfaces of the first insulating interlayer 150 may be coplanar with the upper surfaces of the first staircase structure S1 and the first insulation staircase structure S1'.

A second insulating interlayer 202 may be further formed on the stacked structures and the first insulating interlayer 150 (see FIG. 2A).

Referring to FIG. 2A, first to third contact plugs 312, 314, and 316 may be formed through the first and second insulating interlayers 150 and 202 and the first to third contact plugs 312, 314, and 316 may contact the upper surfaces of the steps of the pad structure 282, respectively. The first contact plug 312 may contact the upper surface of each step of the gate patterns 240 included in the first staircase structure S1. The second contact plug 314 may contact the upper surface of each step of the gate patterns 240 included in the second staircase structure S2. The third contact plug 316 may contact the upper surface of each step of the gate patterns 240 included in the third staircase structure S3.

Referring to FIG. 2B, a through via contact 318 may be formed through the first and second insulating interlayers 202, the through via insulation structure 284, the lower insulation pattern 42, and the lower insulating interlayer 20 (see FIG. 5). The through via contact 318 may contact the upper surface of the lower pad pattern 16. In each of the stacked structures, the through via contact 318 on the third region and the gate patterns 240 on the first region may be electrically insulated to each other.

For example, as shown in FIG. 2B, the through via contacts 318 of a first group 317a may pass through the first insulation dummy staircase structure DS1' or second insulation dummy staircase structure DS2'. The through via contacts 318 of the first group 317a may extend from the uppermost surfaces of the first and second insulation dummy staircase structures DS1' and DS2' to bottom of the stacked structure. In this case, the through via contacts 318 of the first group 317a may not pass through the steps of the first and second dummy insulation staircase structures DS1' and DS2' and the first insulating interlayer 150.

For example, the through via contacts 318 of a second group 317b and a third group 317c may be pass through the first insulating interlayer 150 and the first insulation dummy staircase structure DS1'. Also, the through via contacts 318 of the second group 317b and a third group 317c may be pass through the first insulating interlayer 150 and the second insulation dummy staircase structure DS2'. The through via contacts 318 of the second group 317b and the third group 317c may extend from the upper surface of the first insulating interlayer 150 to bottom of the stacked structure.

Each of the through via contacts 318 of second group 317b may pass through the upper surface of the one of steps of the first insulation dummy staircase structure DS1' or the second insulation dummy staircase structure DS2'.

Each of the through via contacts 318 of the third group 317c may pass through the upper surfaces of two of the steps of the first insulation dummy staircase structure DS1' or the second insulation dummy staircase structure DS2'.

For example, the through via contacts 318 of a fourth group 317d may be pass through the first insulating interlayer 150 and a portion between the insulation dummy staircase structure and the insulation staircase structure.

Although not illustrated, some of the through via contacts 318 may pass through the first insulating interlayer 150 and one of the first to third insulation staircase structures S S2', and S3' of FIG. 2B.

The through via contacts 318 may pass through the second insulating interlayer 202.

An upper wiring 320 may be formed on the second insulating interlayer 202. The upper wiring 320 may electrically connect between one of the first to third contact plugs 312, 314, and 316 and one of the through via contacts 318 included in a neighboring through via insulation structure 284 in the second direction.

For example, an upper surface of each of the first to third contact plugs 312, 314, and 316 may contact a lower surface of the upper wiring 320. Further, the upper wiring 320 may extend to the through via contact 318 included in the neighboring stacked structure in the second direction and the upper wiring 320 may contact the upper surface of the through via contact 318. Each of the gate patterns 240 may be electrically connected to the peripheral circuits by the first to third contact plugs 312, 314, and 316, the upper wiring 320, and the through via contact 318.

Referring to FIG. 4, a cell contact plug 310 may pass through the second insulating interlayer 202 on the first region and the cell contact plug 310 may contact an upper surface of the upper conductive pattern 208. A bit line 342 may contact the cell contact plug 310. In example embodiments, the bit line 342 may extend in the second direction. A plurality of bit lines may be arranged in the first direction.

FIGS. 5 to 29 are plan views, cross-sectional views, and a perspective view illustrating a method of manufacturing a semiconductor device in accordance with example embodiments.

Figure 9:
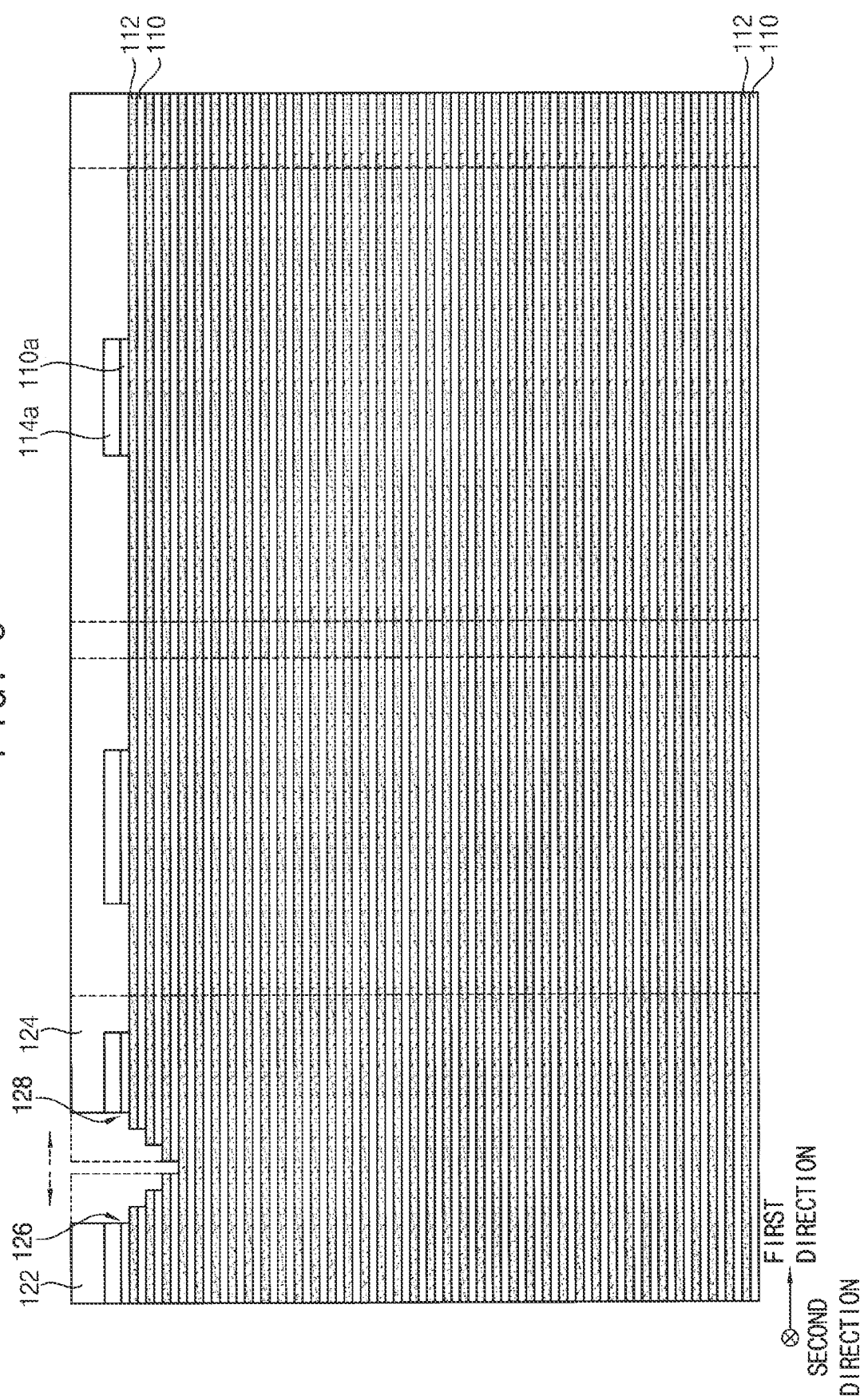
Figure 10:
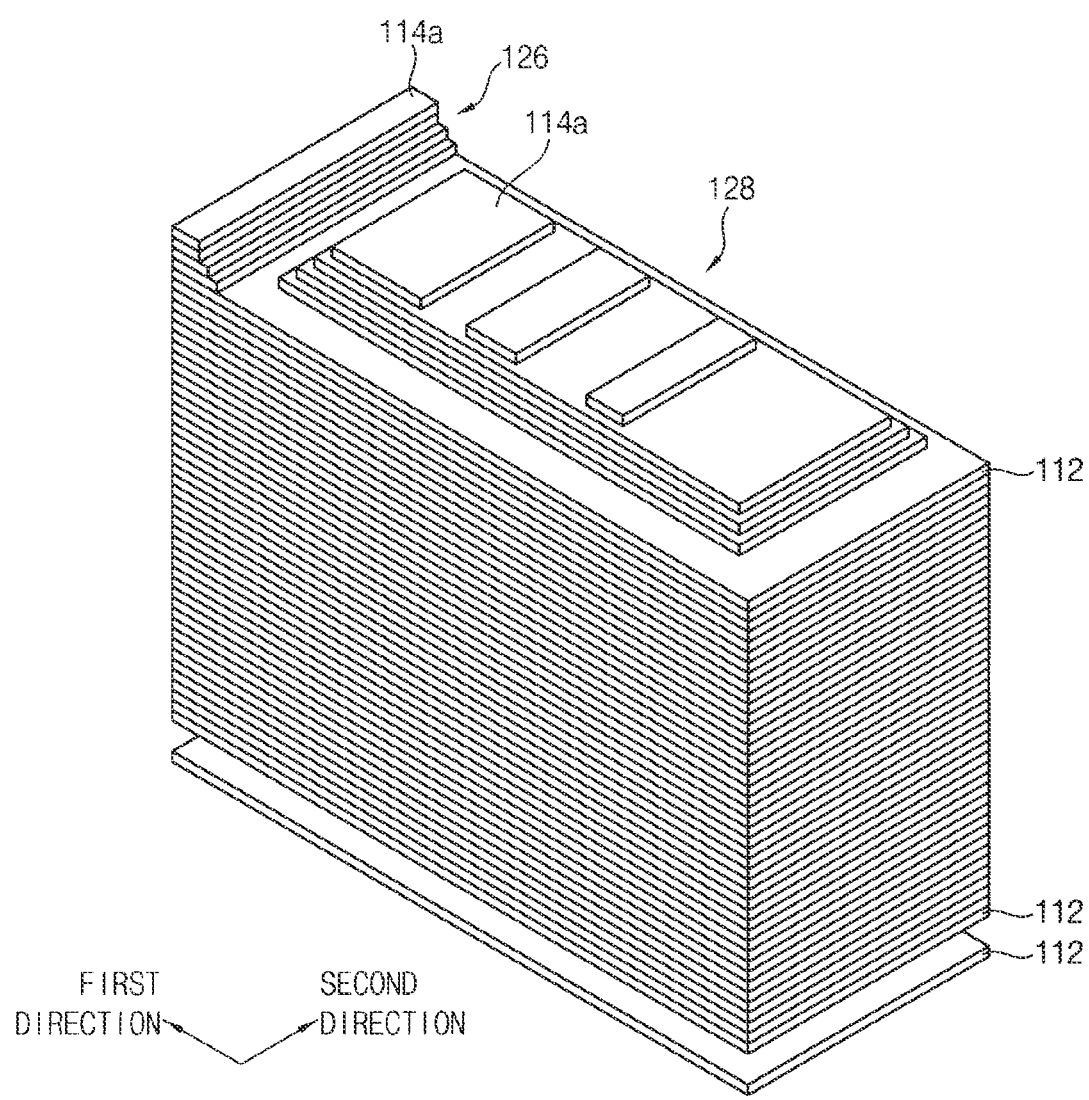

Particularly, FIGS. 5 to 7, 9, 11 to 20, 23, 24, 26, 28 and 29 are cross-sectional views, FIGS. 8, 21, 22, 25 and 27 are plan views, and FIG. 10 is a perspective view.

Each of the cross-sectional views shows that one of the second and the third regions is cut in the first direction. In each of the cross-sectional views, the base pattern 40, the lower insulation pattern 42 and structures positioned therebelow are omitted, and only structures formed above the base pattern 40 and the lower insulation pattern 42 are illustrated. However, in some of the cross-sectional views, only a lower pad pattern is briefly illustrated.

Referring to FIG. 5, circuit patterns may be formed on a substrate 10 including a first region, a second region, and a third region. The lower insulating interlayers 20 may be formed on the substrate 10 to cover the circuit patterns.

First, a trench isolation process may be performed on the substrate 10 to form a field region in which an isolation pattern 12 is formed and an active region in which the isolation pattern 12 is not formed. A lower contact plug 14 may be formed through the lower insulating interlayer 20. The lower contact plug 14 may be electrically connected to the circuit patterns. A lower pad pattern 16 may be formed in the lower insulating interlayer 20, and the lower pad pattern 16 may be electrically connected to the lower contact plug 14.

Base patterns 40 may be formed on the lower insulating interlayer 20. A lower insulation pattern 42 may be formed between the base patterns 40. The upper surfaces of the base pattern 40 and the lower insulation pattern 42 may be flat, and the upper surfaces of the base pattern 40 and the lower insulation pattern 42 may be coplanar with each other.

In the following drawings, the circuit patterns, the base pattern 40, and the lower insulation pattern 42 formed on the substrate 10 are not illustrated to avoid the complexity of the drawings. In addition, each of the cross-sectional views only shows structures formed on the first region or the second region.

Figure 6:
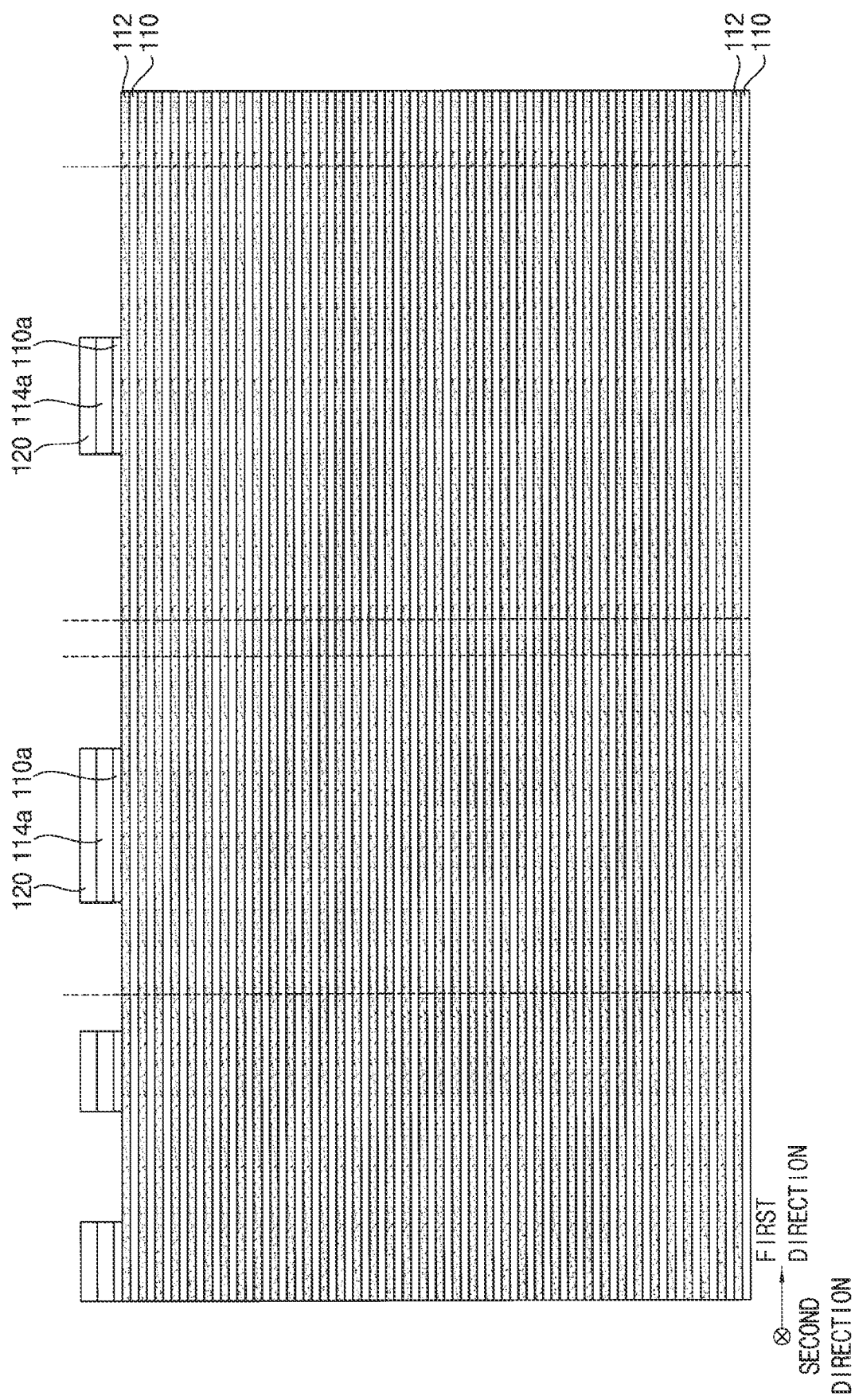

Referring to FIG. 6, insulation layers 110 and sacrificial layers 112 may be alternately repeatedly stacked on the base pattern 40 and the lower insulation pattern 42 in the first to third regions. A stop layer may be formed on the uppermost insulation layer 110. A stop layer may be formed to have a thickness greater than a thickness of each of the insulation layers 110. The insulation layer 110 may include, e.g., an oxide such as silicon oxide, and the sacrificial layer 112 may include a material having an etch selectivity with respect to the insulation layer 110. The sacrificial layer 112 may include, e.g., a nitride such as silicon nitride. The stop layer may include nitride, such as silicon nitride.

Hereinafter, processes for forming a mold structure having a stepped shape on the second region are described. During the processes for forming the mold structure, the stop layer on the first region of the substrate 10 is covered by photoresist patterns and thus the stop layer on the first region of the substrate 10 may not be etched. Therefore, the first region of the substrate 10 is not described.

In addition, the mold structure having the stepped shape formed on the second and third regions may be formed by the same process and may be symmetric with respect to the first region. Therefore, only the processes for forming the mold structure having the stepped shape on the second region are mainly described. In the sacrificial layers formed on the second region, an n-th sacrificial layer from a top sacrificial layer is simply referred to as an n-th sacrificial layer.

Thereafter, first photoresist patterns 120 may be formed on the stop layer. The first photoresist patterns 120 may selectively cover portions corresponding to an upper dummy region and uppermost surfaces of a first staircase structure and a dummy staircase structure.

In example embodiments, the first photoresist patterns 120 may have a line shape extending in the second direction. In some example embodiments, each of the first photoresist patterns 120 may have an isolated shape and the first photoresist patterns 120 may be spaced apart from each other in the second direction.

The stop layer and the insulation layer therebelow may be etched using the first photoresist patterns 120 as an etching mask to form an upper insulation layer pattern 110a and the stop layer pattern 114a on a first sacrificial layer 112.

Thereafter, the first photoresist patterns 120 may be removed by an ashing process and/or a stripping process.

Figure 7:
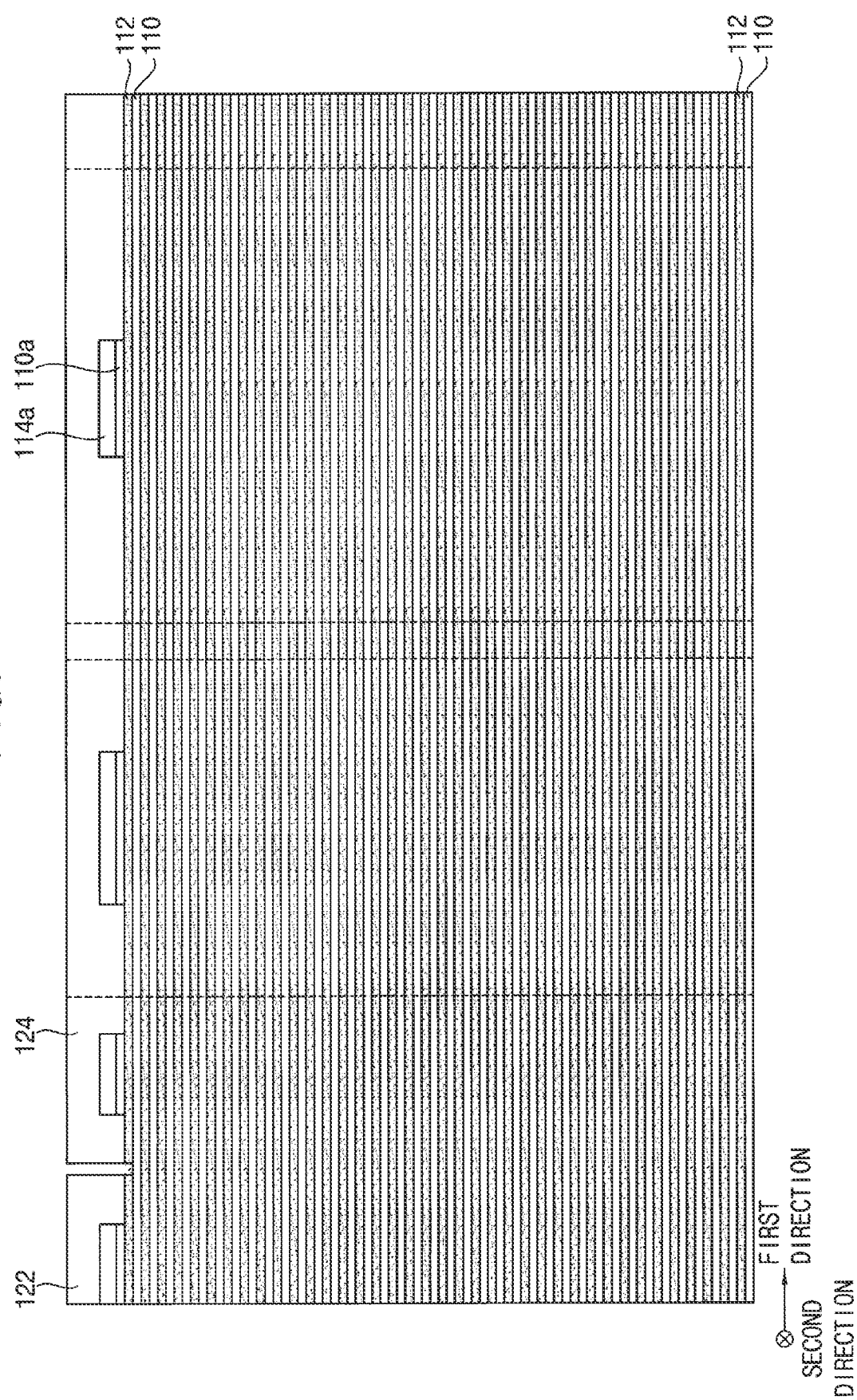
Figure 8:
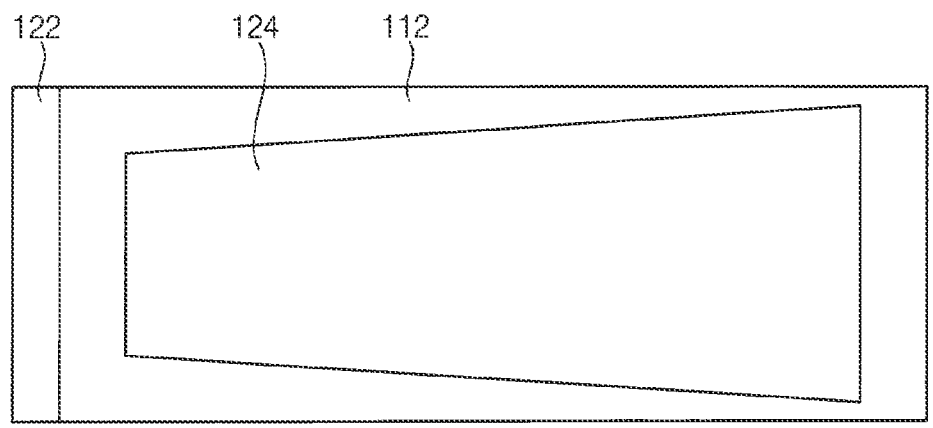

Referring to FIGS. 7 and 8, a second photoresist pattern 122 and a third photoresist pattern 124 may be formed on the stop layer pattern 114a and a top sacrificial layer 112. The third photoresist pattern 124 may be spaced apart from the second photoresist pattern 122 in the first direction. A plurality of third photoresist patterns 124 may be spaced apart to each other in the second direction.

The second photoresist pattern 122 may be formed on the second region adjacent to the first region, and the second photoresist pattern 122 may have a line shape. The third photoresist pattern 124 may cover portions of the stop layer pattern 114a and the sacrificial layer 112. The third photoresist pattern 124 may have a rectangular shape extending in the first direction, in a plan view. The third photoresist pattern 124 may cover portions corresponding to a pad structure on the second region and a through via insulation structure on the third region subsequently formed.

In example embodiments, as shown in FIG. 8, a width in the second direction of the third photoresist pattern 124 may be increased as a distance from the first region increases. That is, the third photoresist pattern 124 may have a trapezoidal shape rather than a complete rectangular shape. The number of etching processes for forming a staircase structure and a dummy staircase structure disposed far from the first region may be more than the number of etching processes for forming a staircase structure and a dummy staircase structure disposed closer to the first region. Thus, when the third photoresist pattern 124 has the trapezoidal shape, the width in the second direction of the staircase structures and the dummy staircase structures subsequently formed may be similar to each other.

The first sacrificial layer 112 may be etched using the second and third photoresist patterns 122 and 124 as an etching mask.

In the perspective view of FIG. 10, in order to avoid the complexity of the drawings, the insulation layers are not illustrated, and only the sacrificial layers 112 and the stop layer pattern 114a are illustrated.

Referring to FIGS. 9 and 10, a first trimming process may be performed to reduce sizes of the second and third photoresist patterns 122 and 124. By the first trimming process, sizes of the second and third photoresist patterns may be reduced in each of the first and second directions. Thereafter, exposed first and second sacrificial layers 112 may be etched using trimmed second and third photoresist patterns 122 and 124 as an etching mask.

Subsequently, a second trimming process may be performed to reduce sizes of the second and third photoresist patterns 122 and 124 in the first and second directions. Thereafter, exposed first to third layer sacrificial layers 112 may be etched using the trimmed second and third photoresist patterns 122 and 124 as an etching mask.

When the processes are performed, a first sacrificial pattern 126 may be formed by the second photoresist pattern 122, and a second sacrificial pattern 128 may be formed by the third photoresist pattern 124. For example, as shown in FIGS. 9 and 10, the first and second sacrificial patterns 126 and 128 may be formed on a fourth sacrificial layer 112. In this case, a plurality of second sacrificial patterns 128 may also be formed in the second direction.

A sidewall of an edge in the first direction of the first sacrificial pattern 126 may have a stepped shape. Sidewalls of edges in the first and second directions of the second sacrificial pattern 128 may have stepped shapes, respectively. The steps in the second direction of the second sacrificial pattern 128 may be provided for forming steps in the second direction of the staircase structure and dummy staircase structure by a subsequent process. In example embodiments, the number of the stacked layers of the second sacrificial patterns 128 may be one less than the number of steps in the second direction of each of the staircase structure and the dummy staircase structure.

In some example embodiments, the first and second sacrificial patterns 126 and 128 may be formed to include more or fewer numbers of stacked layers. That is, the number of stacked layers in the first and second sacrificial patterns 126 and 128 (e.g., the number of steps) may be controlled by the number of trimming and etching processes of the photoresist pattern.

Thereafter, the second and third photoresist patterns 122 and 124 may be removed by an ashing process and/or a stripping process.

Hereinafter, as shown in FIG. 10, the second sacrificial pattern having a stepped shape is referred to as an initial second sacrificial pattern.

Figure 11:
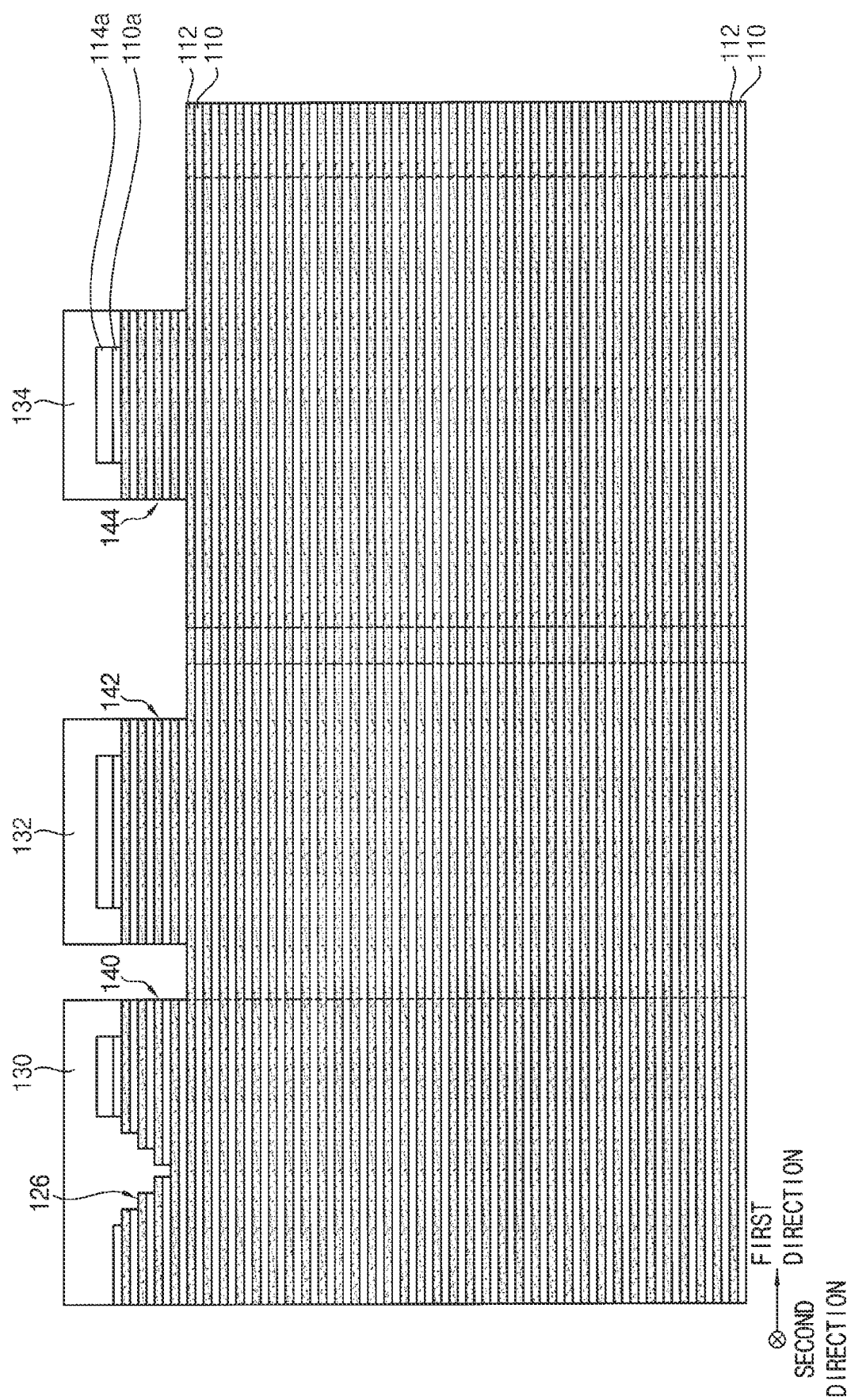

Referring to FIG. 11, fourth, fifth, and sixth photoresist patterns 130, 132, and 134 may be formed on the sacrificial layer 112 and the stop layer pattern 114a. The fourth, fifth, and sixth photoresist patterns 130, 132, and 134 may be spaced apart from each other in the first direction.

The fourth photoresist pattern 130 may cover the first sacrificial patterns 126, the upper dummy region, and a portion for forming the first staircase structure. The fifth photoresist pattern 132 may cover a portion for forming the first dummy staircase structure. The sixth photoresist pattern 134 may cover a portion for forming the second dummy staircase structure positioned at the same height as the first dummy staircase structure.

Therefore, a portion between the fourth and fifth photoresist patterns 130 and 132 may correspond to a portion between the first staircase structure and the first dummy staircase structure. A portion between the fifth and sixth photoresist patterns 132 and 134 may correspond to a portion between the first dummy staircase structure and the second dummy staircase structure positioned at the same height as the first dummy staircase structure. Portions for forming the second and third dummy staircase structures under the first dummy staircase structure may be exposed by beside of the sixth photoresist pattern 134.

Subsequently, exposed sacrificial layers may be etched using the fourth to sixth photoresist patterns 130, 132, and 134 as an etching mask. In the etching process, four sacrificial layers may be etched. That is, portions of the first to fourth sacrificial layers 112 may be etched to form a preliminary first staircase pattern 140, a preliminary third sacrificial pattern 142, and a preliminary fourth sacrificial pattern 144 on a fifth layer sacrificial layer. Each of the preliminary first staircase pattern 140, the preliminary third sacrificial pattern 142, and the preliminary fourth sacrificial pattern 144 may include four sacrificial layers. In addition, portions of the sacrificial layers 112 covered by the fourth to sixth photoresist patterns 130, 132, and 134 may remain, without etching.

In example embodiments, in the etching process, the number of sacrificial layers etched is one more than the number of layers included in the initial second sacrificial pattern 128. That is, when the initial second sacrificial pattern 128 includes three sacrificial layers, four sacrificial layers 112 (i.e., the first to fourth sacrificial layers) may be etched by the etching process.

As described above, the four sacrificial layers may be etched by the etching process using the fourth to sixth photoresist patterns 130, 132, and 134, but the disclosure is not limited thereto. More or fewer sacrificial layers may be etched by the etching process.

Figure 12:
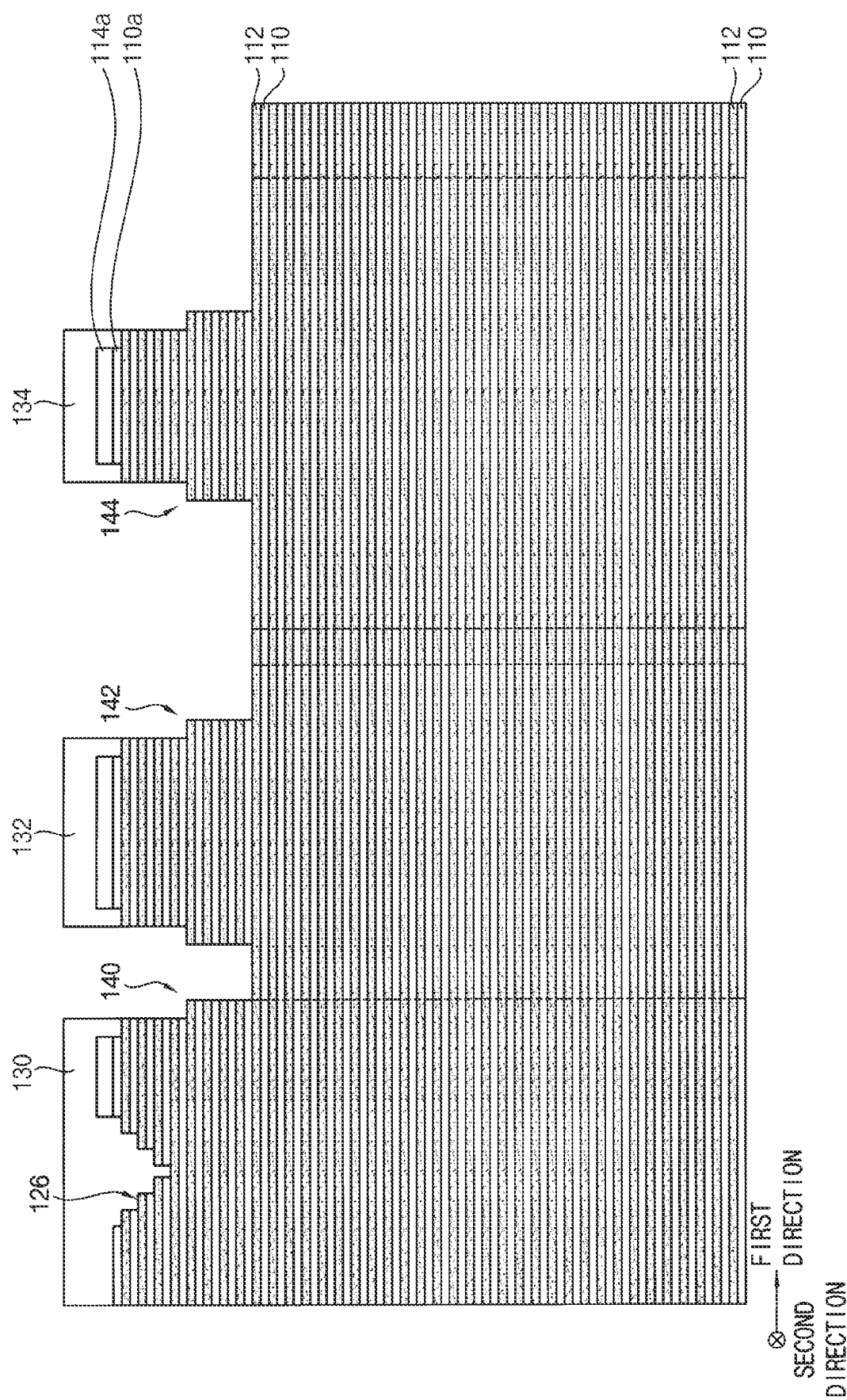

Referring to FIG. 12, a first trimming process may be performed to reduce sizes of the fourth to sixth photoresist patterns 130, 132, and 134. Exposed sacrificial layers may be etched using the trimmed fourth to sixth photoresist patterns 130, 132, and 134 as an etching mask. When one etching process is performed, four sacrificial layers 112 may be etched.

Figure 13:
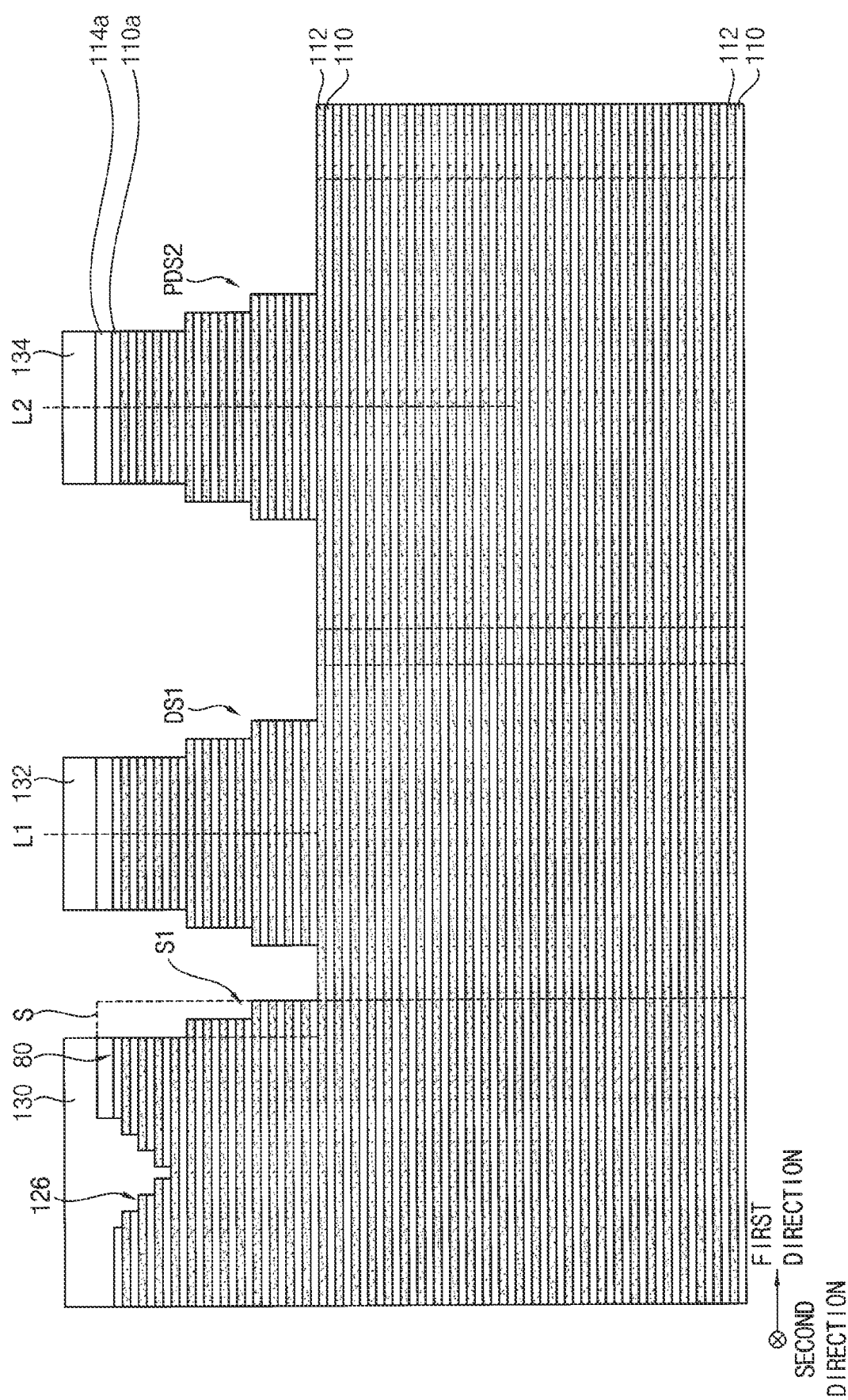

Referring to FIG. 13, a second trimming process may be performed to reduce sizes of the fourth to sixth photoresist patterns 130, 132, and 134. Exposed sacrificial layers may be etched using the trimmed fourth to sixth photoresist patterns 130, 132, and 134 as an etching mask. When one etching process is performed, four sacrificial layers may be etched.

By the above process, the sacrificial layers exposed by the fourth to sixth photoresist patterns 130, 132, and 134 may be sequentially and repeatedly etched in a unit of four layers. Therefore, one step in the first direction may be formed at exposed portions of the fourth to sixth photoresist patterns 130, 132, and 134 by one etching process. In addition, a sidewall of the one step in the first direction may include four sacrificial layers 112.

When the trimming and etching processes are performed once on the fourth to sixth photoresist patterns 130, 132, and 134, one step in the first direction may be further formed at each of the preliminary first staircase pattern 140, the preliminary third sacrificial pattern 142, and the preliminary fourth sacrificial pattern 144. Although not shown, four steps in the second direction may be already formed at each of the preliminary first staircase pattern 140, the preliminary third sacrificial pattern 142, and the preliminary fourth sacrificial pattern 144 by the second sacrificial pattern 128. As described above, the trimming and etching process may be performed once or multiple times, depending on the number of steps.

FIG. 13 shows a structure when three etching processes and two trimmings are performed. In this case, the three steps S in the first direction may be formed. However, the number of trimming and etching processes is not limited thereto. For example, four or more trimming processes may be performed, and thus 5 or more steps in the first direction may be formed.

As shown in FIG. 13, by performing the trimming process and the etching process, a first staircase structure S1, a first dummy staircase structure DS1 and a preliminary second dummy staircase structure PDS2 may be formed on a thirteenth sacrificial layer. The first dummy staircase structure DS1 may be apart from the first staircase structure S1. The preliminary second dummy staircase structure PDS2 may be spaced apart from the first dummy staircase structure DS1.

After forming the first staircase structure S1, the first dummy staircase structure DS1 and the preliminary second dummy staircase structure PDS2, the fourth to sixth photoresist patterns 130, 132, and 134 may be removed.

The first staircase structure S1 may include three steps in the first direction and four steps in the second direction on the thirteenth sacrificial layer. An uppermost surface of the first staircase structure S1 may have a flat surface. An uppermost portion of the first staircase structure S1 may serve as an upper dummy region 80.

The first dummy staircase structure DS1 may have steps at both sides of edges in the first direction. The first dummy staircase structure DS1 may include three steps in the first direction and four steps in the second direction on the thirteenth sacrificial layer. In the first dummy staircase structure DS1 formed on the thirteenth sacrificial layer, the steps may be symmetric with respect to a straight line L1 in the second direction passing a center portion in the first direction of the first dummy staircase structure DS1.

The preliminary second dummy staircase structure PDS2 may have steps at both sides of edges in the first direction. The preliminary second dummy staircase structure PDS2 may include three steps in the first direction and four steps in the second direction on the thirteenth sacrificial layer. In the preliminary second dummy staircase structure PDS2 formed on the thirteenth sacrificial layer, the steps may be symmetric with respect to a straight line L2 in the second direction passing a center portion in the first direction of the preliminary second dummy staircase structure PDS2.

Uppermost surfaces of the first staircase structure S1, the first dummy staircase structure DS1, and the preliminary second dummy staircase structure PDS2 may have the same height. That is, the uppermost surfaces of the first staircase structure S1, the first dummy staircase structure DS1, and the preliminary second dummy staircase structure PDS2 may be coplanar with each other. Further, the uppermost surfaces of the first staircase structure S1, the first dummy staircase structure DS1, and the preliminary second dummy staircase structure PDS2 may be coplanar with an uppermost surface of the initial second sacrificial pattern 128.

After performing the above processes, the fourth to sixth photoresist patterns 130, 132, and 134 may be removed by an ashing process and/or a stripping process.

Figure 14:
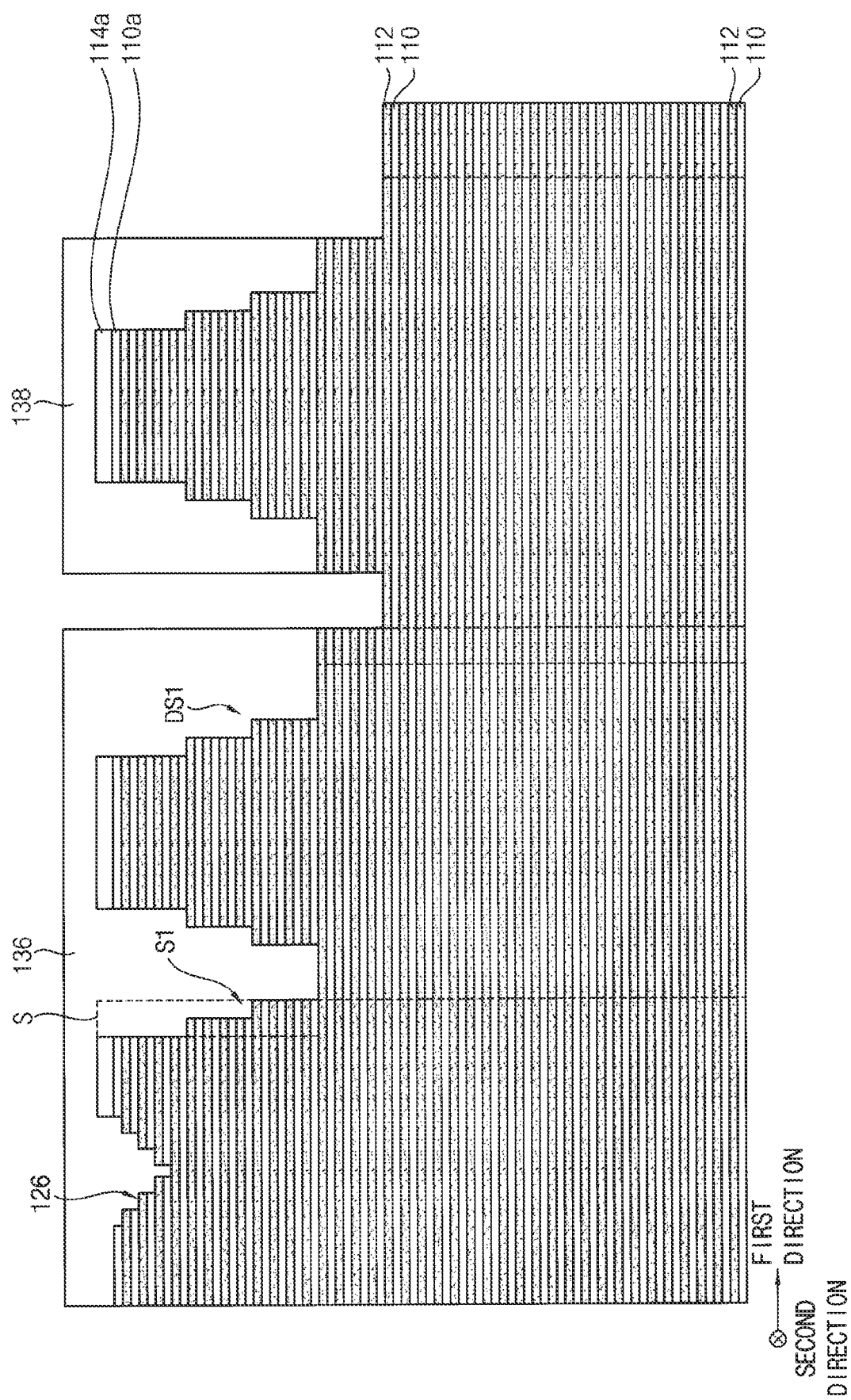

Referring to FIG. 14, a seventh photoresist pattern 136 and an eighth photoresist pattern 138 may be formed on the sacrificial layer 112 and the stop layer pattern 114*a*. The seventh and the eighth photoresist patterns 136 and 138 may be spaced apart from each other in the first direction.

The seventh photoresist pattern 136 may cover portions for forming the first sacrificial pattern 126, the first staircase structure S1, the first dummy staircase structure DS1 and the second staircase structure. The eighth photoresist pattern 138 may cover a portion for forming the second dummy staircase structure.

A portion between the seventh and eighth photoresist patterns 136 and 138 may correspond to a portion between the second staircase structure and the second dummy staircase structure. A portion for forming the third staircase structure may be exposed at beside of the eighth photoresist pattern 138.

Subsequently, exposed sacrificial layers 112 may be etched using the seventh and eighth photoresist patterns 136 and 138 as an etching mask. In the etching process, four sacrificial layers may be etched.

Figure 15:
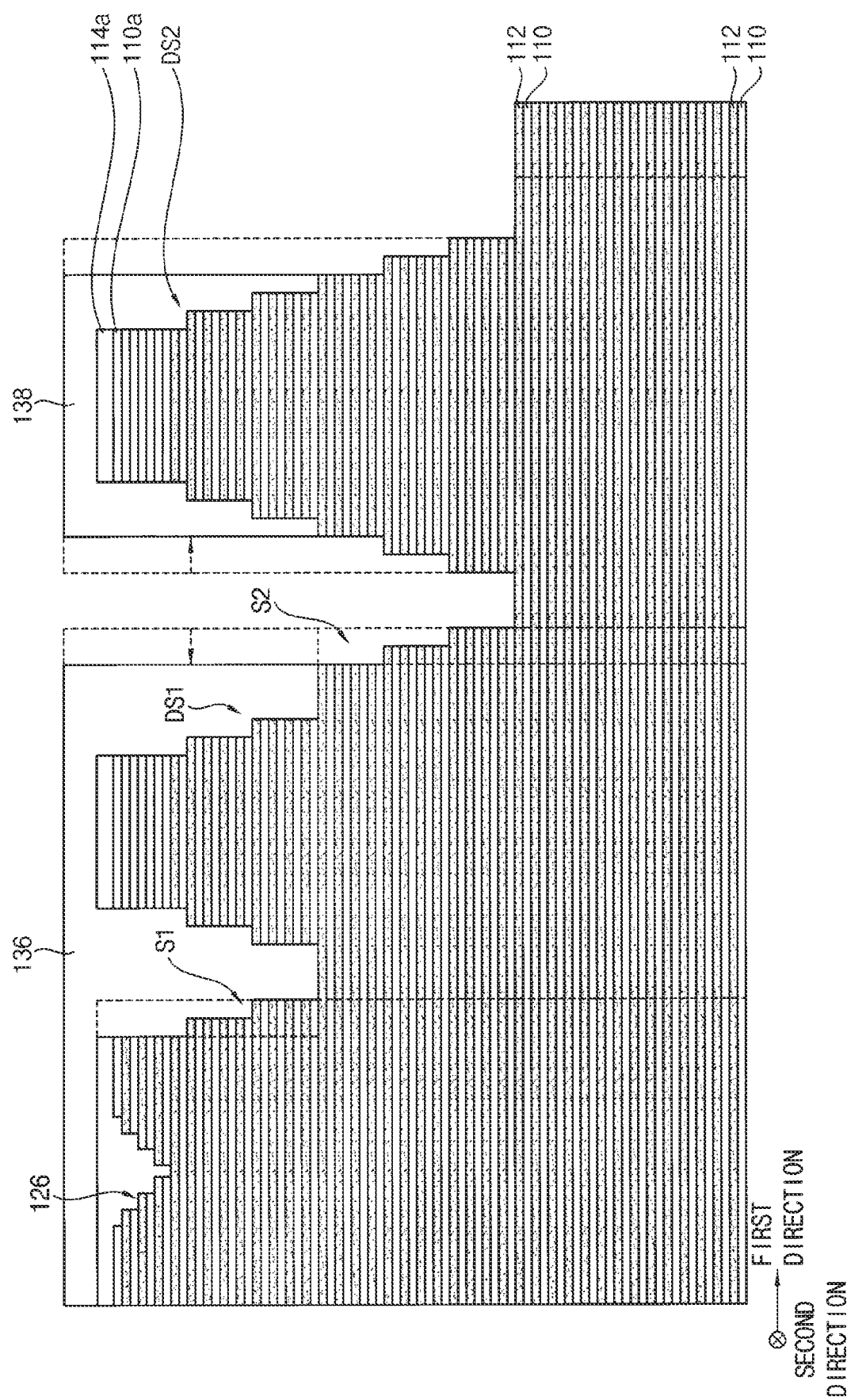

Referring to FIG. 15, a first trimming process may be performed to reduce sizes of the seventh and eighth photoresist patterns 136 and 138. Also, four sacrificial layers 112 may be etched using the trimmed seventh and eighth photoresist patterns 136 and 138 as an etching mask.

Subsequently, a second trimming process may be performed to reduce sizes of the seventh and eighth photoresist patterns 136 and 138. Also, four sacrificial layers 112 may be etched using the trimmed seventh and eighth photoresist patterns 136 and 138 as an etching mask. As such, the trimming process of the seventh and eighth photoresist patterns 136 and 138 and the etching process of the exposed sacrificial layers 112 may be repeatedly performed.

Therefore, as shown in FIG. 15, a second staircase structure S2 may be formed under the first dummy staircase structure DS1. In addition, steps may be further formed under the preliminary second dummy staircase structure PDS2, so that the second dummy staircase structure DS2 may be formed.

After performing the above processes, the seventh and eighth photoresist patterns 136 and 138 may be removed by an ashing process and/or a stripping process.

Figure 16:
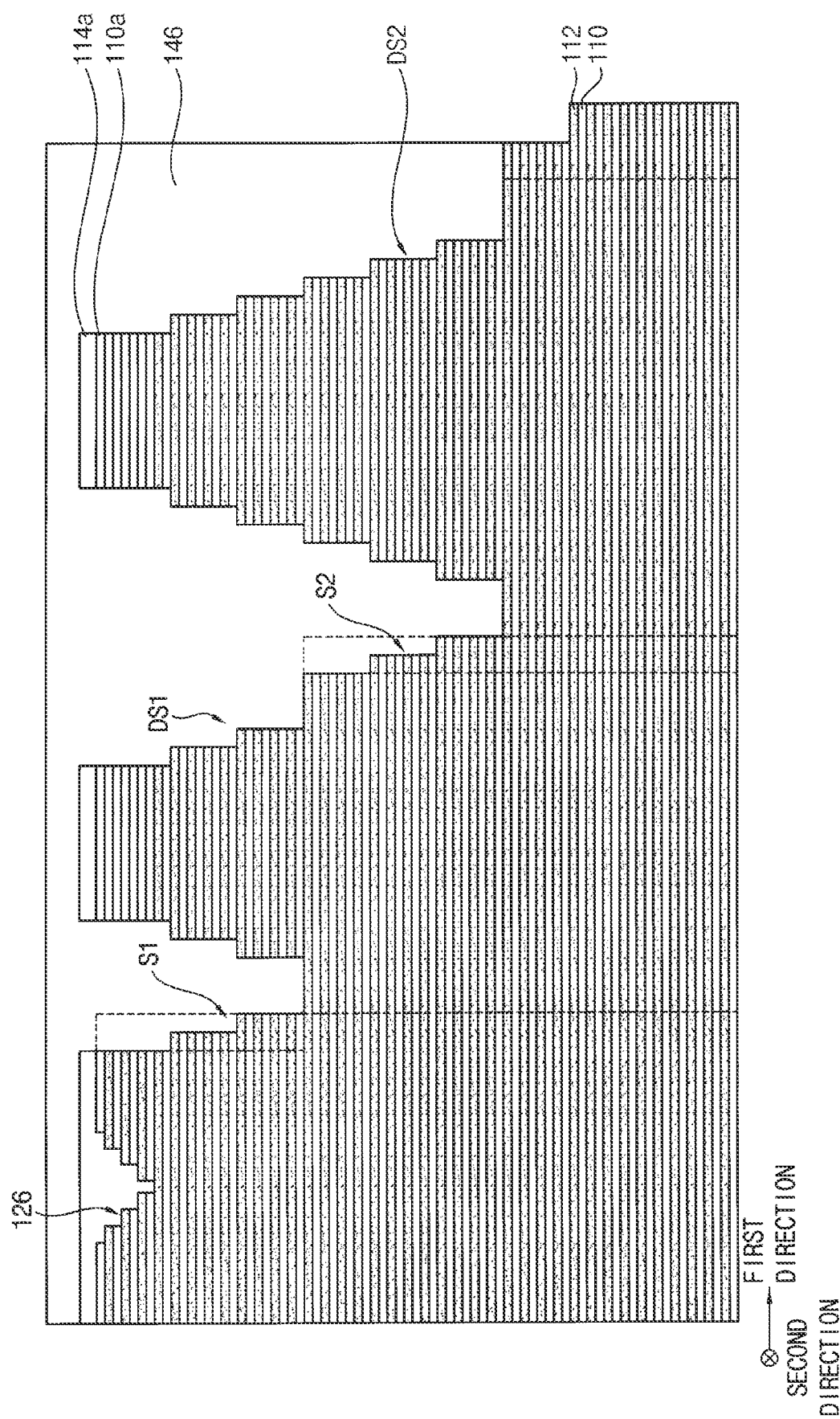

Referring to FIG. 16, a ninth photoresist pattern 146 may be formed on the sacrificial layer 112 and the stop layer pattern 114*a*.

The ninth photoresist pattern 146 may cover the first sacrificial pattern 126, the first staircase structure S1, the first dummy staircase structure DS1, the second staircase structure S2, and the second dummy staircase structure DS2 and a portion for forming the third staircase structure.

Subsequently, exposed sacrificial layers 112 may be etched using the ninth photoresist pattern 146 as an etching mask. In the etching process, four layers of sacrificial layers 112 may be etched.

Figure 17:
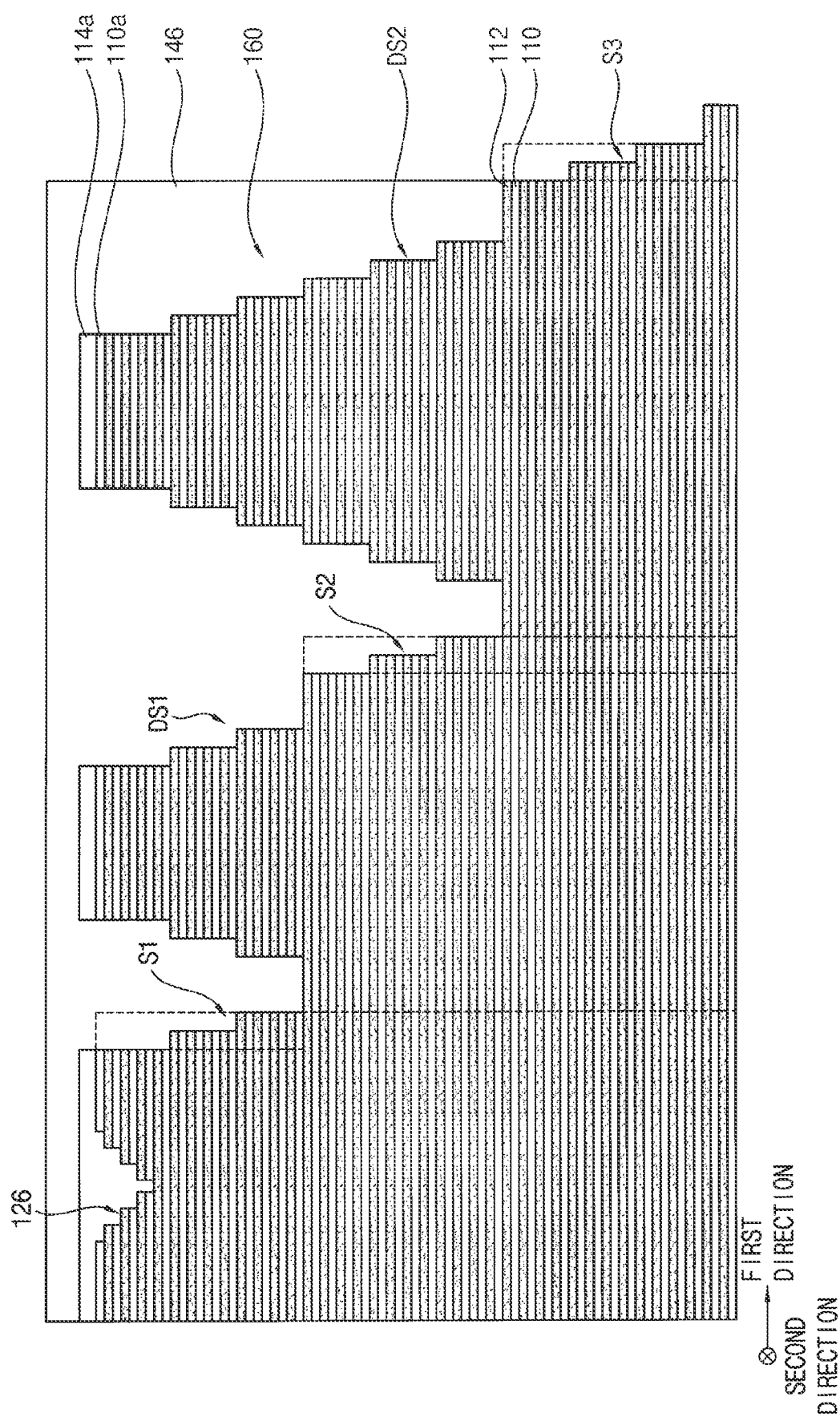

Referring to FIG. 17, a first trimming process may be performed to reduce sizes of the ninth photoresist pattern 146. Four sacrificial layers 112 may be etched using the trimmed ninth photoresist pattern 146 as an etching mask.

Subsequently, the trimming process of the ninth photoresist pattern 146 and the etching process of the exposed sacrificial layers 112 may be repeatedly performed to form a third staircase structure S3. The third staircase structure S3 may be disposed under the second dummy staircase structure DS2.

When the above processes are performed, a first mold structure 160 including the first sacrificial pattern 126, the first staircase structure S1, the first dummy staircase structure DS1, the second staircase structure S2, the second dummy staircase structure DS2 and the three staircase structures DS3 may be formed.

Only the first mold structure 160 formed on the second region is described above, but a second mold structure symmetrical to the first mold structure 160 may be also formed on the third region while forming the first mold structure. That is, the second mold structure may include the first sacrificial pattern, the first staircase structure, the first dummy staircase structure, the second staircase structure, the second dummy staircase structure, and the third staircase structure.

The mold structure formed on the first region is referred to as a cell mold structure.

As shown in FIG. 17, the first dummy staircase structure DS1 may be formed between the first staircase structure S1 and the second staircase structure S2. The first dummy staircase structure DS1 may be spaced apart from each of the first and second staircase structures S1 and S2 in a first direction. Thus, a portion between the first dummy staircase structure DS1 and the first staircase structure S1 and a portion between the first dummy staircase structure DS1 and the second staircase structure S2 may have first flat surfaces, respectively.

The second dummy staircase structure DS2 may be formed between the second staircase structure S2 and the third staircase structure S3. The second dummy staircase structure DS2 may be spaced apart from each of the second and third staircase structures S2 and S3 in a first direction. Thus, a portion between the second dummy staircase structure DS2 and the second staircase structure S2 and a portion between the second dummy staircase structure DS2 and the third staircase structure S3 may have second flat surfaces, respectively.

Figure 18:
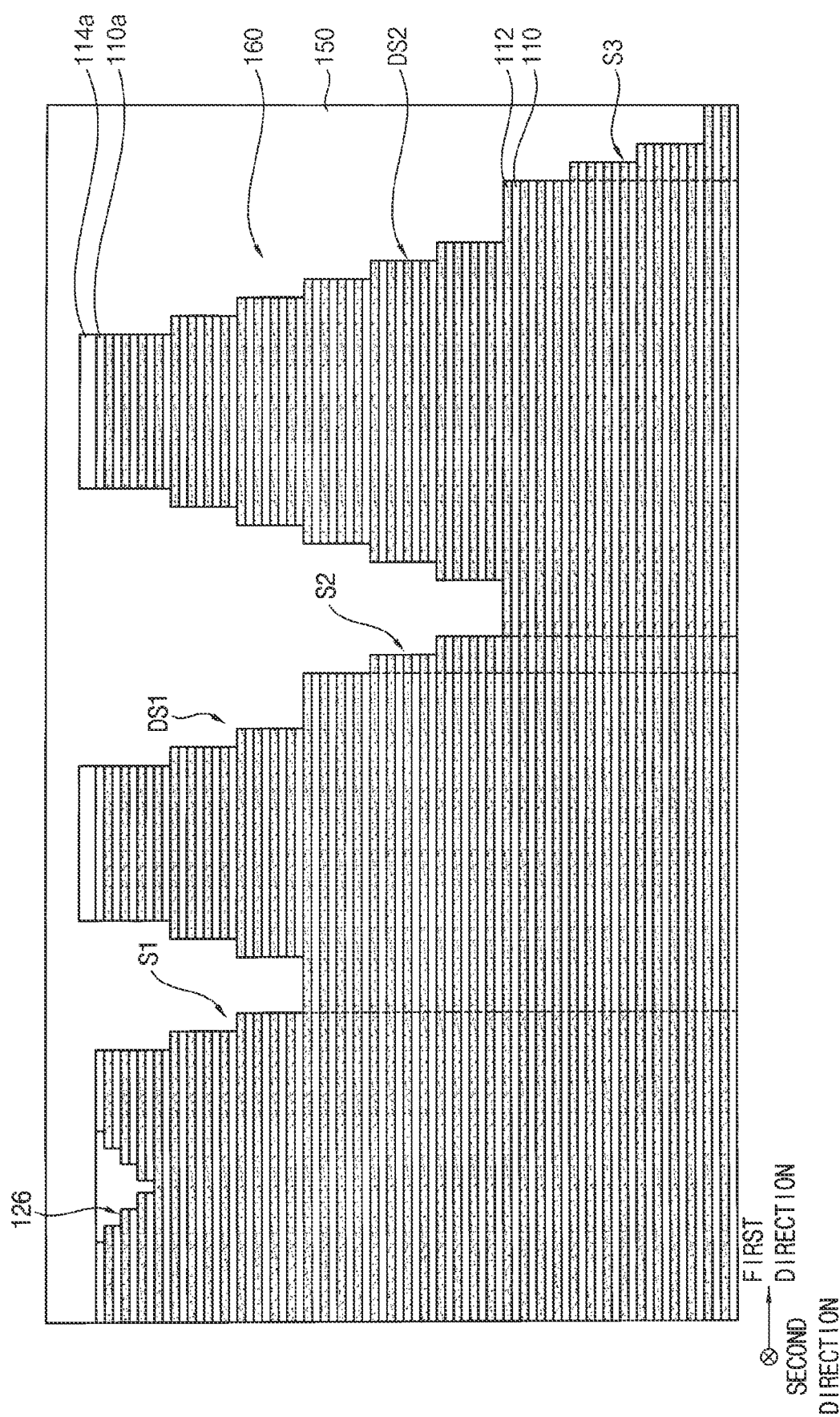

Referring to FIG. 18, a first insulating interlayer 150 may be formed on the base pattern 40 and the lower insulation pattern 42 to cover the first and second mold structures 160 and 162 and the cell mold structure. The first insulating interlayer 150 may include, e.g., an oxide such as silicon oxide.

The cell mold structure (not shown) on the first region may not include steps, and the first and second mold structures 160 and 162 on the second and third regions may include steps. Thus, due to a step difference between the cell mold structure and the first and second mold structures 160 and 162, an upper surface of the first insulating interlayer 150 formed on the cell mold structure may be relatively higher than upper surfaces of the first insulating interlayer 150 formed on the first and second mold structures 160 and 162. However, the first and second mold structures 160 and 162 may include the first and second dummy staircase structures DS1 and DS2 having upper surfaces of the same height as a height of the upper surface of the cell mold structure. Thus, the difference between heights of the upper surface of the first insulating interlayer 150 formed on the mold structures of the first to third regions may be decreased.

In example embodiments, in order to decrease a step difference of the first insulating interlayer 150, an upper portion of the first insulating interlayer 150 formed on the cell mold structure may partially be etched by an etching process, after forming the first insulating interlayer 150.

Figure 20:
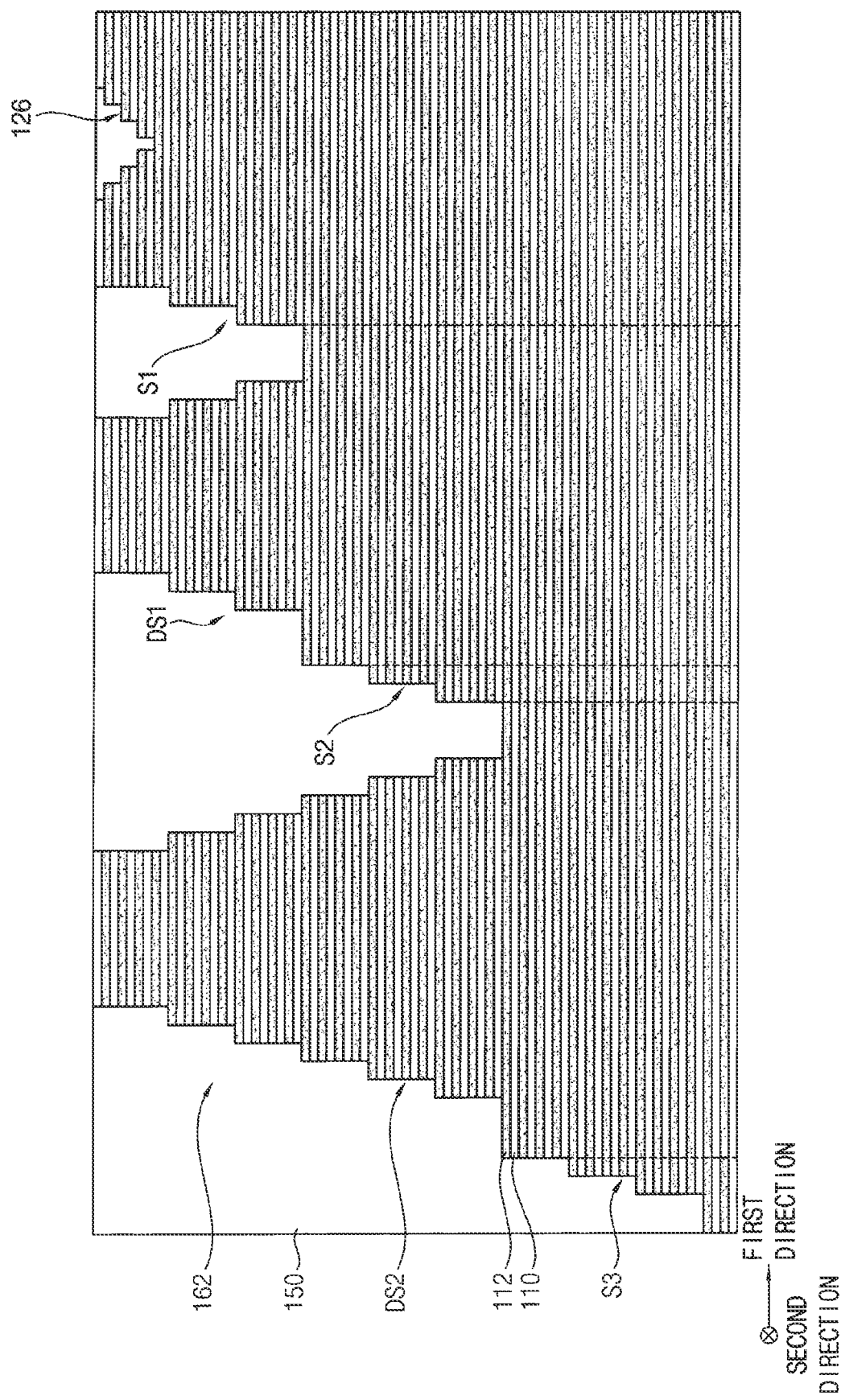

FIG. 20 shows a cross-section of the second mold structure on the third region.

Figure 19:
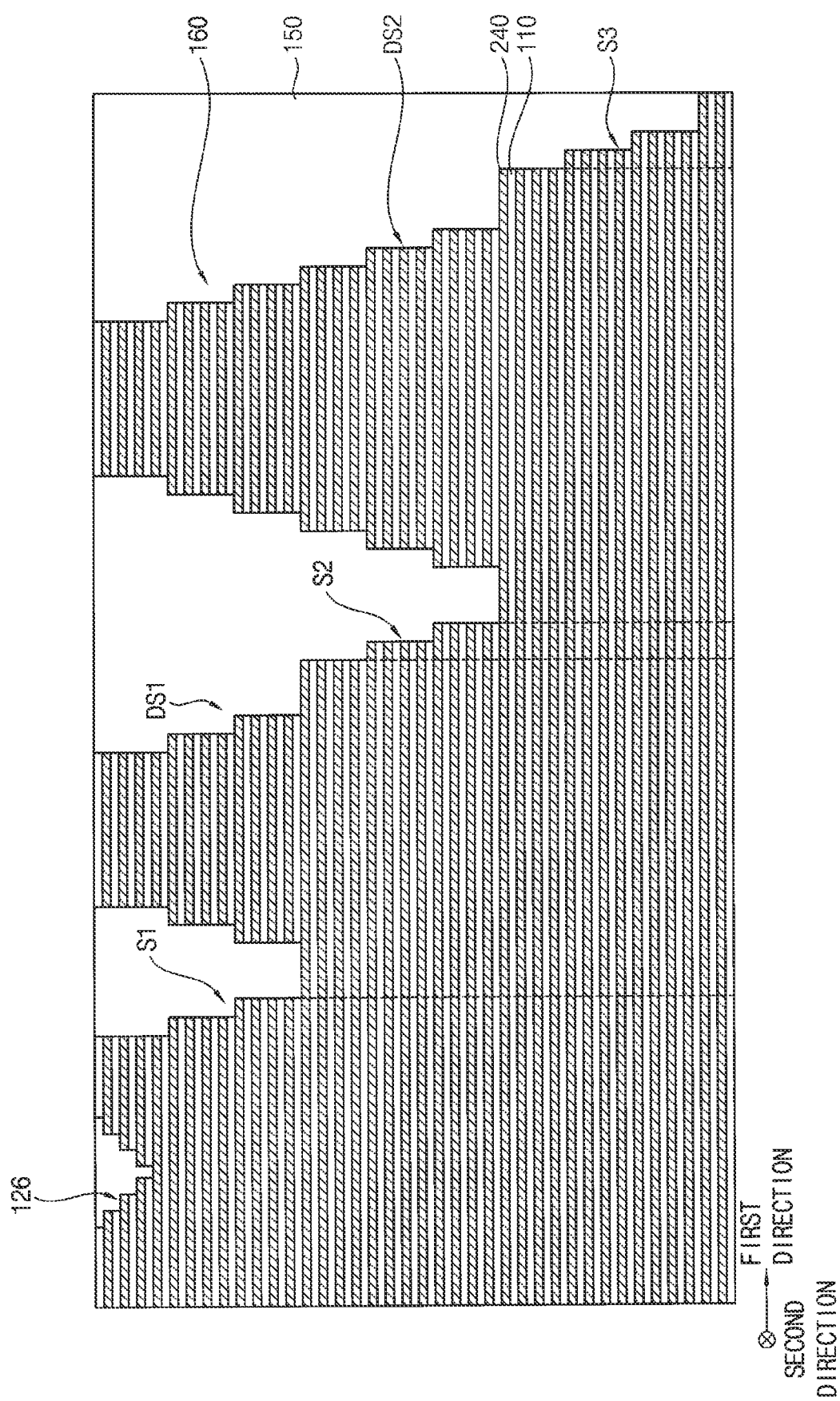

Referring to FIGS. 19 and 20, the upper surface of the first insulating interlayer 150 may be planarized until an upper surface of the stop layer pattern 114a may be exposed. Thereafter, the stop layer pattern 114a may be removed. Thus, the first insulating interlayer 150 may cover sidewalls of the first and second mold structures 160 and 162.

The planarization process may include a chemical mechanical polishing process.

The first and second mold structures 160 and 162 may include first and second dummy staircase structures DS1 and DS2 whose upper surface heights are the same as that of the first staircase structure S1. Thus, a step difference between the upper surfaces of the cell mold structures on the first region and the first and second mold structures 160 and 162 on the second and third regions may be decreased. In addition, the stop layer patterns 114a may be also formed on the first and second dummy staircase structures DS1 and DS2 in the second and third regions. When the planarization process is performed, polishing may be easily stopped by the stop layer patterns 114a on the first and second dummy staircase structures DS1 and DS2. Thus, a dishing defect in which the upper surface of the first insulating interlayer 150 on the second and third regions is excessively removed may be decreased.

In example embodiments, an insulating interlayer (not shown) may be further formed on the upper surfaces of the first and second mold structures 160 and 162 and the first insulating interlayer 150.

Figure 21:
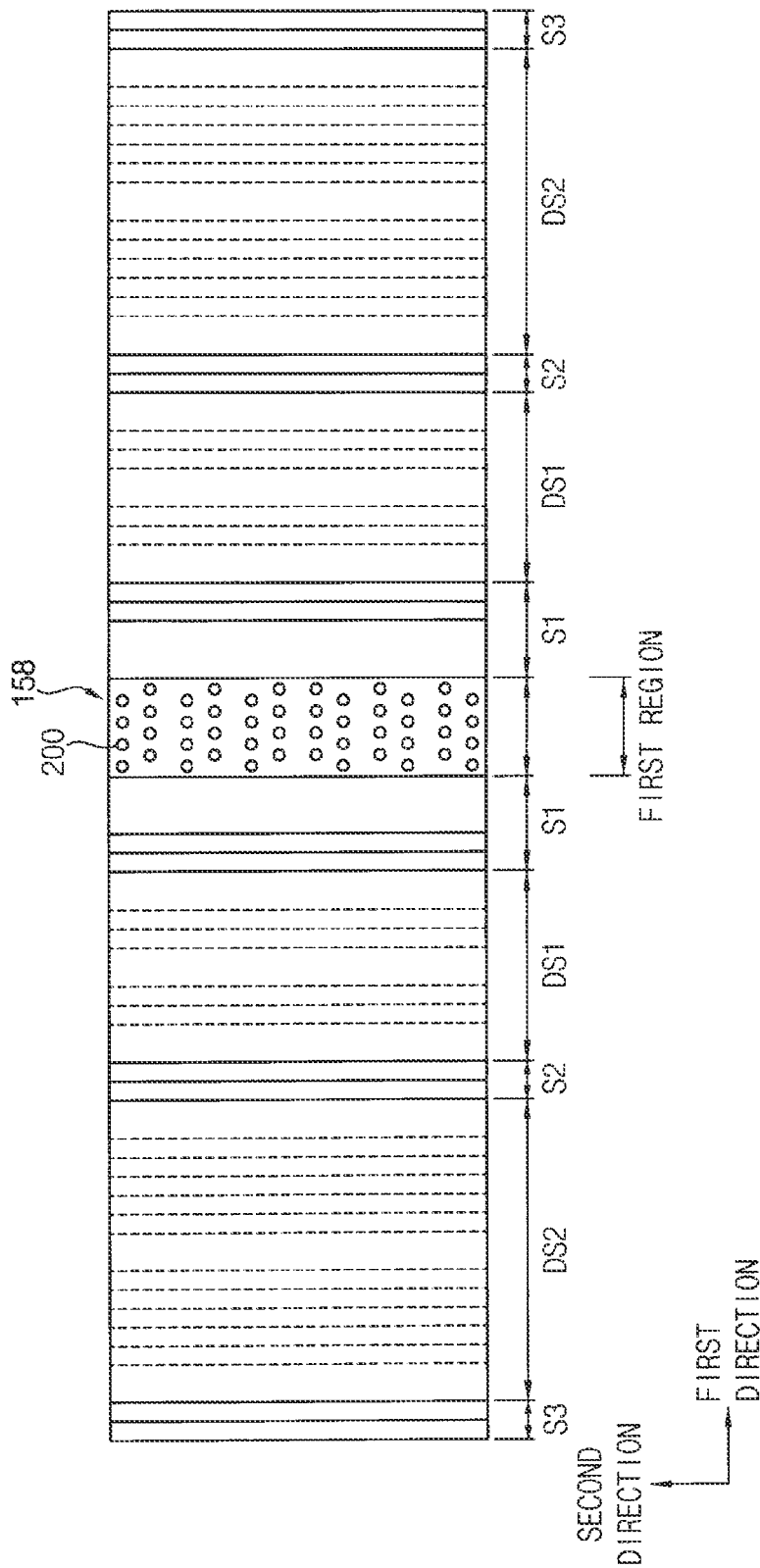

Referring to FIG. 21, after forming a first mask (not shown) on the first insulating interlayer 150, the cell mold structure 158 on the first region may be etched by using an etching mask to form channel holes. Each of the channel holes may expose an upper surface of the base pattern 40. The channel holes may be regularly arranged at the first region. A channel structure 200 may be formed in each of the channel holes. The channel structure 200 may have a shape the same as a shape of the channel structure shown in FIG. 4.

In example embodiments, a semiconductor pattern (not shown) may be further formed between the base pattern 40 and the channel structure 200. In this case, the channel structure 200 may be formed on the semiconductor pattern. In some example embodiments, the process for forming the semiconductor pattern may be omitted. In this case, the channel structure 200 may directly contact the base pattern 40.

Figure 22:
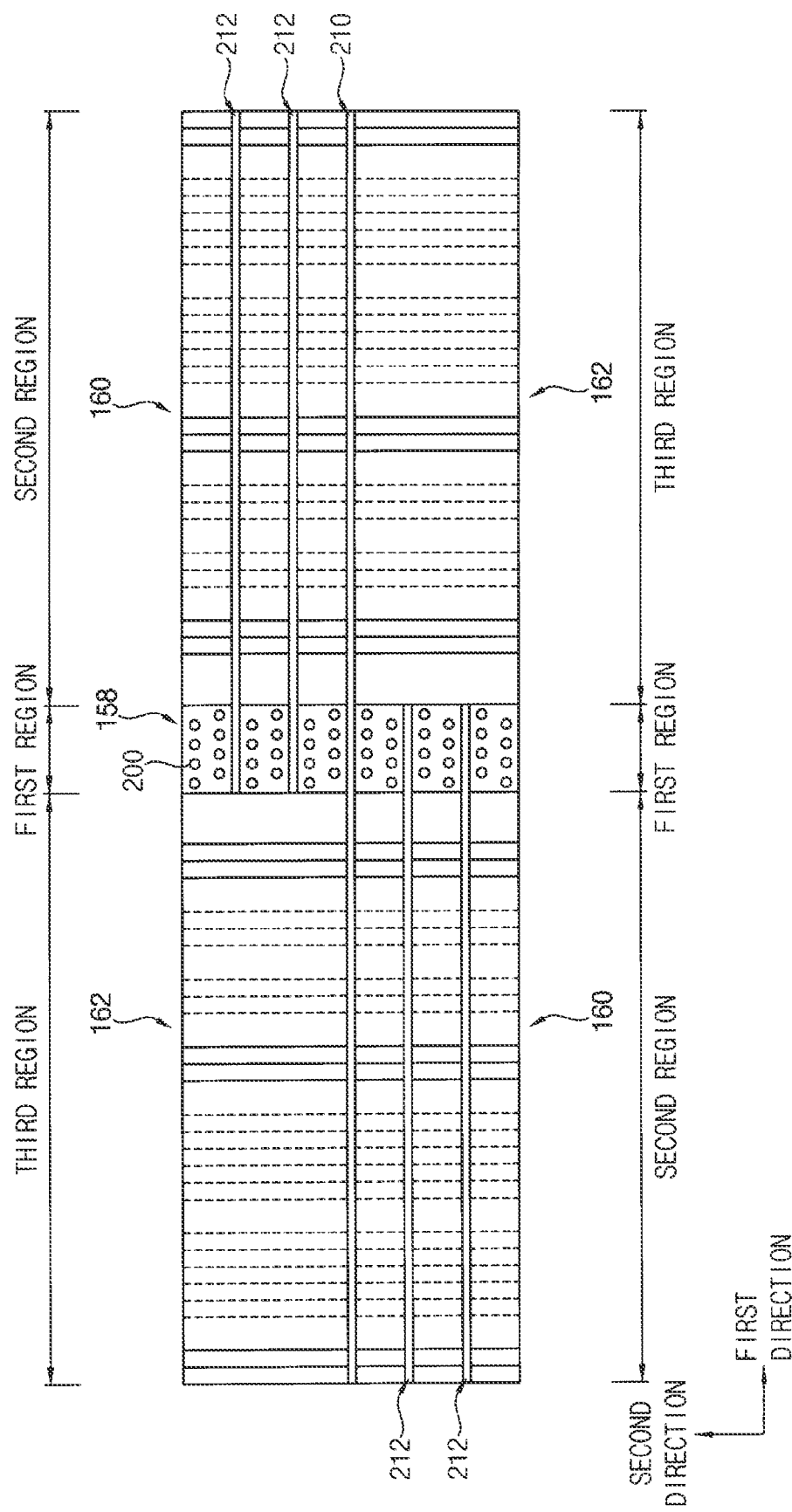
Figure 23:
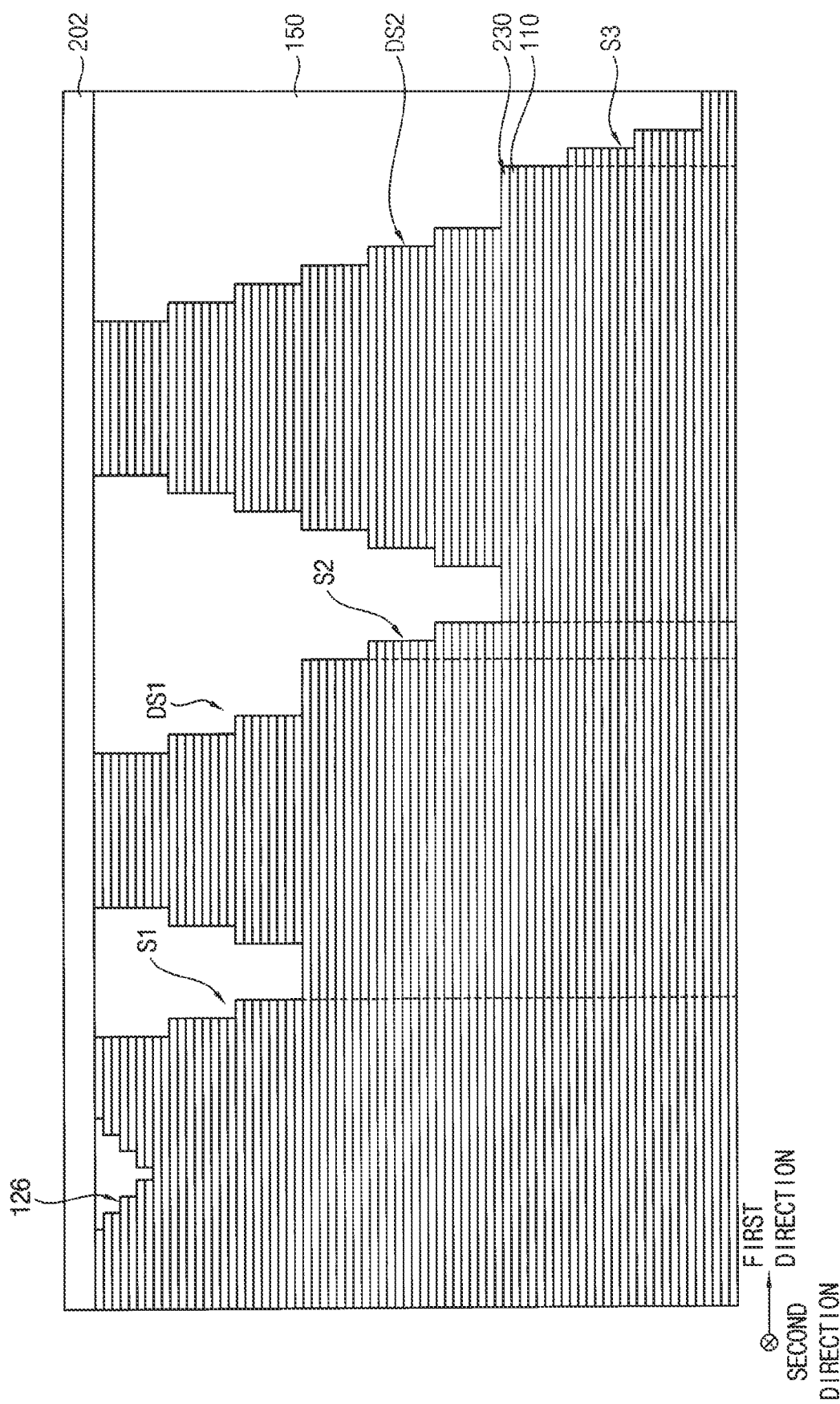

Referring to FIG. 22, a second insulating interlayer 202 (refer to FIG. 23) may be formed on the first and second mold structures 160 and 162, the channel structure 200 and the first insulating interlayer 150 (see FIG. 23). A second mask (not shown) may be formed on the second insulating interlayer 202. The first and second insulating interlayers 150 and 202 and the first and second mold structures 160 and 162 may be etched using the second mask as an etching mask to form first and second trenches 210 and 212. The first and second trenches 210 and 212 may pass through the first and second insulating interlayers 150 and 202 and the first and second mold structures 160 and 162, and the first and second trenches 210 and 212 may expose an upper surface of the base pattern 40.

In example embodiments, the first trench 210 may extend in the first direction on the first to third regions. A plurality of first trenches 210 may be arranged in the second direction. Thus, the mold structures may be separated from each other by the first trench 210.

The second trenches 212 may be formed in each of the separated mold structures. Each of the second trenches 212 may extend in the first direction on the first and second regions. The second trenches 212 may be arranged in the second direction. However, the second trench 212 may not be formed in the second mold structure 162 on the third region. Thus, the mold structures on the first and second regions may be separated from each other by the second trench 212.

In neighboring mold structures in the second direction, the second region and the third region may be disposed to face each other. That is, a separated first mold structure 160 and a non-separated second mold structure 162 may be alternately arranged in the second direction.

Figure 24:
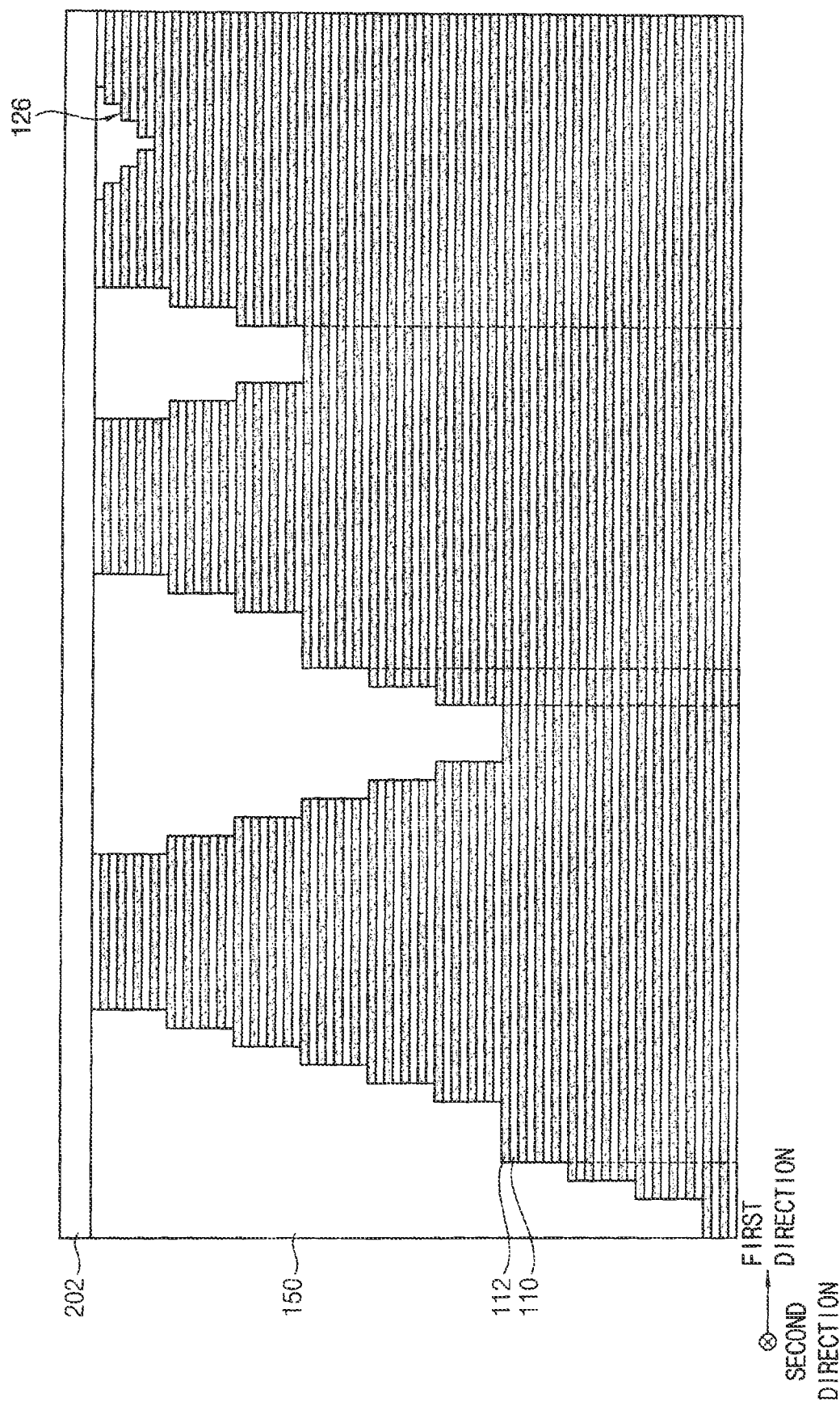

Referring to FIGS. 23 and 24, after removing the second mask, portions of the sacrificial layers 112 exposed by the first and second trenches 210 and 212 may be removed to form gaps 230 (see FIG. 23). Each of the gaps 230 may be formed between the insulation layers 110.

Particularly, as shown in FIGS. 22 and 23, a sidewall of the mold structure on the first and second regions may be exposed by the first and second trenches 210 and 212. Meanwhile, as shown in FIGS. 22 and 24, a sidewall of the second mold structure on the third region may be exposed by only first trench 210.

Thus, as shown in FIG. 23, the sacrificial layers 112 of the cell mold structure 158 (see FIG. 22) on the first region and the first mold structure 160 on the second region may be completely removed. On the other hand, as shown in FIG. 24, sacrificial layers 112 of the second mold structure 162 on the third region may be partially removed. That is, the sacrificial layers 112 disposed at edges of the second mold structure 162 may be removed, and the sacrificial layers disposed at a center portion of the second mold structure 162 may be may remain.

An outerwall of the channel structure 200 and a sidewall of the semiconductor pattern may be exposed by the gaps 230 (see FIG. 23) of the cell mold structure 158 on the first region.

Figure 25:
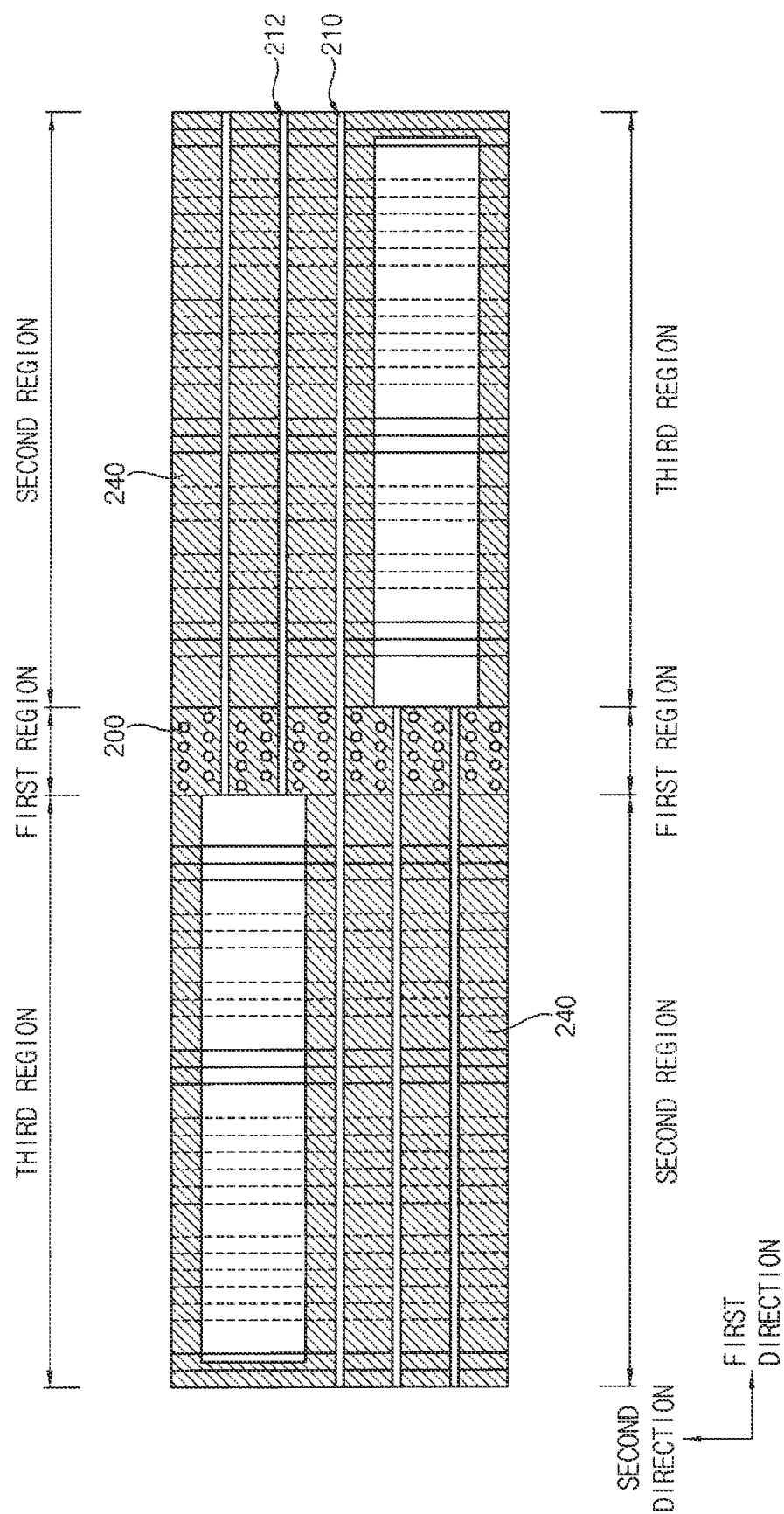
Figure 26:
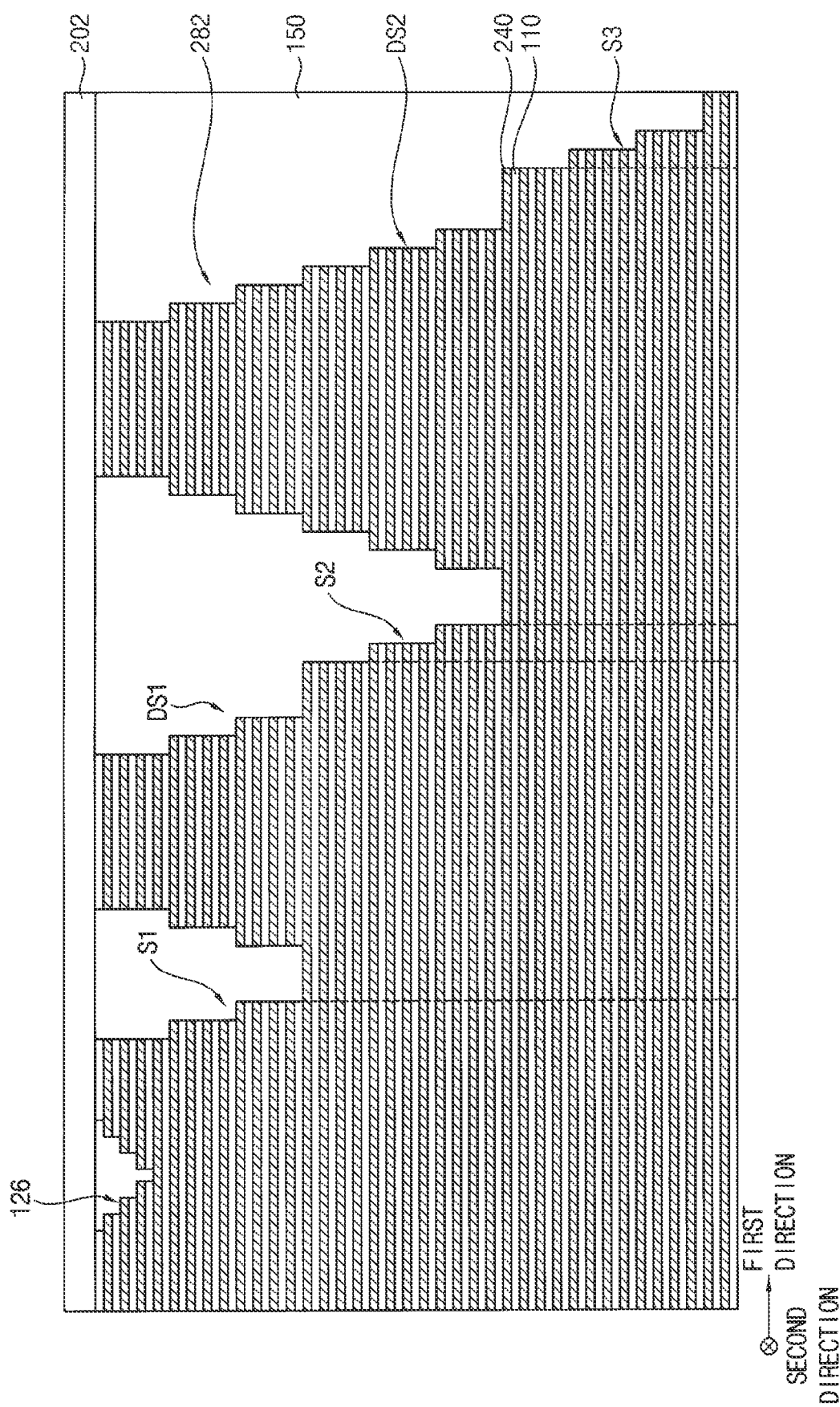

Referring to FIGS. 25 and 26, a gate conductive layer may be formed in each of the gaps 230 (see FIG. 23). Before forming the gate conductive layer, a barrier metal layer (not shown) may be further formed on the surfaces of the gaps 230.

The gate conductive layer may include, e.g., a metal having low resistance such as tungsten or aluminum, and the barrier metal layer may include, e.g., a metal nitride such as titanium nitride or tantalum nitride.

Subsequently, the gate conductive layer formed in the first and second trenches 210 and 212 may be removed to form a gate conductive pattern in each of the gaps 230. If the barrier metal layer is formed, a barrier metal pattern may be formed by the removing process. The gate conductive pattern and the barrier pattern may serve as a gate pattern 240. By the above process, a stacked structure in which the insulation layers 110 and the gate patterns 240 are alternately stacked or a stacked structure in which the insulation layers 110 and the sacrificial layers 112 are alternately stacked may be formed on the first to third regions.

The stacked structure on the first region may serve as a cell stacked structure 280 (refer to FIG. 5), and the stacked structure on the second and third regions may serve as a wiring connection structure.

In example embodiments, the gate pattern 240 on the first and second regions may extend in the first direction. A plurality of the gate patterns may be arranged in the second direction. That is, each of the gate patterns 240 extending in the first direction may be spaced apart from each other in the second direction by the second trench 212.

The gate patterns 240 may be stacked to be spaced apart from each other in the vertical direction. The gate patterns 240 may be formed by replacing the sacrificial layers 112 included in the cell mold structure 158 and the first mold structure 160 on the first and second regions.

The gate pattern 240 on the first region may be referred to as a cell gate pattern. The stacked structure on the second region may serve as a pad structure.

The sacrificial layers 112 disposed at the edges of the second mold structure 162 on the third region may be replaced with gate patterns. Further, the center portion of the second mold structure 162 may remain the stacked structure including the insulation layers and sacrificial layers alternately stacked. Thus, as shown in FIG. 24, the stacked structure on the third region may serve as a through via insulation structure 284.

As described above, in the neighboring stacked structures in the second direction, positions of the second trenches 212 may be different from each other. That is, in the neighboring stacked structures in the second direction, the pad structure and the through via insulation structure may be disposed to face each other in the second direction. Thus, in the stacked structures arranged in the second direction, the pad structure 282 and the through via insulation structure 284 may be alternately arranged in the second direction.

In the stacked structure, portions of the sacrificial layers may be replaced with the gate patterns 240, but steps included in the stacked structure may have shape the same as the steps of the mold structure. Hereinafter, staircase structures and dummy staircase structures in the stacked structure on the second region are referred to as the first to third staircase structures S1, S2, and S3 and the first and second dummy staircase structures DS1 and DS2, as in the mold structure. Further, staircase structures and dummy staircase structures in the stacked structure on the third region may are referred to as first to third insulation staircase structures S1', S2', S3' and first and second dummy insulation staircase structures DS1', DS2'.

As described above, by adjusting the positions of the first and second trenches 210 and 212, positions of the gaps 230 may be controlled. Thus, a region replaced by the gate pattern 240 and a region not replaced by the gate pattern 240 may be controlled.

In example embodiments, upper surfaces of the steps of the first to third staircase structures S1, S2, and S3 on the second region may serve as pad patterns for forming a contact plug. That is, the upper surfaces of the steps in the first to third staircase structures S1, S2, and S3 may be electrically connected to the cell gate patterns in the cell stacked structure.

The first and second dummy staircase structures DS1 and DS2 on the second region may not be electrically connected to the cell gate patterns. The first and second dummy staircase structures DS1 and DS2 on the second region may not serve as an actual pad, and thus the first and second dummy staircase structures DS1 and DS2 on the second region may serve as a dummy pad. Since the sacrificial layers disposed below the first and second dummy staircase structures DS1 and DS2 on the second region are replaced with gate patterns, the through via contact may not be formed through the first and second dummy staircase structures DS1 and DS2.

In example embodiments, the sacrificial layers of the center portion of the stacked structure on the third region may not be replaced with the gate patterns. Thus, the central portion of the stacked structure on the third region may serve as a portion for forming the through via contact being electrically connected to the peripheral circuits.

Thereafter, impurities may be implanted into an upper portion of the base pattern 40 exposed by the first trench 210. An insulation pattern (not shown) may be formed in the first and second trenches 210 and 212.

Figure 27:
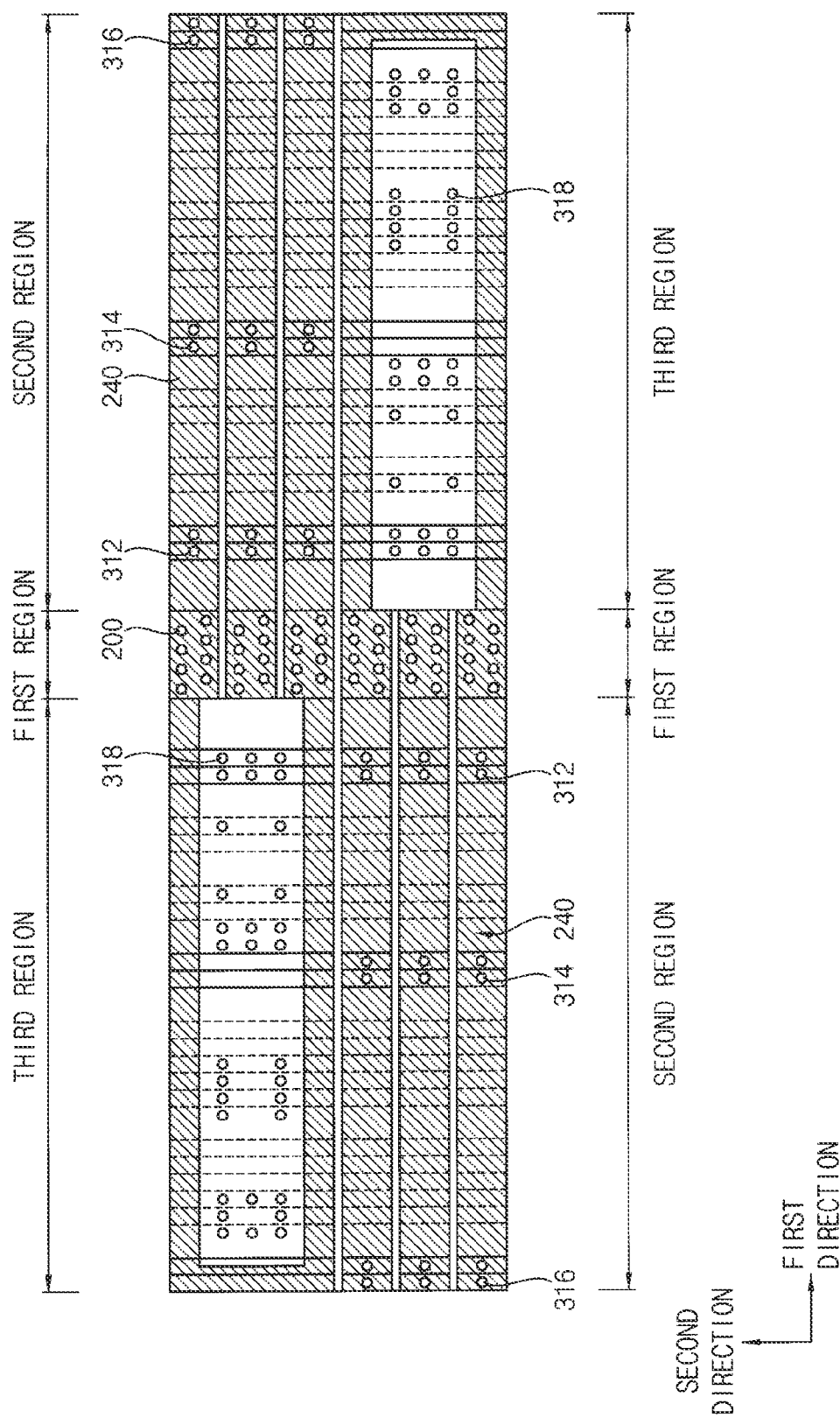
Figure 28:
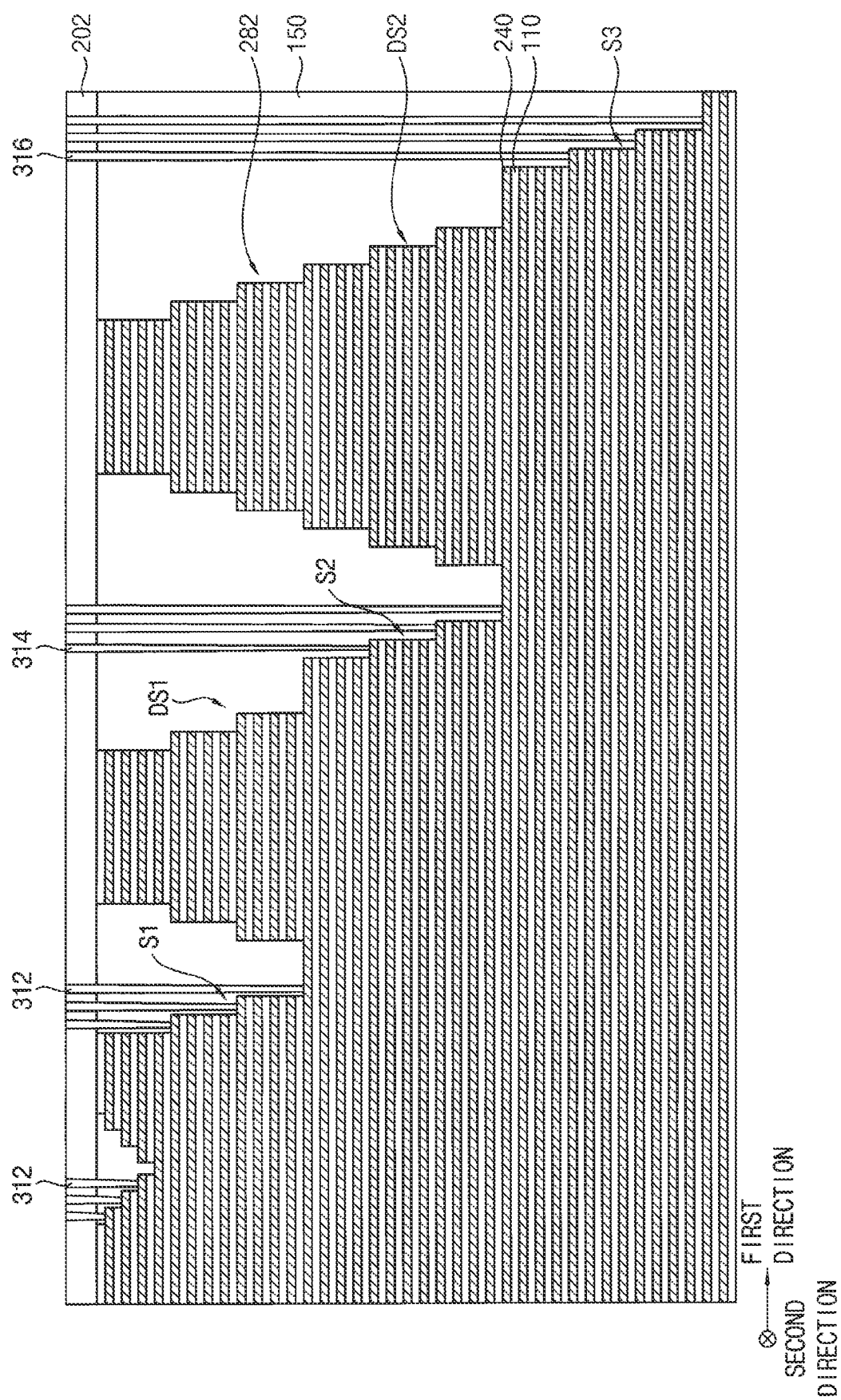
Figure 29:
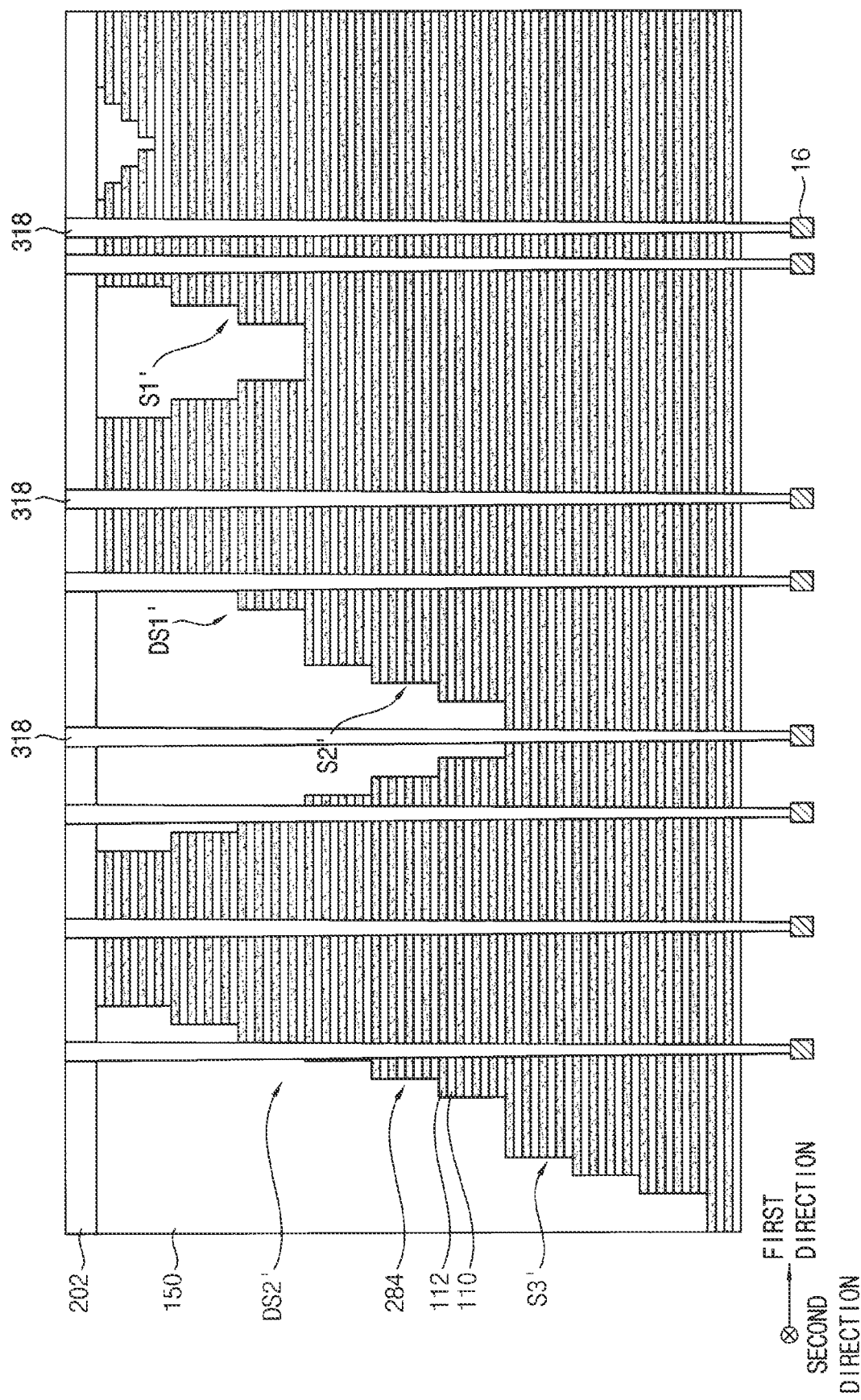

Referring to FIGS. 27 to 29, a cell contact plug 310 (refer to FIG. 4) may be formed through the second insulating interlayer 202. The cell contact plug 310 may contact an upper surface of the upper conductive pattern 208 (see FIG. 4) on the first region.

In the second region, first to third contact plugs 312, 314, and 316 may be formed through the first and second insulating interlayers 150 and 202. The first to third contact plugs 312, 314, and 316 may contact upper surfaces of steps in the first to third staircase structures S1, S2, and S3, respectively. That is, the first to third contact plugs 312, 314, and 316 may be formed on the stacked structure on the second region.

In the third region, a through via contact 318 may be formed through the first and second insulating interlayers 150 and 202, the through via insulation structure, the insulation pattern, and the insulating interlayer 20. The through via contact 318 may contact an upper surface of the lower pad pattern 16.

Referring to FIGS. 1A to 4 again, an upper wiring 320 may be formed on second insulating interlayer 202. The upper wiring 320 may be connected to the first to third contact plugs 312, 314 and 316 and the through via contacts 318. In FIG. 1A, the upper wiring 320 is simply shown as a line.

In example embodiments, each of the first to third contact plugs 312, 314, and 316 may be connected to the through via contact 318 that is disposed adjacent in the second direction.

A bit line 342 (see FIG. 4) may be formed to contact an upper surface of the cell contact plug 310.

As described above, a vertical memory device may be manufactured.

Figure 30:
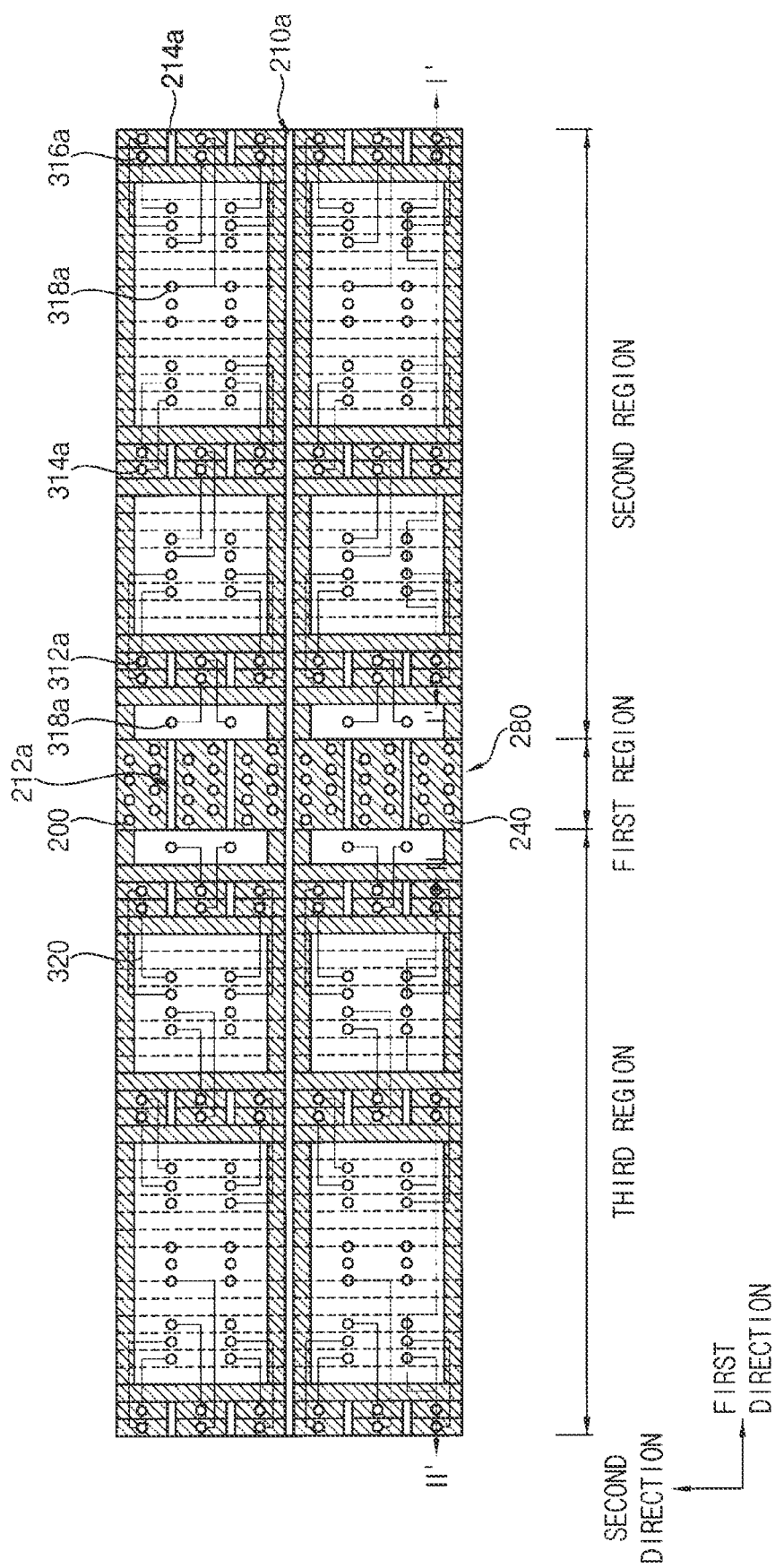
Figure 31:
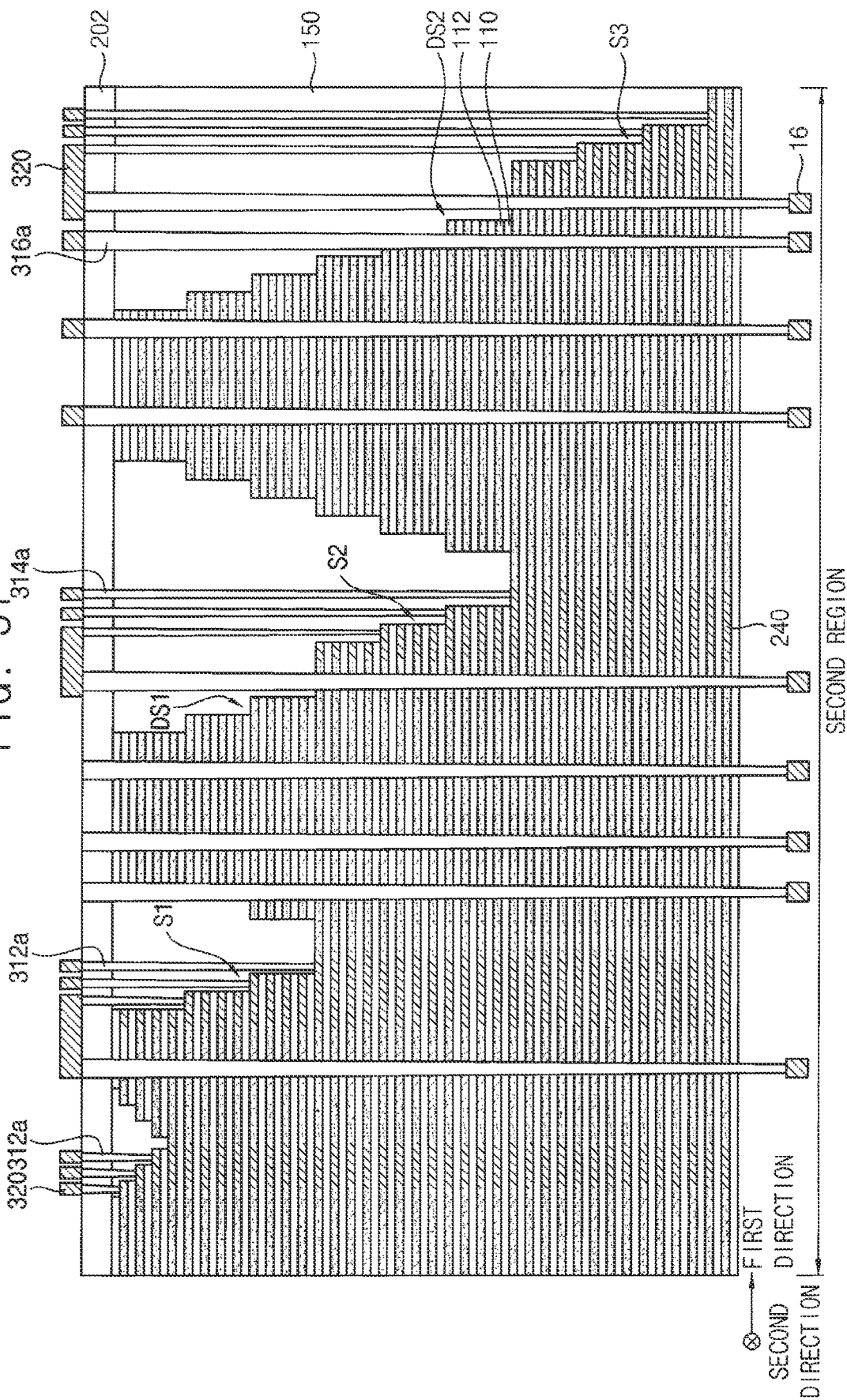
Figure 32:
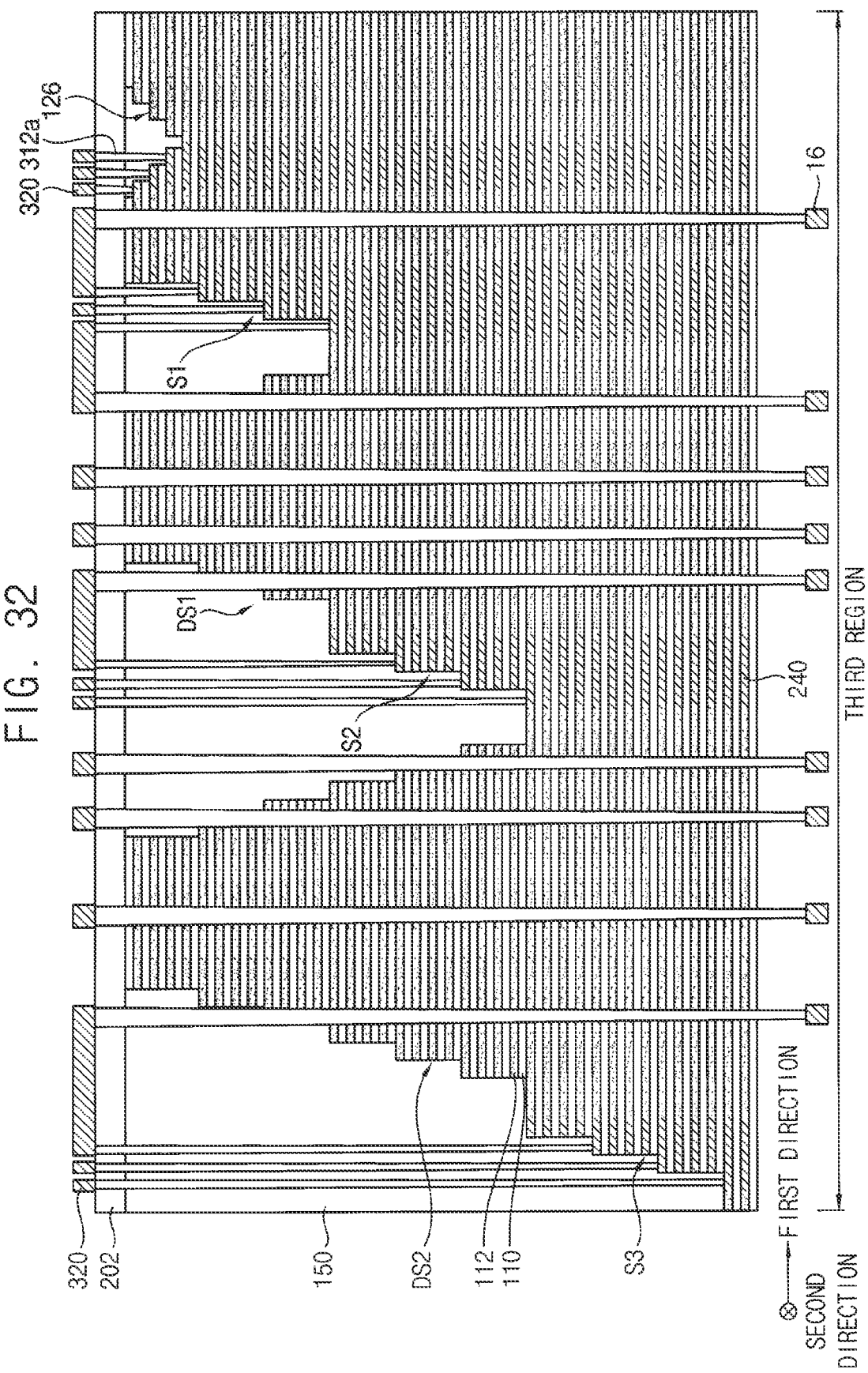

FIGS. 30 to 32 are a plan view and cross-sectional views illustrating a vertical memory device in accordance with example embodiments.

Particularly, FIG. 30 is a plan view. FIG. 31 is a cross-sectional view of the second region cut in the first direction, and FIG. 32 is a cross-sectional view of the third region cut in the first direction. That is, FIG. 31 is a sectional view of I-I' in FIG. 30, and FIG. 32 is a sectional view of II-II' in FIG. 30.

The vertical memory device may be substantially the same as the vertical memory device illustrated with reference to FIGS. 1A to 3, except for the stacked structure and the wirings. Therefore, the stacked structure and the wirings may be mainly described.

Shapes of the steps of the stacked structure shown in FIGS. 30 and 31 may be similar to or the same as the shapes of the steps of the stacked structure illustrated with reference to FIGS. 1A to 3. However, materials included in a portion of the stacked structure shown in FIGS. 30 and 31 may be different from the materials included in a portion of the stacked structure illustrated with reference to FIGS. 1A to 3.

FIG. 31 is a wiring connection structure disposed on a first side of the cell stacked structure, and FIG. 32 is a wiring connection structure disposed on a second side of the cell stacked structure.

Referring to FIGS. 30 to 32, a substrate may include a first region, a second region and a third region. The second region and the third region may be disposed on both sides in the first direction of the first region, respectively.

A stacked structure may be formed on the substrate. The stacked structure may include a cell stacked structure and a wiring connection structure. The cell stacked structure may be formed on the first region, and wiring connection structures may be formed on the second and third regions, respectively. The cell stacked structure and the wiring connection structures on both sides thereof may be merged to each other to serve as one stack structure.

The cell stacked structure may be substantially the same as the cell stacked structure 280 illustrated with reference to FIG. 4.

The wiring connection structure on the second region and the wiring structure on the third region may have the same shape that may be symmetrical with respect to the first region. In example embodiments, contact plugs 312a, 314a, 316a connected to gate patterns 240 of memory cells and through via contacts 318a connected to circuit patterns on the substrate may be formed in the wiring connection structure.

The steps of the wiring connection structure on the second region may have shapes the same as shapes of the steps of the pad structure shown in FIG. 2. The steps of the wiring connection structure on the third region may have shapes as the same the shapes of the steps of the through via insulation structure shown in FIG. 3. For example, the wiring connection structure may include the first staircase structure S1, the first dummy staircase structure DS1, the second staircase structure S2, the second dummy staircase structure DS2, and the third staircase structure S3.

As shown in FIGS. 30 to 32, each of the wiring connection structures may include a pad region and a through via region.

The pad structure in which the insulation layers 110 and the gate patterns 240 are repeatedly and alternately stacked in a vertical direction may be formed at the pad region of the wiring connection structure. A side of the pad structure may have a stepped shape and may serve as a pad. The pad region may be a portion of a staircase structure in the wiring connection structure. For example, the pad region may be step portions of the first staircase structure S1, the second staircase structure S2, and the third staircase structure S3.

A through via insulation structure may be formed at the through via region of the wiring connection structure. The insulation layers 110 and the sacrificial layers 112 may be alternately stacked in the vertical direction at a center portion of the through via insulation structure. The insulation layers 110 and the gate patterns 240 may be repeatedly and alternately stacked in the vertical direction at an edge in the second direction of the through via insulation structure. The center portion of the through via insulation structure may be a portion for forming a through via. The through via region may be portions for forming dummy staircase structures of the wiring connection structure. For example, the through via region may be portions of the first dummy staircase structure DS1 and the second dummy staircase structure DS2.

A plurality of stacked structures may be arranged in the second direction. A first trench 210a extending in the first direction may be formed between the stacked structures. The first trench 210a may serve as a cell block cutting region.

In the stacked structure, second trenches 212a extending in the first direction may be formed between the cell stacked structures 280. That is, the second trench 212a may be formed in the first region.

In the stacked structure, third trenches 214a may be formed in the wiring connection structure. The third trenches 214a may be disposed at portions of the staircase structures S1, S2, and S3 of the wiring connection structure. That is, the third trenches 214a may not be formed at the dummy staircase structures DS1 and DS2 of the wiring connection structure.

A first insulating interlayer 150 may be formed on the base pattern and the lower insulation pattern to cover steps at both sides of the stacked structure. A second insulating interlayer 202 may be further formed on the upper surfaces of the stacked structures and the first insulating interlayer 150.

First to third contact plugs 312a, 314a, and 316a may pass through the first and second insulating interlayers 150 and 202 to contact upper surfaces of steps in the pad region. The first contact plug 312a may contact an upper surface of the gate pattern 240 included in the first staircase structure S1. The second contact plug 314a may contact an upper surface of the gate pattern 240 included in the second staircase structure S2. The third contact plug 316a may contact an upper surface of the gate pattern 240 included in the third staircase structure S3.

In addition, a through via contact 318a may be formed through the first and second insulating interlayers 150 and 202, the through via region of the stacked structure, the lower insulation pattern, and the lower insulating interlayer. The through via contact 318a may contact an upper surface of the lower pad pattern 16. In the stacked structure, the through via contact 318a and the gate patterns 240 may be electrically insulated from each other.

An upper wiring 320 may be formed on the second insulating interlayer 202. The upper wiring 320 may be electrically connected to the first to third contact plugs 312a, 314a, and 316a and the through via contact 318a. For example, the first to third contact plugs 312a, 314a, and 316a and the through via contact 318a in the stacked structure may be electrically connected to each other by the upper wiring 320. Therefore, each of the gate patterns 240 may be electrically connected to the peripheral circuits.

FIGS. 33 to 38 are cross-sectional views and plan views illustrating a method of manufacturing a vertical memory device in accordance with example embodiments.

Figure 33:
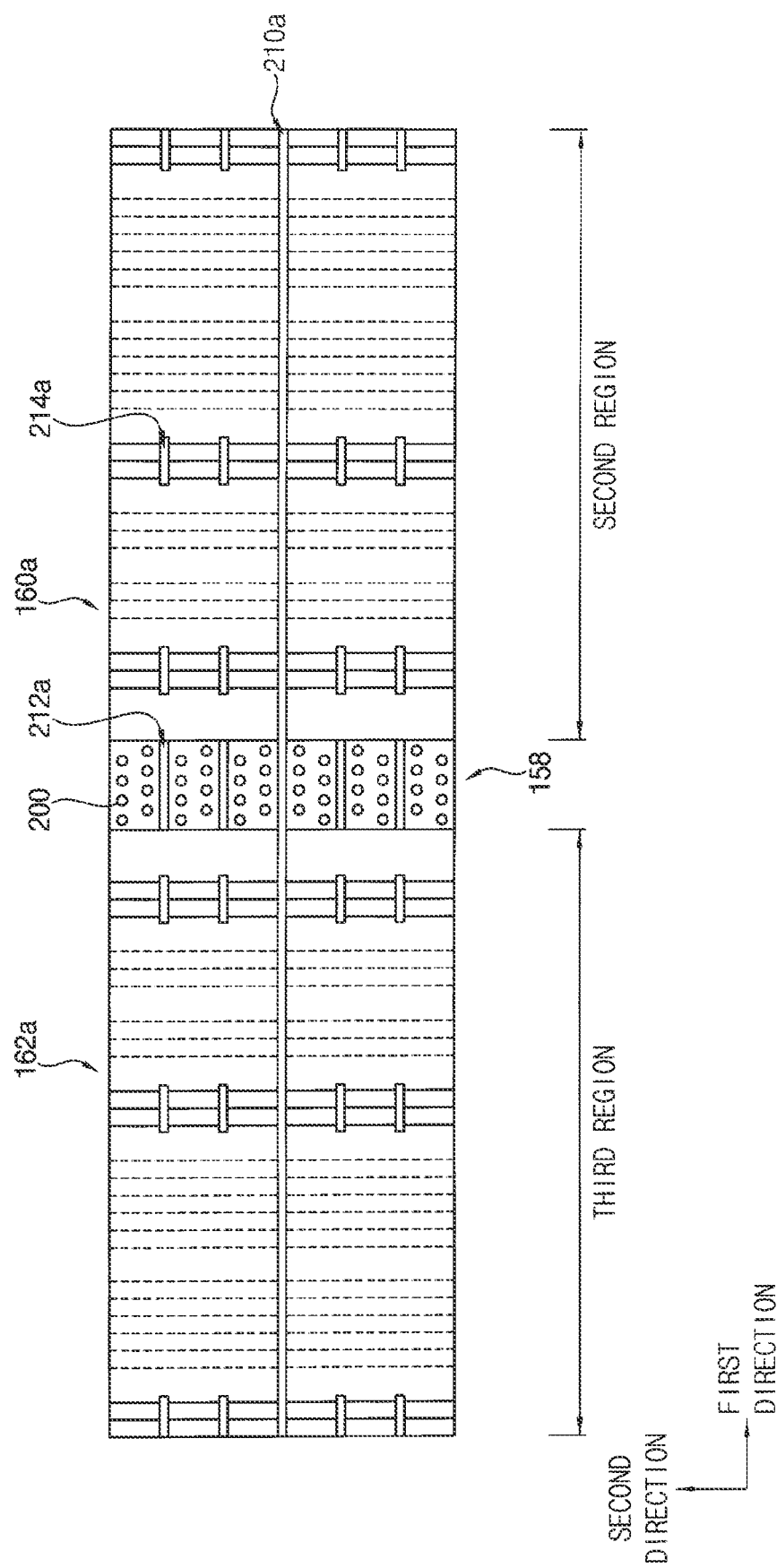
Figure 34:
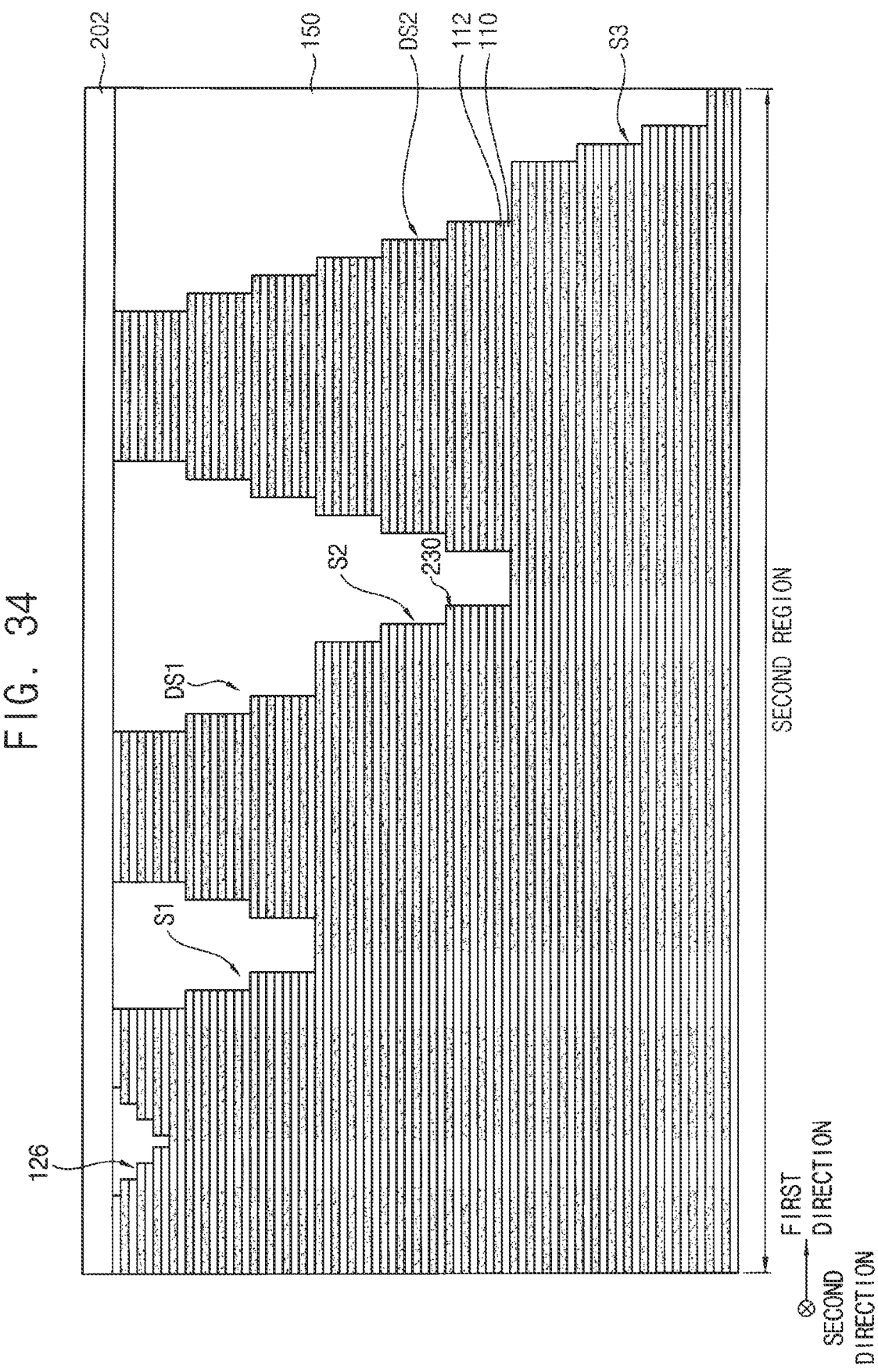
Figure 35:
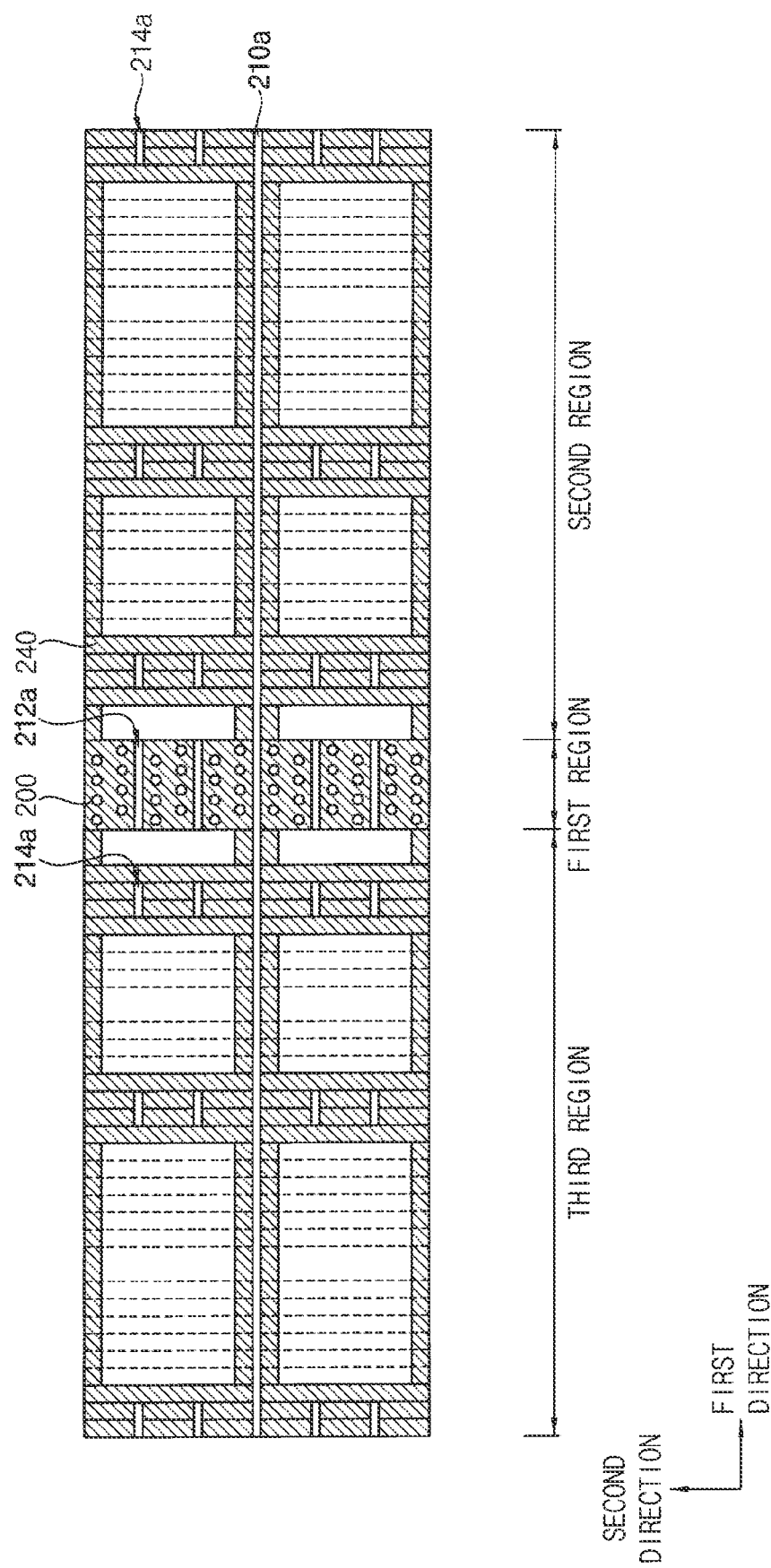
Figure 36:
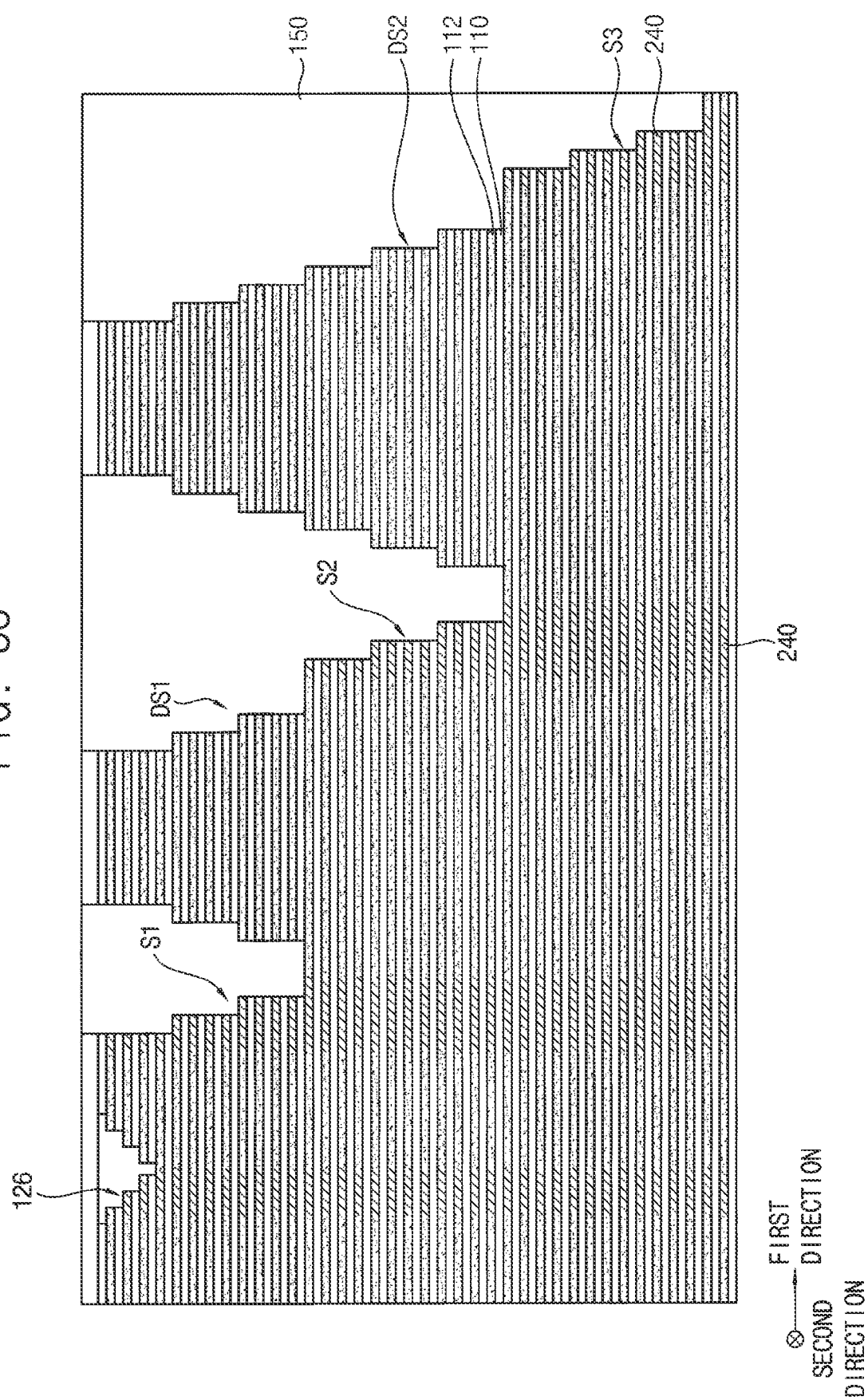
Figure 37:
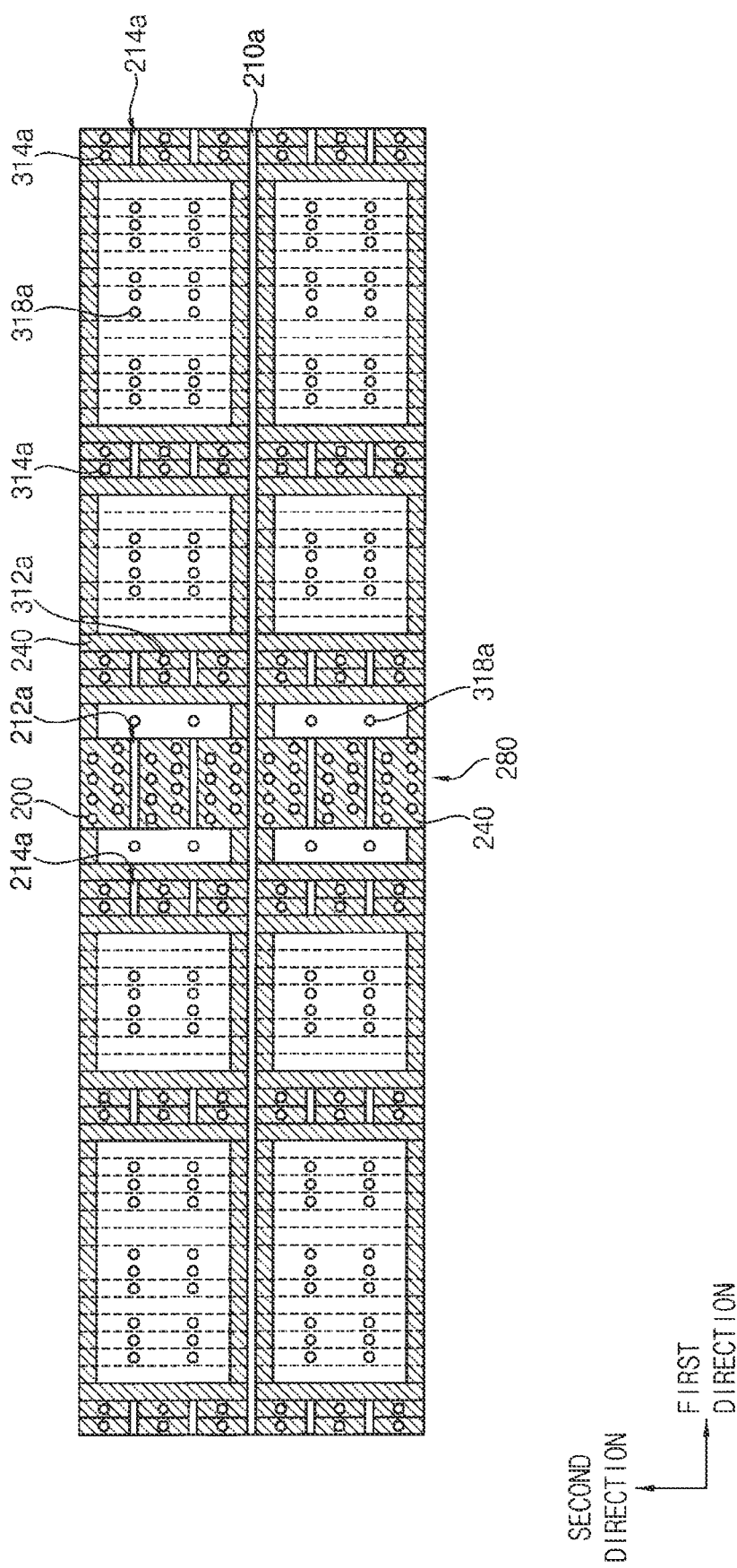
Figure 38:
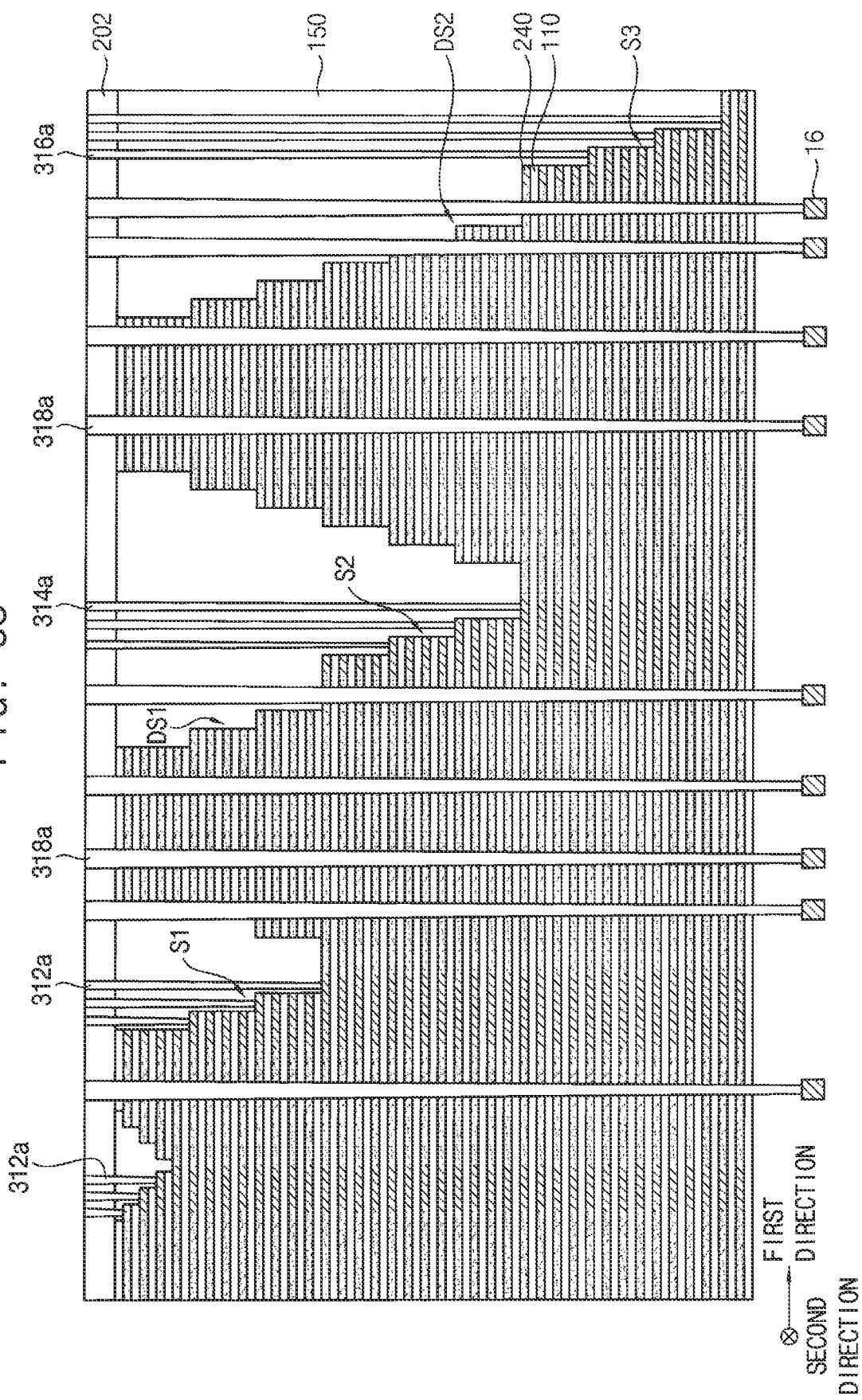

Particularly, FIGS. 33, 35 and 37 are plan views, and FIGS. 34, 36 and 38 are cross-sectional views.

The method of manufacturing the vertical memory device may be substantially the same or similar processes to those illustrated with reference to FIGS. 5 to 29, and thus detailed descriptions thereof may be omitted.

Referring to FIG. 33, first, processes described with reference to FIGS. 5 to 21 may be performed to form a same structure the same as that shown in FIGS. 19 to 21.

As shown in FIGS. 19 to 21, the first mold structure on the second region and the second mold structure on the third region may have the same shape. Each of the first and second mold structures includes the first staircase structure S1, the second staircase structure S2, the third staircase structure S3, the first dummy staircase structure DS1, and the second dummy staircase structure DS2.

A second insulating interlayer 202 (refer to FIG. 34) may be formed on the mold structure, the channel structure 200, and the first insulating interlayer 150. A second mask (not shown) may be formed on the second insulating interlayer 202. First to third trenches 210a, 212a, and 214a passing through the first and third insulating interlayers 150 and 202 may be formed using the second mask as an etching mask. The first to third trenches 210a, 212a, and 214a may expose an upper surface of the base pattern.

The first trench 210a may extend in the first direction on the first to third regions. A plurality of first trenches 210a may be arranged in the second direction. Thus, the mold structures may be separated from each other by the first trench 210a, so that a plurality of mold structures may be formed.

The second trench 212a may extend in the first direction in the cell mold structure 158 on the first region. A plurality of second trenches 212a may be arranged in the second direction.

The third trench 214a may have an isolated shape in each of the first and second mold structures 160a and 162a. The third trench 214a may pass through portions of the staircase structures S1, S2, and S3 in each of the first and second mold structures 160a and 162a. That is, the third trenches 214a may not be formed in the dummy staircase structure DS1.

Referring to FIG. 34, after removing the second mask, portions of the sacrificial layers 112 exposed by the first to third trenches 210a, 212a, and 214a may be removed to form gaps. The gaps 230 may be formed between the insulation layers 110.

In the cell mold structure 158 on the first region, the sacrificial layers 112 may be etched through the first trench 210a and the second trench 212a to form the gaps 230.

In the first and second mold structures 160a and 162a on the second and third regions, portions of the sacrificial layer 112 adjacent to the second and third trenches 212a and 214a may be mostly etched through the first trench 210a and the second trench 212a to form the gaps 230. However, portions of the sacrificial layer 112 not having the second and third trenches 212a and 214a may be only exposed by the first trench 210a. Thus, the portions of the sacrificial layer 112 not having the second and third trenches 212a and 214a may be partially etched through only the first trench 210a to form the gaps 230.

That is, in the first and second mold structures 160a and 162a, the sacrificial layers in the steps of the first staircase structure S1 and the sacrificial layers of the second and third staircase structures S2, and S3 may be removed to form the gaps 230. In addition, in the first and second mold structures 160a and 162a, the sacrificial layers of the first and second dummy staircase structures DS1 and DS2 and the sacrificial layers below flat upper dummy regions of the first staircase structure S1 may not be removed and may remain.

Referring to FIGS. 35 and 36, a gate conductive layer may be formed in the gaps 230 (see FIG. 34). Thereafter, the gate conductive layer in the first to third trenches 210a, 212a, and 214a may be removed to form a gate pattern 240 in each of the gaps 230. Therefore, the mold structure may be transformed into a stacked structure.

When the processes are performed, the sacrificial layers on the first region may be replaced into the gate pattern 240. The stacked structure on the second and third regions may include a stacked structure in which the insulation layers 110 and the gate patterns 240 are alternately stacked or a stacked structure in which the insulation layers 110 and the sacrificial layers 112 are alternately stacked, depending on positions. The stacked structure on the first region may serve as a cell stacked structure, and the stacked structure on the second and third regions may serve as a wiring connection structure.

Particularly, in the second and third regions, the gate patterns 240 may be formed in the gaps of the first staircase structure S1, the second and third staircase structures S2 and S3. In addition, in the second and third regions, the sacrificial layers 112 under the flat upper dummy region of the first and second dummy staircase structures DS1 and the first staircase structure S1 may not be removed and may remain.

In the cell stacked structure, the gate pattern 240 may be referred to as a cell gate pattern. In the wiring connection structure, a portion in which the insulation layers 110 and the gate patterns 240 are stacked may serve as a pad structure. In the wiring connection structure, a portion in which insulation layers and sacrificial layers are stacked may serve as a through via insulation structure.

Therefore, the wiring connection structure may include the pad structure and the through via insulation structure alternately arranged in the first direction.

Referring to FIGS. 37 and 38, a cell contact plug 310 (refer to FIG. 1) may be formed through the second insulating interlayer 202 to contact an upper surface of the upper conductive pattern.

In the second and third regions, first to third contact plugs 312a, 314a, and 316a may be formed through the first and second insulating interlayers 150 and 202. The first to third contact plugs 312a, 314a, and 316a may contact the steps of the first and third staircase structures S1, S2, and S3, respectively.

In the second and third regions, a through via contact 318a may be formed through the first and second insulating interlayers 150 and 202, through via insulation structures, insulation patterns, and lower insulating interlayers. The through via contact 318a may contact the lower pad pattern 16.

Referring to FIGS. 30 to 32 again, an upper wiring 320 may be formed on the second insulating interlayer 202. The upper wiring 320 may be electrically connected the first to third contact plugs 312a, 314a, and 316a and the through via contacts 318a. In FIG. 30, the upper wiring 320 is simply shown as a line.

In example embodiments, the first to third contact plugs 312a, 314a, and 316a may be connected to through via contacts 318a adjacent to the first to third contact plugs 312a, 314a, and 316a in the first direction.

As illustrated in FIG. 31, a bit line may be formed on an upper surface of the cell contact plug 310.

As described above, the vertical memory device may be manufactured.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed and that modifications to the disclosed example embodiments, as well as other example embodiments, are intended to be included within the scope of the appended claims.

What is claimed is:

1. A vertical memory device comprising:
a substrate comprising a first region and a second region adjacent the first region;
a cell stacked structure on the first region, the cell stacked structure comprising insulation layers and gate patterns repeatedly and alternately stacked, and the gate patterns extending in a first direction;
a wiring connection structure on the second regions, the wiring connection structure contacting a first sidewall of the cell stacked structure; and
a first insulating interlayer on the substrate to cover the wiring connection structure,
wherein the wiring connection structure comprises:
a first staircase structure having one side of a stepped shape;
a second staircase structure having one side of a stepped shape and disposed below the first staircase structure; and
a first dummy staircase structure between the first and second staircase structures,
wherein the first and second staircase structures are spaced apart from each other in the first direction, and both sides in a first direction of the first dummy staircase structure have stepped shapes,
wherein an uppermost surface of the first dummy staircase structure is coplanar with an uppermost surface of the first staircase structure.

2. The vertical memory device of claim 1, wherein the first staircase structure and the second staircase structure comprise pad patterns having a stepped shape electrically connected to the gate patterns in the cell stacked structure, and
wherein the first dummy staircase structure is not electrically connected to the gate patterns in the cell stacked structure.

3. The vertical memory device of claim 1, wherein steps of both sides of the first dummy staircase structure are symmetrical to each other with respect to a straight line passing a center portion in the first direction of the first dummy staircase structure.

4. The vertical memory device of claim 1, wherein an upper surface of the first insulating interlayer is coplanar with an uppermost surface of the first dummy staircase structure and an uppermost surface of the first staircase structure.

5. The vertical memory device of claim 1, wherein an uppermost surface of the first dummy staircase structure is flat.

6. The vertical memory device of claim 1, further comprising a through via contact passing through a portion of the wiring connection structure being electrically insulated from the gate patterns of the cell stacked structure.

7. The vertical memory device of claim 6, wherein the through via contact passes through the first dummy staircase structure in the wiring connection structure.

8. The vertical memory device of claim 1, wherein a width in the first direction of each of steps in the first dummy staircase structure is different from each of a width between the first staircase structure and the first dummy staircase structure and a width between the second staircase structure and the first dummy staircase structure.

9. The vertical memory device of claim 8, wherein the width in the first direction of each of the steps in the first dummy staircase structure is less than each of the width between the first staircase structure and the first dummy staircase structure and the width between the second staircase structure and the first dummy staircase structure.

10. The vertical memory device of claim 1, wherein a first width in the first direction of a region in which the first dummy staircase structure is formed is greater than a second width in the first direction of a region in which the first staircase structure is formed, and
the first width is greater than a third width in the first direction of a region in which the second staircase structure is formed.

11. The vertical memory device of claim 1, further comprising:
a second wiring connection structure contacting a second sidewall opposite to the first sidewall of the cell stacked structure,
wherein the second wiring connection structure comprises:
a third staircase structure having one side of a stepped shape;
a fourth staircase structure having one side of a stepped shape and disposed below the third staircase structure; and
a second dummy staircase structure between the third and fourth staircase structures,
wherein both sides in the first direction of the second dummy staircase structure have stepped shapes.

12. The vertical memory device of claim 1, wherein an uppermost surface of the first dummy staircase structure has a width 2 μm to 20 μm in the first direction.

13. A vertical memory device comprising:
a substrate comprising a first region and a second region adjacent the first region;
a cell stacked structure on the first region, the cell stacked structure comprising insulation layers and gate patterns repeatedly and alternately stacked, and the gate patterns extending in a first direction;
a channel structure passing through the cell stacked structure;

a wiring connection structure on the second regions, the wiring connection structure contacting a first sidewall of the cell stacked structure; and a first insulating interlayer on the substrate to cover the wiring connection structure, wherein the wiring connection structure comprises:

a first staircase structure having one side of a stepped shape;

a second staircase structure having one side of a stepped shape and disposed below the first staircase structure; and a first dummy staircase structure between the first and second staircase structures, the first dummy staircase structure not being electrically connected to the gate patterns in the cell stacked structure, wherein both sides in a first direction of the first dummy staircase structure have stepped shapes, wherein a width in the first direction of each of steps in the first dummy staircase structure is different from each of a width between the first staircase structure and the first dummy staircase structure and a width between the second staircase structure and the first dummy staircase structure, wherein an uppermost surface of the first dummy staircase structure is coplanar with an uppermost surface of the first staircase structure.

14. The vertical memory device of claim 13, wherein steps of both sides of the first dummy staircase structure are symmetrical to each other with respect to a straight line passing a center portion in the first direction of the first dummy staircase structure.

15. The vertical memory device of claim 13, wherein the width in the first direction of each of the steps in the first dummy staircase structure is less than each of the width between the first staircase structure and the first dummy staircase structure and the width between the second staircase structure and the first dummy staircase structure.

16. The vertical memory device of claim 13, wherein an uppermost surface of the first dummy staircase structure has a width 2 μm to 20 μm in the first direction.

17. A vertical memory device comprising:

a substrate comprising a first region and a second region adjacent the first region;

a cell stacked structure on the first region, the cell stacked structure comprising insulation layers and gate patterns repeatedly and alternately stacked, and the gate patterns extending in a first direction;

a channel structure passing through the cell stacked structure;

a wiring connection structure on the second regions, the wiring connection structure contacting a first sidewall of the cell stacked structure; and a first insulating interlayer on the substrate to cover the wiring connection structure, wherein the wiring connection structure comprises:

a first staircase structure having one side of a stepped shape;

a second staircase structure having one side of a stepped shape and disposed below the first staircase structure; and a first dummy staircase structure between the first and second staircase structures, the first dummy staircase structure not being electrically connected to the gate patterns in the cell stacked structure wherein both sides in a first direction of the first dummy staircase structure have stepped shapes, wherein a first width in the first direction of a region in which the first dummy staircase structure is formed is greater than a second width in the first direction of a region in which the first staircase structure is formed, and the first width is greater than a third width in the first direction of a region in which the second staircase structure is formed, wherein an uppermost surface of the first dummy staircase structure is coplanar with an uppermost surface of the first staircase structure.

18. The vertical memory device of claim 17, wherein a width in the first direction of each of steps in the first dummy staircase structure is different from each of a width between the first staircase structure and the first dummy staircase structure and a width between the second staircase structure and the first dummy staircase structure.

\* \* \* \* \*